(12) United States Patent
Nishimura et al.

(10) Patent No.: US 7,906,852 B2
(45) Date of Patent: Mar. 15, 2011

(54) SEMICONDUCTOR DEVICE AND MANUFACTURING METHOD OF THE SAME

(75) Inventors: Takao Nishimura, Kawasaki (JP); Yoshiaki Narisawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 548 days.

(21) Appl. No.: 11/868,036

(22) Filed: Oct. 5, 2007

(65) Prior Publication Data
US 2008/0150157 A1 Jun. 26, 2008

(30) Foreign Application Priority Data
Dec. 20, 2006 (JP) ................................. 2006-343093

(51) Int. Cl.
*H01L 23/48* (2006.01)
*H01L 23/52* (2006.01)
(52) U.S. Cl. ........ 257/777; 257/784; 257/778; 257/686; 257/E23.169
(58) Field of Classification Search .................. 257/777, 257/686, 784, 778, E23.169
See application file for complete search history.

(56) References Cited

U.S. PATENT DOCUMENTS

| | | | | |
|---|---|---|---|---|
| 5,239,447 A * | 8/1993 | Cotues et al. | ............... | 361/744 |
| 5,780,925 A | 7/1998 | Cipolla et al. | | |
| 6,340,846 B1 * | 1/2002 | LoBianco et al. | ............ | 257/783 |
| 6,664,644 B2 * | 12/2003 | Morozumi | ..................... | 257/777 |
| 7,459,776 B1 * | 12/2008 | St. Amand et al. | ........... | 257/686 |
| 7,629,695 B2 * | 12/2009 | Yoshimura et al. | ........... | 257/777 |
| 2002/0074668 A1 | 6/2002 | Hofstee et al. | | |
| 2002/0195697 A1 * | 12/2002 | Mess et al. | ..................... | 257/686 |
| 2003/0011067 A1 * | 1/2003 | Kimura | ......................... | 257/723 |
| 2003/0038374 A1 * | 2/2003 | Shim et al. | ..................... | 257/777 |
| 2003/0057539 A1 * | 3/2003 | Koopmans | .................... | 257/686 |
| 2004/0178515 A1 * | 9/2004 | Hilton et al. | ................... | 257/787 |
| 2005/0121802 A1 * | 6/2005 | Kawano et al. | ............... | 257/777 |

FOREIGN PATENT DOCUMENTS

| | | |
|---|---|---|
| JP | 02-312265 | 12/1990 |
| JP | 03-255657 | 11/1991 |
| JP | 06-224362 | 8/1994 |
| JP | 2006-310649 | 11/2006 |

OTHER PUBLICATIONS

Chinese Office Action dated Apr. 3, 2009, issued in corresponding Chinese Patent Application No. 200710167846.4.

* cited by examiner

*Primary Examiner* — Nitin Parekh
(74) *Attorney, Agent, or Firm* — Fujitsu Patent Center

(57) ABSTRACT

A semiconductor device, includes a wiring board; a first semiconductor element mounted on the wiring board; a second semiconductor element mounted on the first semiconductor element so that a position of the second semiconductor element is shifted relative to a position of the first semiconductor element; wherein a part of a main surface of the second semiconductor element faces the first semiconductor element; and an electrode pad provided on the main surface of the second semiconductor element is connected to a second semiconductor element connection pad of the wiring board by a connection part.

11 Claims, 42 Drawing Sheets

SEMICONDUCTOR DEVICE AND MANUFACTURING METHOD OF THE SAME

BACKGROUND OF THE INVENTION

1. Field of the Invention

The present invention generally relates to semiconductor devices and manufacturing methods of the same, and more specifically, to a semiconductor device wherein plural semiconductor elements are stacked on a wiring board and a manufacturing method of the semiconductor device.

2. Description of the Related Art

A chip stacked type semiconductor device which may be called a stacked package is known. In the chip stacked type semiconductor device, plural semiconductor chips (semiconductor elements) having different functions or plural semiconductor chips (semiconductor elements) having the same functions are stacked on a wiring board or a die pad of a lead frame. Each of electrode pads of the semiconductor chips and a bonding pad on the wiring board or an inner lead of the lead frame, are connected to each other by a bonding wire. Alternatively, the bonding wire connects the electrode pads to each other.

In this structure, since plural semiconductor chips are provided in a single semiconductor device, it is possible to respond to requests for an electronic device such as having multiple functions of the semiconductor device or a large capacity memory.

On the other hand, in a small size electronic device such as a mobile phone or a digital camera, a thin size or high density arrangement semiconductor device provided in the electronic device has been recently in demand.

A structure of a first example of a related art chip stacked type semiconductor device is shown in FIG. 1. FIG. 1(a) shows a cross section taken along line X-X' of FIG. 1(b) that is a plan view. In FIG. 1(b), illustration of a sealing resin 10 is omitted.

In the chip stacked type semiconductor device 1, a first semiconductor chip 4 is provided on a wiring board 3 via a first adhesive 5. The wiring board has a main surface where plural outside connection terminals 2 are formed. In addition, a second semiconductor chip 6 is provided on the first semiconductor chip 4 via a second adhesive 7.

The second semiconductor chip 6 is smaller than the first semiconductor chip 4. The first semiconductor chip 4 and the second semiconductor chip 6 are provided in a so-called facing up state where electronic circuit forming surfaces (main surfaces) of the first semiconductor chip 4 and the second semiconductor chip 6 do not face toward the wiring board 3. Outside connection electrode pads (not illustrated in FIG. 1) of the first semiconductor chip 4 and the second semiconductor chip 6 are provided on the main surfaces of the first semiconductor chip 4 and the second semiconductor chip 6.

The electrode pads of the first semiconductor chip 4 and the second semiconductor chip 6 and bonding pads (not illustrated in FIG. 1) on the wiring board 3 are connected to each other by bonding wires 8 and 9, respectively. The first semiconductor chip 4 and the second semiconductor chip 6 together with the bonding wires 8 and 9 are sealed on the wiring board 3 by sealing resin 10.

However, in the structure shown in FIG. 1, it is not possible to stack semiconductor chips having the same chip sizes. Therefore, freedom degree for designing combinations of the semiconductor chips stacked on the wiring board 3 is low.

Because of this, in order to improve the design freedom degree of combination of the semiconductor chips stacked on the wiring board, structures shown in FIG. 2 through FIG. 4 have been suggested. In FIG. 2 through FIG. 4, parts that are the same as the parts shown in FIG. 1 are given the same reference numerals, and explanation thereof is omitted.

An example of another related art chip stacked type semiconductor device is shown in FIG. 2. FIG. 2(a) shows a cross section seen in a direction indicated by an arrow Y in FIG. 2(b) that is a plan view. In FIG. 2(b), illustration of a sealing resin 10 is omitted.

In the chip stacked type semiconductor device 11, a first semiconductor chip 14 is provided on the wiring board 3 via the first adhesive 5. In addition, a second semiconductor chip 16 is provided on the first semiconductor chip 14 via the second adhesive 7.

The first semiconductor chip 14 and the second semiconductor chip 16 have rectangular-shaped configurations. The semiconductor chip 16 is provided on the first semiconductor chip 14 so that the first semiconductor chip 14 and the second semiconductor chip 16 cross each other. Electrode pads (not illustrated in FIG. 2) are provided at short side end parts facing each other on main surfaces of the first semiconductor chip 14 and the second semiconductor chip 16 and connected to bonding pads (not illustrated in FIG. 2) provided on the wiring board 3 via the bonding wires 8 and 9.

The first semiconductor chip 14 and the second semiconductor chip 16 together with the bonding wires 8 and 9 are sealed on the wiring board 3 by sealing resin 10. See, for example, Japanese Laid-Open Patent Application Publication No. 2-312265.

An example of another related art chip stacked type semiconductor device is shown in FIG. 3. FIG. 3(a) shows a cross section taken along line X-X' of FIG. 3(b) that is a plan view. In FIG. 3(b), illustration of a sealing resin 10 is omitted.

In the chip stacked type semiconductor device 21, a first semiconductor chip 24 is provided on the wiring board 3 in a so-called face down (flip chip) state where an electronic circuit forming surface (main surface) of the first semiconductor chip 24 faces the wiring board 3. In addition, a second semiconductor chip 26 is provided on the first semiconductor chip 24 via the second adhesive 7 where an electronic circuit forming surface (main surface) of the second semiconductor chip 26 faces upward.

Gold (Au) bumps 22 are formed on the electrode pads (not illustrated in FIG. 3) of the first semiconductor chip 24. The gold (Au) bumps 22 of the first semiconductor chip 24 are connected to the bonding pads (not illustrated in FIG. 3) of the wiring board 3. An underfill material 23 fills in between the first semiconductor chip 24 and the wiring board 3.

On the other hand, the electrode pads of the second semiconductor chip 26 and the bonding pads on the wiring board 3 are connected to each other by the bonding wires 9. In addition, the first semiconductor chip 24 and the second semiconductor chip 26 together with the bonding wires 9 are sealed on the wiring board 3 by sealing resin 10. See, for example, Japanese Laid-Open Patent Application Publication No. 3-255657.

In this structure as compared to the structures shown in FIG. 1 and FIG. 2, since there is less limitation of sizes and configurations of the stacked semiconductor chips, the design freedom degree of the combination of the semiconductor chips is high.

An example of another related art chip stacked type semiconductor device is shown in FIG. 4. FIG. 4(a) shows a cross section taken along line X-X' of FIG. 4(b) that is a plan view. In FIG. 4(b), illustration of a sealing resin 10 is omitted.

In the chip stacked type semiconductor device 31, a first semiconductor chip 34 is provided on the wiring board 3 via the first adhesive 5. In addition, a second semiconductor chip 36 is provided on the first semiconductor chip 34 via the second adhesive 37 and is shifted against the first semiconductor chip 34.

Electrode pads (not illustrated in FIG. 4) provided at end parts of electronic circuit forming surfaces (main surfaces) of the first semiconductor chip 34 and the second semiconductor chip 36 are connected to the bonding pads (not illustrated in FIG. 4) on the wiring board 3 via the bonding wires 8 and 9, respectively. In addition, the first semiconductor chip 34 and the second semiconductor chip 36 together with the bonding wires 8 and 9 are sealed on the wiring board 3 by sealing resin 10. See, for example, Japanese Laid-Open Patent Application Publication No. 6-224362.

However, in the related art cases shown in FIG. 1 through FIG. 4, the second semiconductor chips 6, 26, 26, and 36 situated at upper steps and the corresponding wiring boards 3 are connected to each other by the corresponding bonding wires 9.

Because of this, it is necessary to provide the sealing resin 10 for parts corresponding to the heights of wire loops of the bonding wires 9, namely parts corresponding to height a from upper surfaces of the second semiconductor chips 6, 26, 26, and 36 in the structures shown in FIG. 1 through FIG. 4. Accordingly, in these structures, it is difficult to respond to the request for making the semiconductor device thin.

On the other hand, it may be undertaken to make the semiconductor chips thin in response to the demand for making the semiconductor device thin. However, if the semiconductor chips are made thin, the yield rate may be reduced due to degradation of the strength of the semiconductor chip or reliability of the semiconductor device may be reduced. Furthermore, manufacturing costs may be increased due to addition of manufacturing steps for making the semiconductor device thin.

SUMMARY OF THE INVENTION

Accordingly, embodiments of the present invention may provide a novel and useful semiconductor device and manufacturing method of the same solving one or more of the problems discussed above.

More specifically, the embodiments of the present invention may provide a semiconductor device having a structure whereby the semiconductor device can be made thin while maintaining a high degree of design freedom for sizes and configurations of plural semiconductor chips superimposed on a supporting board such as a wiring board or without making the semiconductor chips thin, and a manufacturing method of the semiconductor device.

One aspect of the present invention may be to provide a semiconductor device, including: a wiring board; a first semiconductor element mounted on the wiring board; a second semiconductor element mounted on the first semiconductor element so that a position of the second semiconductor element is shifted relative to a position of the first semiconductor element; wherein a part of a main surface of the second semiconductor element faces the first semiconductor element; and an electrode pad provided on the main surface of the second semiconductor element is connected to a second semiconductor element connection pad of the wiring board by a connection part.

Another aspect of the present invention may be to provide a semiconductor device, including: a wiring board; a board mounted on the wiring board; a first semiconductor chip mounted on the board; and a second semiconductor chip mounted on the first semiconductor chip so that a position of the second semiconductor chip is shifted against a position of the first semiconductor chip; wherein a part of a main surface of the second semiconductor chip faces the first semiconductor chip; and an electrode pad on the main surface of the second semiconductor chip is connected to a second semiconductor chip connection pad by a connection part.

Other aspect of the present invention may be to provide a manufacturing method of a semiconductor device, including: a first step of fixing a first semiconductor chip on a wiring board; and a second step of stacking and fixing a second semiconductor chip on the first semiconductor chip in a state where a part of a main surface of the second semiconductor chip face the first semiconductor chip; wherein, in the second step, fixing the first semiconductor element and the second semiconductor element to each other by using an adhesive and connecting the second semiconductor element and a second semiconductor element connection pad of the wiring board to each other by a bump are simultaneously performed.

According to embodiments of the present invention, it is possible to provide a semiconductor device having a structure whereby the semiconductor device can be made thin while maintaining a high degree of design freedom for sizes and configurations of plural semiconductor chips superimposed on a supporting board such as a wiring board or without making the semiconductor chips thin, and a manufacturing method of the semiconductor device.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 5 through FIG. 45 of embodiments of the present invention.

First, structures of semiconductor devices of embodiments of the present invention are discussed, and then manufacturing methods of the semiconductor devices are discussed.

[Semiconductor Device]

First, basic structures of the semiconductor devices of the embodiments of the present invention are discussed, and then applied example (modified examples) based on the basic structures are discussed.

First Embodiment

Figure 1:
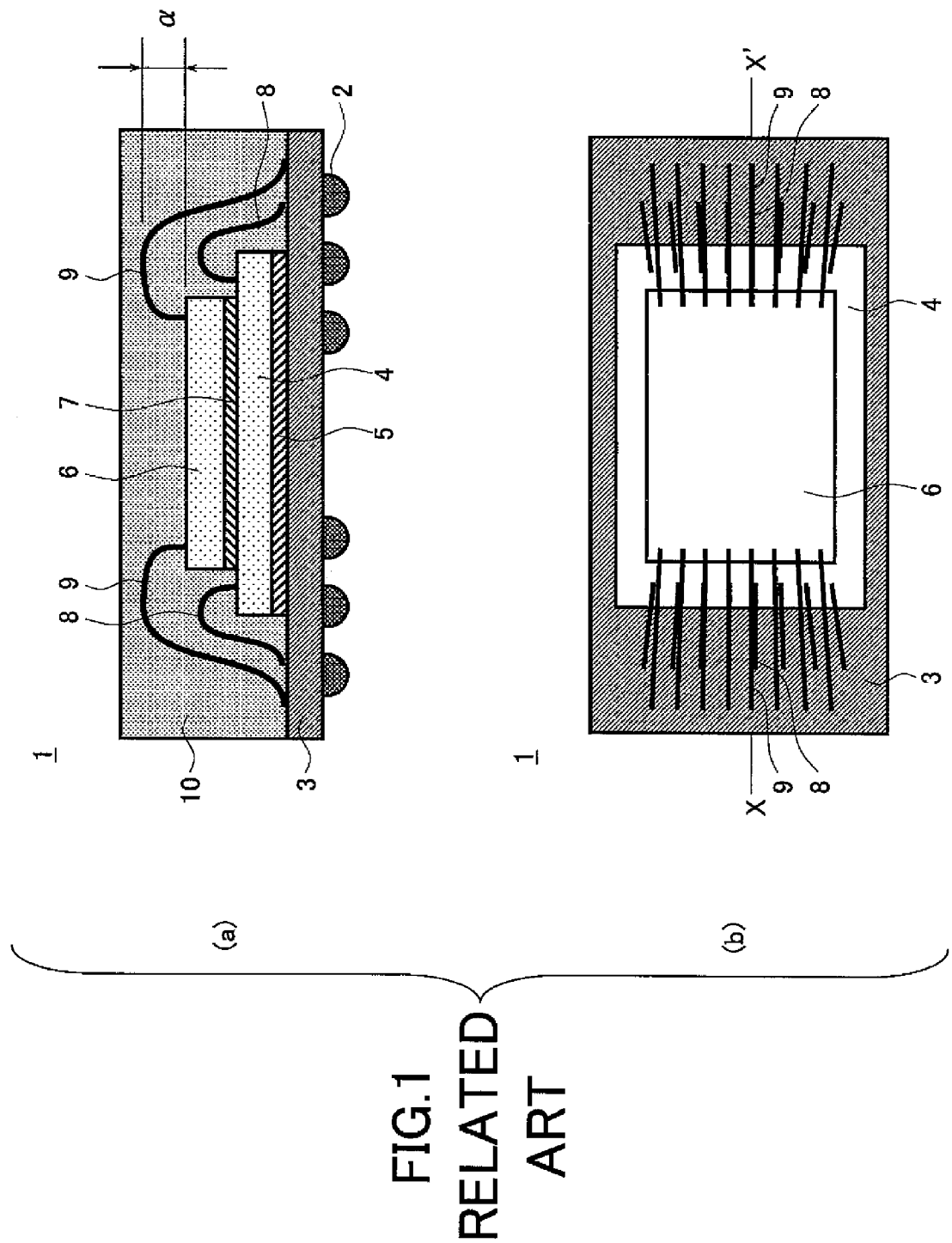
FIG. 1 is a cross-sectional view and a plan view showing a first example of a related art chip stacked type semiconductor device.
Figure 2:
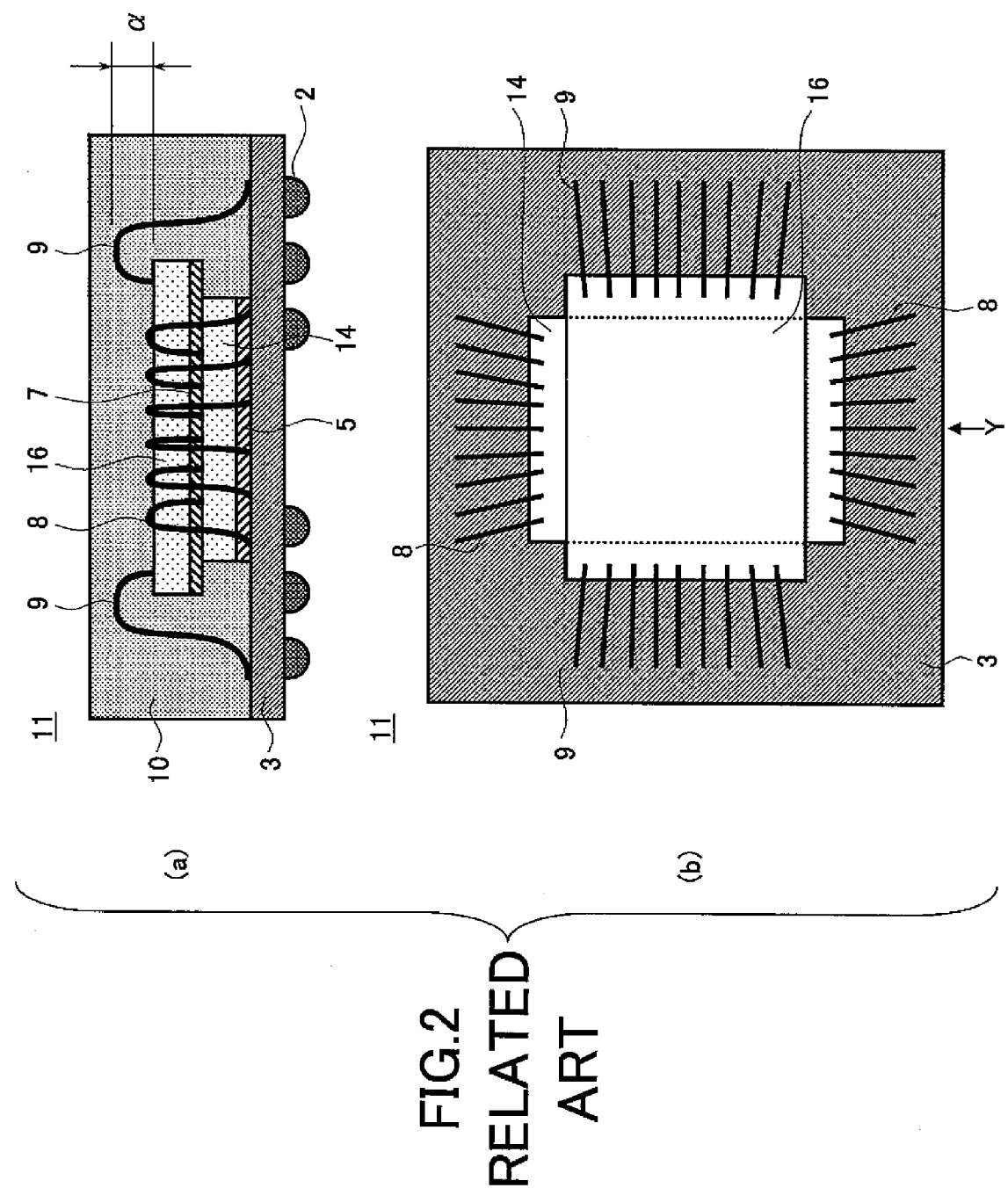
FIG. 2 is a cross-sectional view and a plan view showing a second example of a related art chip stacked type semiconductor device.
Figure 3:
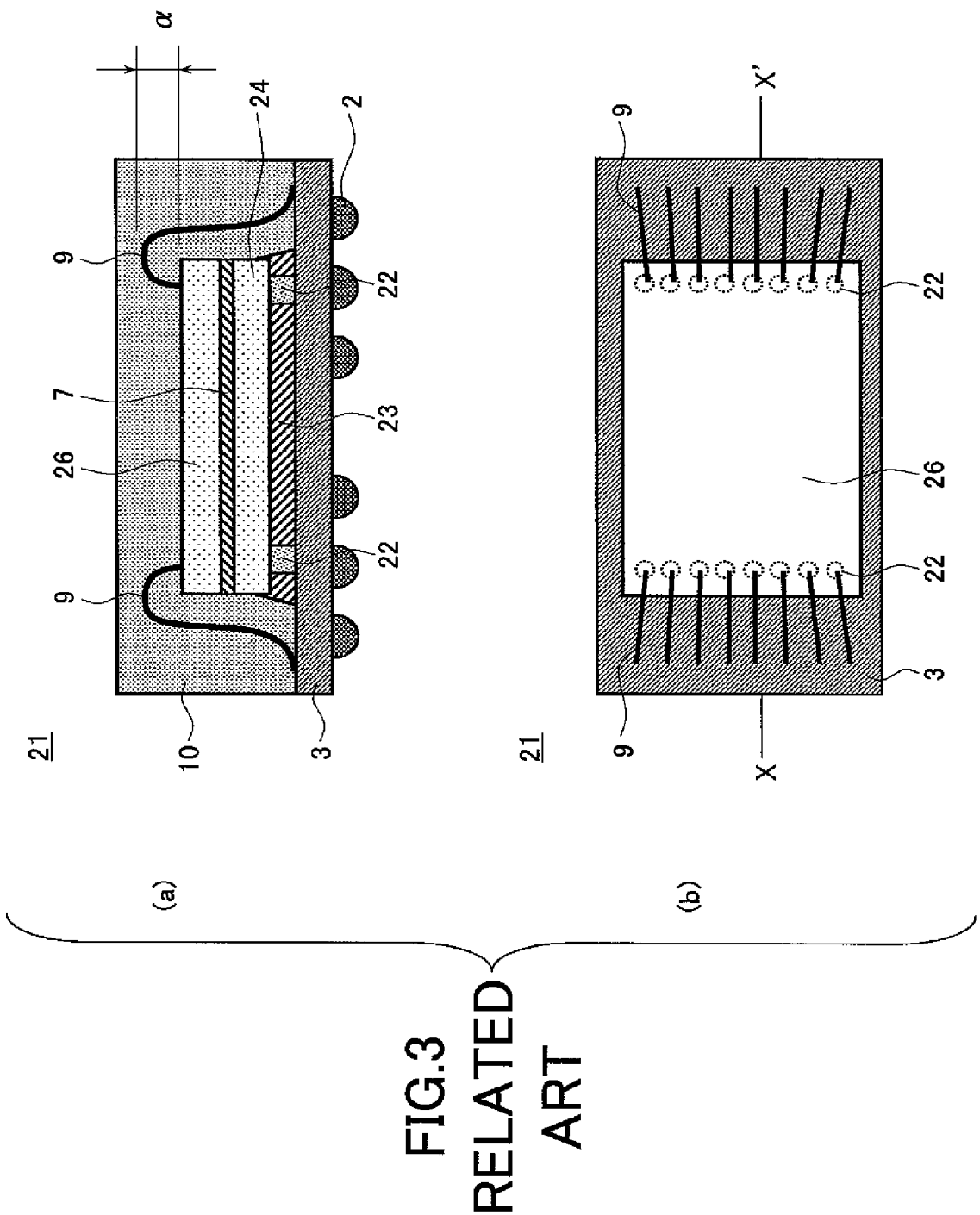
FIG. 3 is a cross-sectional view and a plan view showing a third example of a related art chip stacked type semiconductor device.
Figure 4:
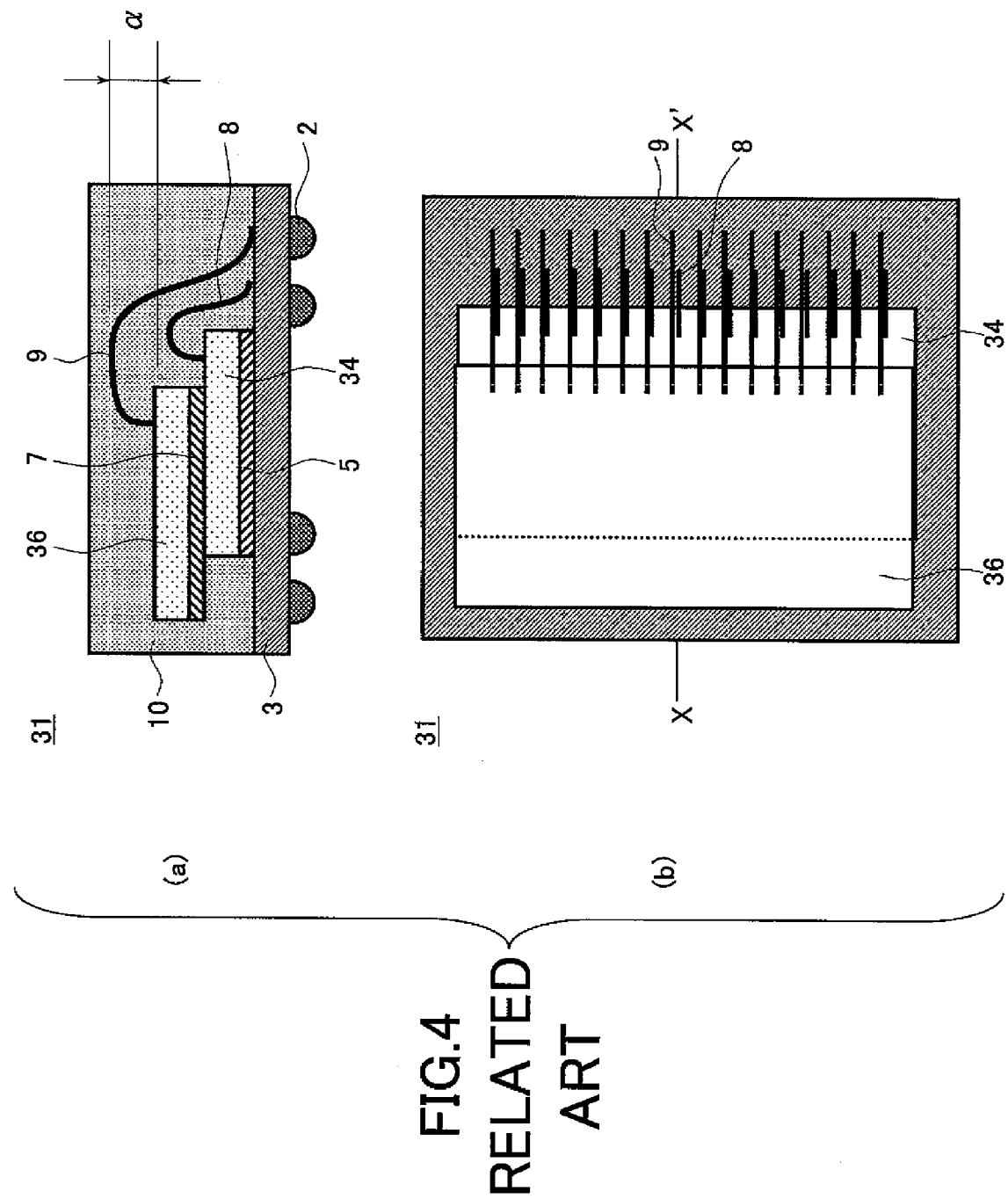
FIG. 4 is a cross-sectional view and a plan view showing a fourth example of a related art chip stacked type semiconductor device.
Figure 5:
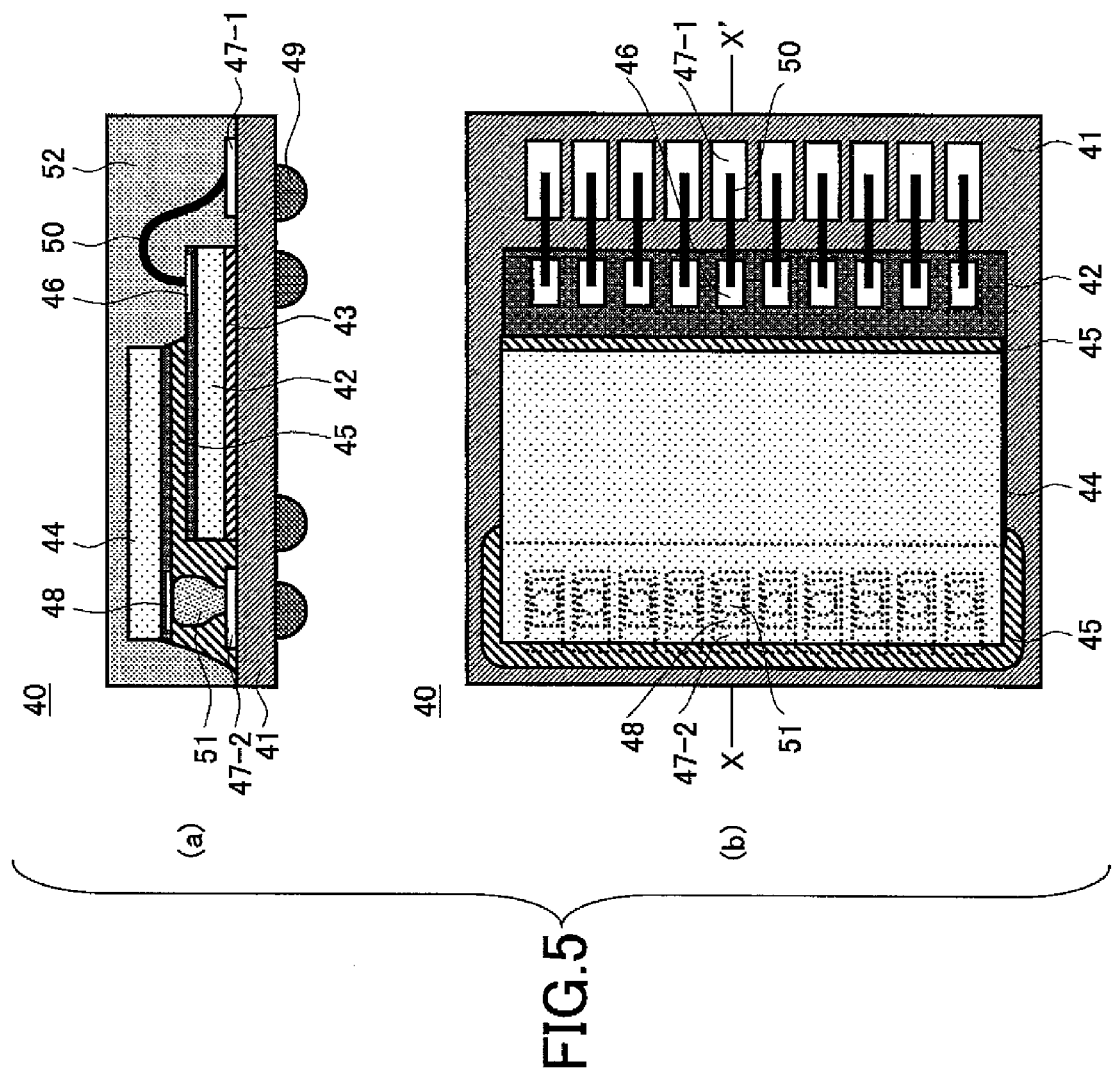
FIG. 5 is a cross-sectional view and a plan view showing a semiconductor device of a first embodiment of the present invention.

FIG. 5 shows a semiconductor device of a first embodiment of the present invention. FIG. 5(a) shows a cross section taken along line X-X' of FIG. 5(b). In FIG. 5(b), illustration of a sealing resin is omitted.

A semiconductor device 40 of the first embodiment of the present invention has a structure of so-called a BGA (Ball Grid Array).

In other words, a first semiconductor chip (first semiconductor element) 42 is provided and fixed on a main surface of a wiring board 41 via a first adhesive 43. In addition, a second semiconductor chip (second semiconductor element) 44 is provided and fixed on the first semiconductor chip 42 via a second adhesive 45 in a so-called face down (flip chip) state.

On the above-mentioned main surface of the wiring board 41, plural first bonding pads 47-1 for connecting to the first semiconductor element are provided corresponding to electrode pads 46 of the first semiconductor chip 42, and plural second bonding pads 47-2 for connecting to the second semiconductor element are provided corresponding to electrode pads 48 of the second semiconductor chip 44.

On the other hand, plural solder balls 49 as outside connection terminals are provided on another main surface (rear surface) of the wiring board 41.

Here, the wiring board 41 is made of, for example, glass-epoxy, glass-BT (bismaleimide-triazine), polyimide, ceramic, glass, or silicon (Si). In addition, the first bonding pads 47-1 and the second bonding pad 47-2 are formed of, for example, copper (Cu), and nickel (Ni) and gold (Au) plating are applied on surfaces of the first bonding pads 47-1 and the second bonding pads 47-2 from a lower layer.

A wiring layer (not shown in FIG. 5) for connecting the bonding pads or the outside connection terminals is provided on the surface of and/or inside the wiring board 41.

In the case of a so-called LGA (Land Grid Array) type semiconductor device, a copper (Cu) land where nickel (Ni) and gold (Au) plating is applied is supplied as the outside connection terminals 49.

Under this structure, in the first semiconductor chip 42, an active element such as an MOS transistor, a passive element such as a capacitive element, and a wiring layer connecting these elements to each other are formed on a main surface of a silicon (Si) semiconductor substrate so that an electronic circuit is formed.

The first semiconductor chip 42 is provided and fixed on the wiring board 41 via the first adhesive 43 in a so-called a face up state where the main surface (electronic circuit forming surface) of the first semiconductor chip 42 faces upward. Plural electrode pads 46 connecting to the not shown wiring layer are formed on the main surface (electronic circuit forming surface) of the first semiconductor chip 42. The electrode pads 46 are made of aluminum (Al), copper (Cu), or an alloy including aluminum (Al) or copper (Cu).

The first bonding pads 47-1 are provided on the wiring board 41 so as to correspond to the electrode pads 46. The electrode pads 46 of the first semiconductor chip 42 and the first bonding pads 47-1 of the wiring board 41 are connected to each other by the bonding wires 50. The bonding wires 50 are made of, for example, gold (Au), aluminum (Al), copper (Cu), or an alloy including gold (Au), aluminum (Al) or copper (Cu) and have a diameter of approximately 15 through 30 μm.

As the first adhesive 43, a thermosetting or thermoplastic insulating resin adhesive may be used. More specifically, as the first adhesive 43, epoxy group resin, polyimide resin, acrylic group resin, or silicon group resin may be used.

On the other hand, in the second semiconductor chip 44 as well as the first semiconductor chip 42, an electronic circuit is formed on a main surface of the second semiconductor chip 44.

The second semiconductor chip 44 is provided and fixed on the first semiconductor chip 42 in a so-called face down (flip chip) state where the electronic circuit forming surface of the second semiconductor chip 44 faces the first semiconductor chip 42 and the wiring board 41.

The second semiconductor chip 44 is provided and fixed on the first semiconductor chip 42 via the second adhesive 45.

Plural electrode pads 48 connecting to the not shown wiring layer are formed on the main surface (electronic circuit forming surface) of the second semiconductor chip 44. The electrode pads 48 are made of aluminum (Al), copper (Cu), or an alloy including aluminum (Al) or copper (Cu).

The second bonding pads 47-2 are provided on the wiring board 41 so as to correspond to the electrode pads 48 of the second semiconductor chip 44.

The electrode pads 48 of the second semiconductor chip 44 and the second bonding pads 47-2 of the wiring board 42 are connected to each other by bumps 51. The bumps 51 are made of gold (Au), copper (Cu), nickel (Ni), an alloy of these metals, a solder made of tin (Sn)-silver (Ag), tin (Sn)-silver (Ag)-copper (Cu), or the like, or conductive resin containing a metal such as silver (Ag) particle. The bump 51 are formed by a ball bonding method, a plating method, a printing method, a transferring method, or the like.

In this embodiment, the second adhesive for fixing the second semiconductor chip 44 to the first semiconductor chip 42 is provided between the second semiconductor chip 44 and the wiring board 41, so as to cover the periphery of the bumps 51 provided between the electrode pads 48 and the second bonding pads 47-2.

Here, the second adhesive 45 is used as not only the adhesive but also a so-called underfill material. In other words, the underfill material covering the periphery of the bumps 51 between the second semiconductor chip 44 and the wiring board 41 and the second adhesive fixing the second semiconductor chip 44 on the first semiconductor chip 42 are made of a common material. Accordingly, it is possible to reduce the number of elements forming the semiconductor device 40 so that the manufacturing cost of the semiconductor device 40 can be reduced.

As the second adhesive 45, a thermosetting or thermoplastic insulating resin adhesive may be used. More specifically, as the second adhesive 45, an epoxy group resin, an acrylic group resin, or a silicon group resin may be used. The second adhesive 45 may be made of the same material as or different material from the material of the first adhesive 43.

Under this structure, the second semiconductor chip 44 is shifted against the first semiconductor chip 42 along two facing sides of the external periphery of the main surface of the first semiconductor chip 42, so that the entire main surface of the second semiconductor chip 44 does not face toward the main surface of the first semiconductor chip 42, namely the entire main surface of the second semiconductor chip 44 is not overlapped on the main surface of the first semiconductor chip 42.

Therefore, the electrode pads 46 of the first semiconductor chip 42 and the electrode pads 48 of the second semiconductor chip 44 are provided in a line in an area of the main surface of the first semiconductor chip 42 and the main surface of the second semiconductor chip 44 where the first semiconductor chip 42 and the second semiconductor chip 44 do not face each other.

The bonding pads 47 of the wiring board 41 are also provided in a line so as to correspond to these electrode pads 46 and 48.

Sealing resin 52 is provided on the main surface of the wiring board 41 so as to cover and seal the stacked semiconductor chips 42 and 44, the bonding wires 50, an exposed surface of the adhesive 45, and others. A thermosetting epoxy resin, for example, is used as the sealing resin 52.

By the above-mentioned resin sealing, the first semiconductor chip 42 and the second semiconductor chip 44 are sealed in a body by the sealing resin 52 so as to be protected from a mechanical external force, moisture, and the like.

Thus, in the semiconductor device of the first embodiment of the present invention, the second semiconductor chip 44 is mounted on the first semiconductor chip 42 mounted on the wiring board 41 in the face down (flip chip) state. In addition, the second semiconductor chip 44 and the wiring board 42 are connected to each other by the bump 41.

Therefore, unlike the related art cases shown in FIG. 1 through FIG. 4, it is not necessary to connect the bonding wire to the electrode pad of the second semiconductor chip. In addition, it is not necessary to provide the sealing resin corresponding to the height of the wire loops of the bonding wires.

Accordingly, it is possible to provide a semiconductor device having a structure whereby the semiconductor device can be made thin while the design freedom degree for sizes of configurations of plural semiconductor chips 42 and 44 mounted on the wiring board 41 are kept or without making the semiconductor chips 42 and 44 thin.

In addition, in the semiconductor device 40, the second bonding pads 47-2 of the wiring board 41 are provided so as to face the electrode pads 48 of the second semiconductor chip 44, namely to be overlapped in a direction perpendicular to the main surface of the wiring board 41. Therefore, it is not necessary to expand an arrangement area of the bonding pads or provide the bonding pads separated from the second semiconductor chip 44. Accordingly, it is not necessary to make the wiring board 41 large and it is possible to make the size of the wiring board 41 smaller than that of the related art semiconductor device shown in FIG. 4.

In this semiconductor device, the first semiconductor chip 42 and the second semiconductor chip 44 may be the same kind of semiconductor element, for example, a storage element such as a flash memory or a DRAM (Dynamic Random Access Memory). Furthermore, the first semiconductor chip 42 and the second semiconductor chip 44 may be different kinds of semiconductor elements such that one is a storage element such as flash memory and the other one is a logical circuit element such as a microprocessor. Selection or combination of such semiconductor elements is determined corresponding to an electronic device where these semiconductor elements are to be applied.

In the meantime, as discussed above, in the semiconductor device 40, the sealing resin 52 is provided on the main surface of the wiring board 41 so as to seal the stacked semiconductor elements, the bonding wires, the exposed surface of the adhesive, and others. However, the present invention is not limited to such a structure. In other words, for example, structure shown in FIG. 6 through FIG. 10 can be applied as a resin sealing structure, an arrangement structure of a radiator, an arrangement structure of bumps, or the like.

Here, FIG. 6 through FIG. 10 shows first through fifth modified examples of the semiconductor device of the first embodiment of the present invention. In FIG. 6 through FIG. 10, parts that are the same as the parts shown in FIG. 5 are given the same reference numerals, and explanation thereof is omitted.

First Modified Example

Figure 6:
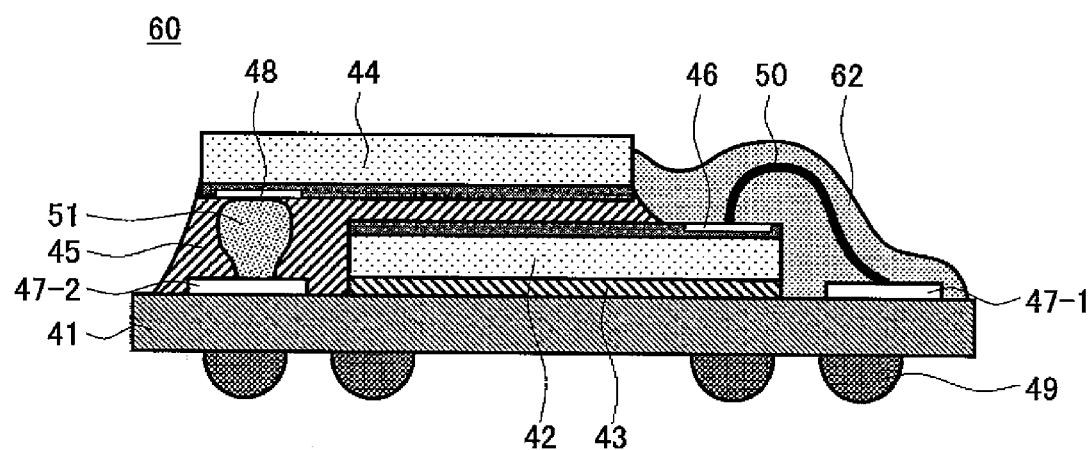
FIG. 6 is a cross-sectional view showing a first modified example of the semiconductor device of the first embodiment of the present invention.

A semiconductor device 60 of the first modified example of the first embodiment of the present invention is shown in FIG. 6.

In the semiconductor device 60, a minimum part such as the first bonding pad 47-1, the bonding wire 50, and the electrode pad 46 of the first semiconductor chip 42 is covered with sealing resin 62 made of, for example, thermosetting epoxy resin.

Thus, by covering the minimum part with the resin, this part can be protected from a mechanical external force, moisture, and the like and the amount of use of the sealing resin 62 can be reduced. Therefore, it is possible to reduce the manufacturing cost of the semiconductor device 60. As a method for selectively covering the sealing resin 62, a method whereby paste resin is supplied via a potting method can be used.

In the above-mentioned semiconductor device 60, the sealing resin 62 is not provided on a rear surface (upper surface in FIG. 6) of the second semiconductor chip 44 so that the rear surface of the second semiconductor chip 44 is exposed. Therefore, in this example, compared to the example shown in FIG. 5, it is possible to make the semiconductor device thin. In addition, since the rear surface of the second semiconductor chip 44 is exposed, it is possible to improve heat dissipation.

Second Modified Example

Figure 7:
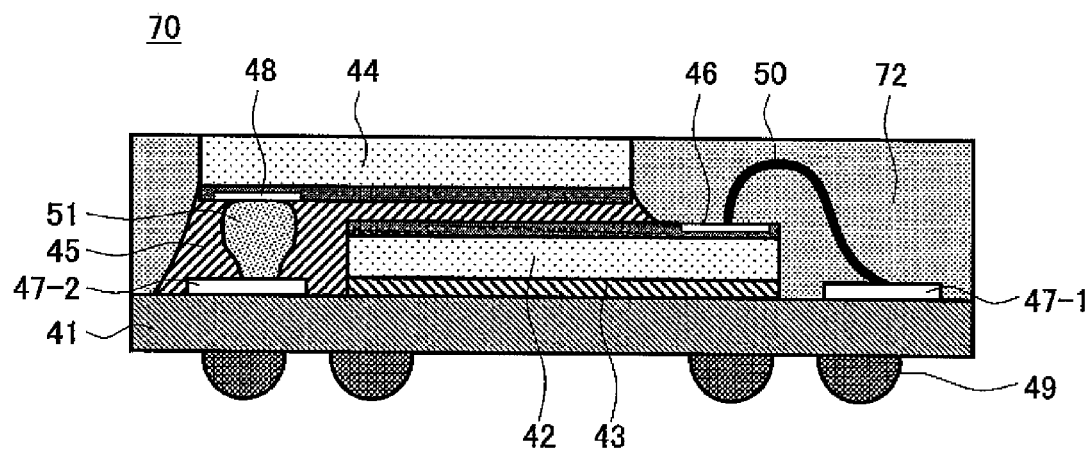
FIG. 7 is a cross-sectional view showing a second modified example of the semiconductor device of the first embodiment of the present invention.

A semiconductor device 70 of the second modified example of the first embodiment of the present invention is shown in FIG. 7.

In the semiconductor device 70, the first bonding pad 47-1, the bonding wire 50, the electrode pad 46 of the first semiconductor chip 42, a side surface of the first semiconductor chip 42, the second semiconductor chip 44, and the second adhesive 45 are covered with sealing resin 72. On the other hand, an upper surface of the second semiconductor chip 44 is not covered with the sealing resin 72 so as to be exposed outside.

Thus, since the first semiconductor chip 42 and the second semiconductor chip 44 are sealed in a body by the sealing resin 72 so as to be protected from a mechanical external force, moisture, and the like.

Furthermore, in this example as compared to the first modified example shown in FIG. 6, it is possible to form the external configuration with high precision and handle this easily.

In the above-mentioned semiconductor device 60 as well as the semiconductor device 50 of the first modified example, the sealing resin 72 is not provided on the rear surface of the second semiconductor chip 44 so that the rear surface of the second semiconductor chip 44 is exposed. Therefore, it is possible to make the semiconductor device thin. In addition, since the rear surface of the second semiconductor chip 44 is exposed, it is possible to improve heat dissipation.

Third Modified Example

Figure 8:
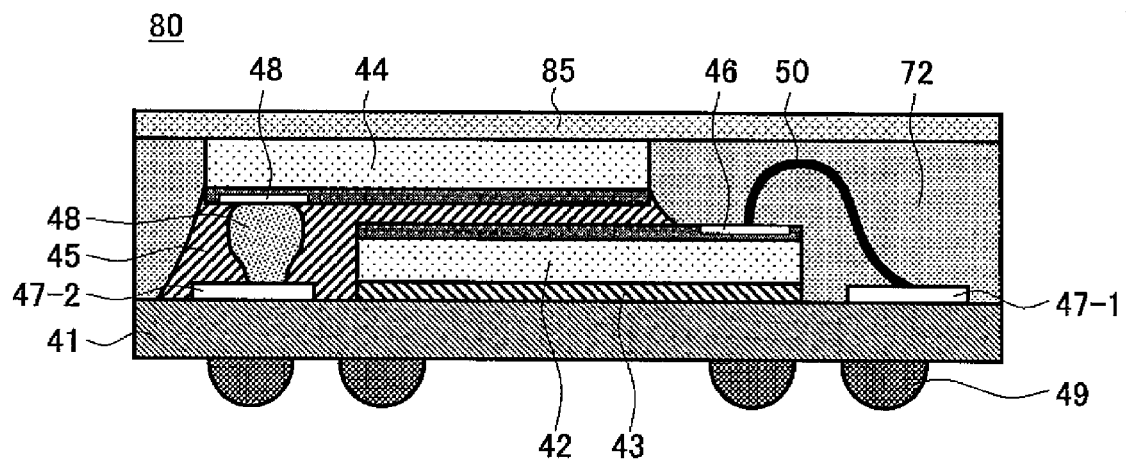
FIG. 8 is a cross-sectional view showing a third modified example of the semiconductor device of the first embodiment of the present invention.

A semiconductor device 80 of the third modified example of the first embodiment of the present invention is shown in FIG. 8. In the semiconductor device 80, a heat spreader 85 is provided so as to extend from the rear surface of the second semiconductor chip 44 to an upper surface of the sealing resin 72.

The heat spreader 85 is formed by, for example, a metal material made of copper (Cu), aluminum (Al), tungsten (W), molybdenum (Mo), silver (Ag), gold (Au), or an alloy of these metal, a ceramic material such as AlSiCu or aluminum nitride (AlN), or a compound material of these materials.

The heat spreader 85 is formed in a plate shape or foil in advance and fixed on the rear surface of the second semiconductor chip 44 and the sealing resin 72 in a body. Alternatively, heat spreader 85 is arranged by deposition of the metal or by providing in a body at the time when the sealing resin 72 is formed.

By providing such the heat spreader 85, compared to the semiconductor device 70 of the second modified example, the semiconductor device 80 has higher heat dissipation rate.

Fourth Modified Example

Figure 9:
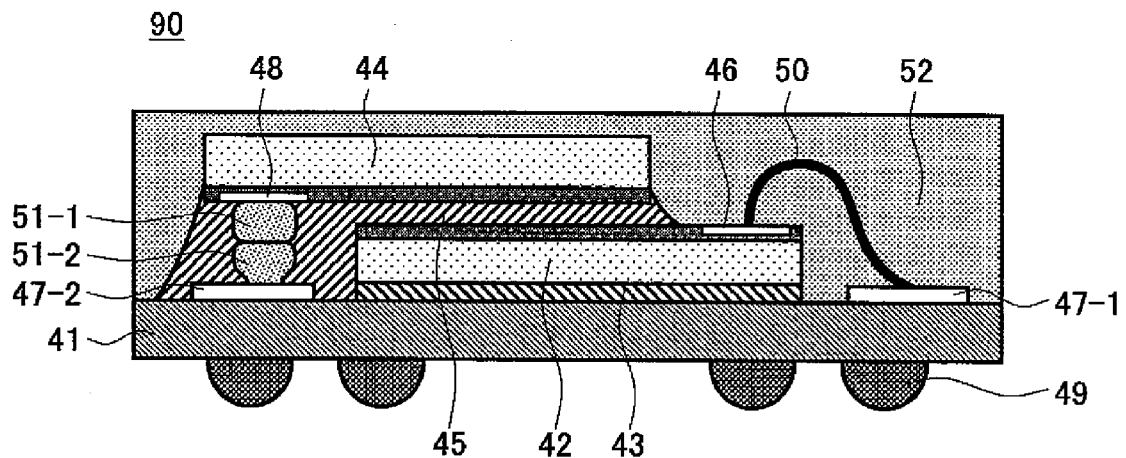
FIG. 9 is a cross-sectional view showing a fourth modified example of the semiconductor device of the first embodiment of the present invention.

A semiconductor device 90 of the fourth modified example of the first embodiment of the present invention is shown in FIG. 9.

In the semiconductor device 90, the electrode pad 48 of the second semiconductor chip 44 and the second bonding pad 47-2 of the wiring board 41 corresponding to the electrode pad 48 are connected to each other by stacked bumps.

In other words, in the semiconductor device 90, bumps 51-1 and 51-2 are stacked between the electrode pad 48 of the second semiconductor chip 44 and the second bonding pad 47-2 of the wiring board 41.

The bumps 51-1 and 51-2 are made of gold (Au) bumps which are formed by ball bonding a gold (Au) wire and then tearing off the wire. In the case of the gold (Au) bumps, it is possible to easily stack them, namely form the stack in multiple steps. Therefore, corresponding to thickness of the first semiconductor chip 42, it is possible to easily adjust the height (thickness) of the bump 51. In addition, even if an area of the second electrode pad 48 of the second semiconductor chip 44 is small, it is possible to easily form a high (thick) bump 51 so that it is possible to easily correspond to refining the electrode pad 48.

The structures shown in FIG. 6 through FIG. 8 can be applied to the sealing resin 52 of this modified example.

Fifth Modified Example

Figure 10:
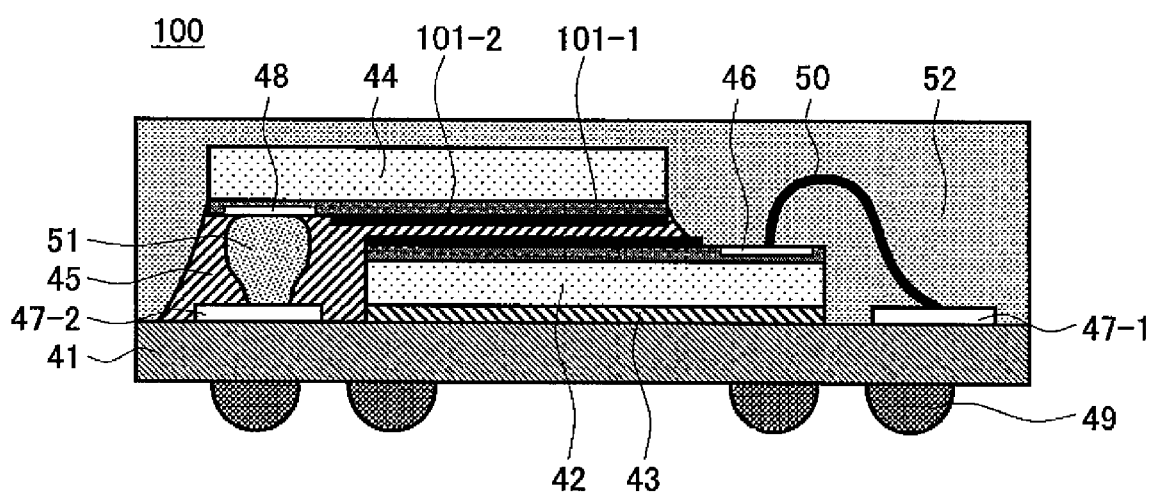
FIG. 10 is a cross-sectional view showing a fifth modified example of the semiconductor device of the first embodiment of the present invention.

A semiconductor device 100 of the fifth modified example of the first embodiment of the present invention is shown in FIG. 10.

In the semiconductor device 100, surface protection films 101-1 and 101-2 are provided on the electronic circuit forming surface of the first semiconductor chip 42 and the electronic circuit forming surface of the second semiconductor chip 44 so as to selectively cover areas where the first semiconductor chip 42 and the second semiconductor chip 44 face each other.

The surface protection films 101-1 and 101-2 are made of, for example, an insulating organic resin film of a polyimide group, a silicon group, or the like. The surface protection films 101-1 and 101-2 are formed by a selective covering method or the like as a part of a semiconductor wafer process of the first semiconductor chip 42 and the second semiconductor chip 44. The surface protection films 101-1 and 101-2 have film thickness of, for example, approximately 5 μm through 20 μm.

Thus, by providing the surface protection films 101-1 and 101-2, when the second semiconductor chip 44 is provided on the first semiconductor chip 42 and the second semiconductor chip 44 is flip chip connected to the wiring board 41 in a manufacturing process of the semiconductor device 100, even if a foreign particle such as a silicon piece enters between the first semiconductor chip 42 and the second semiconductor chip 44, it is possible to prevent the electronic circuit forming surfaces of the first semiconductor chip 42 and the second semiconductor chip 44 from being damaged due to the foreign particle.

In addition, in this example, at the time of the flip chip connecting, it is possible to expand an allowable range of conditions of a force applied to the second semiconductor chip 44 so that the yield rate of the semiconductor device 100 can be improved.

The structures shown in FIG. 6 through FIG. 10 can be applied to the sealing resin of the fifth modified example and the structure shown in FIG. 9 can be applied to the bump of the fifth modified example.

On the other hand, in the example shown in FIG. 5, in order to prevent unnecessary expansion of the second adhesive 45, a so-called dam structure may be selectively provided on the electronic circuit forming surface of the first semiconductor chip 42 and/or the main surface of the wiring board 41. This structure is shown as a sixth modified example of the first embodiment of the present invention.

Figure 11:
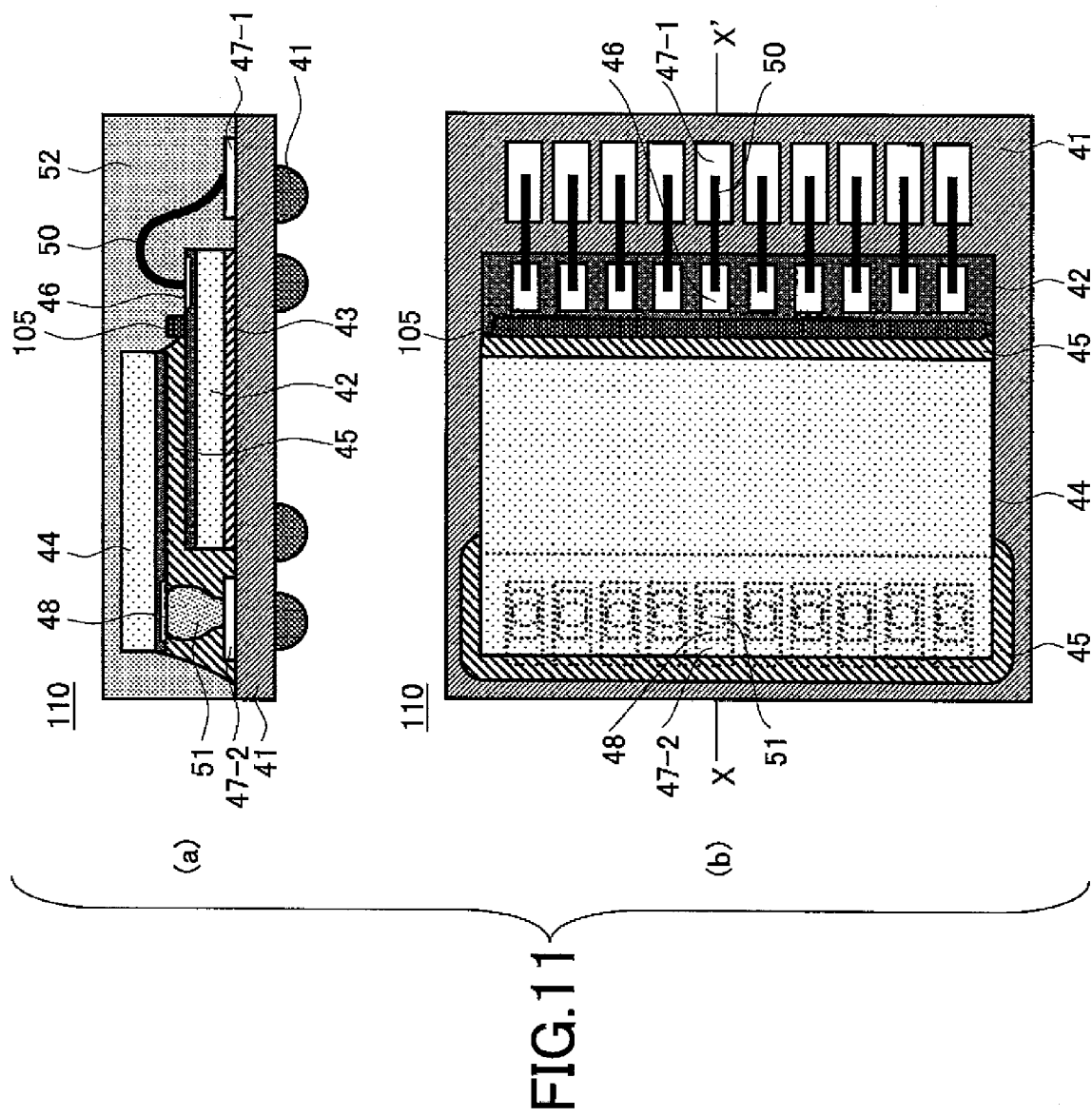
FIG. 11 is a cross-sectional view and a plan view showing a sixth modified example (part 1) of the semiconductor device of the first embodiment of the present invention.
Figure 12:
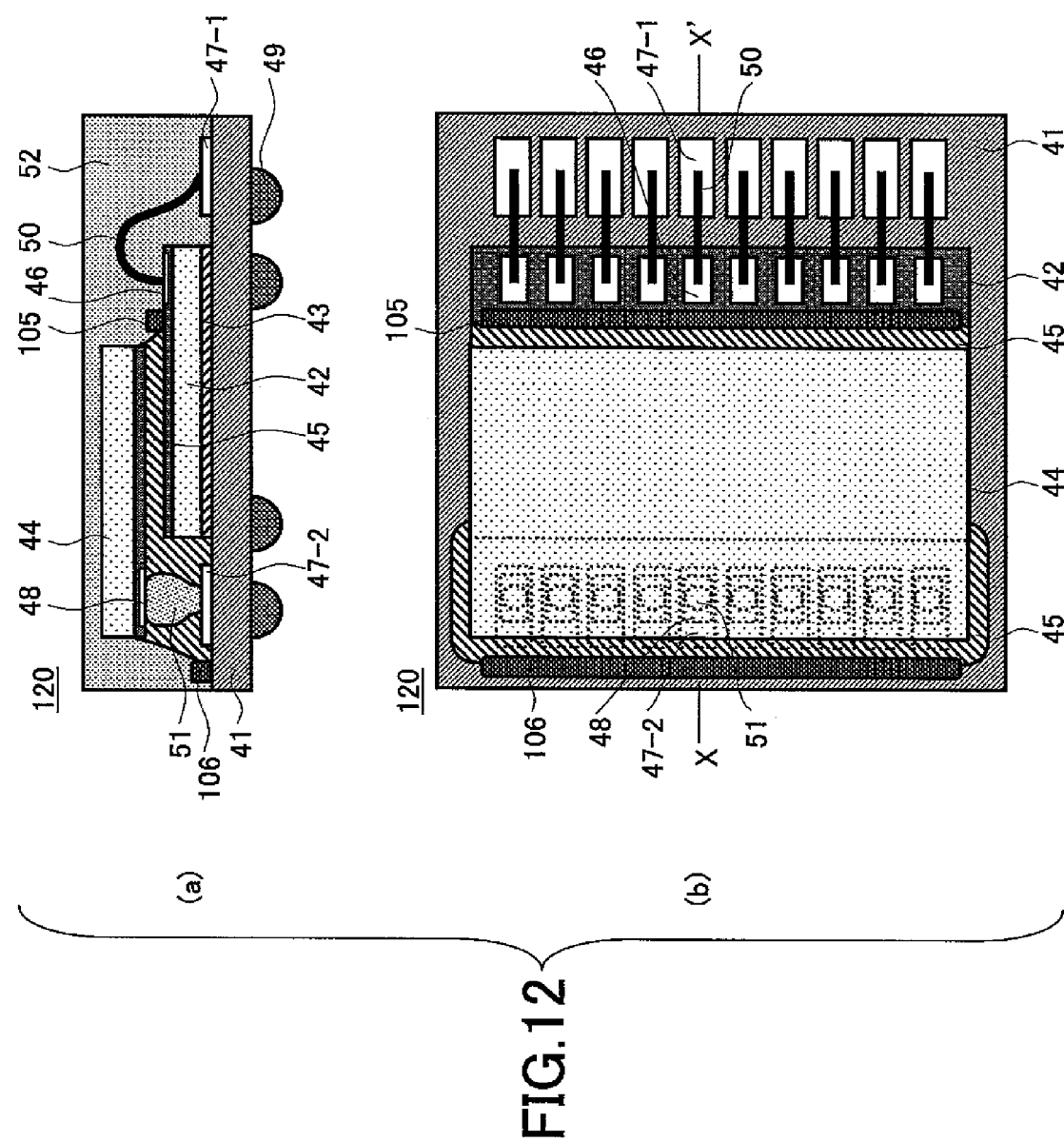
FIG. 12 is a cross-sectional view and a plan view showing a sixth modified example (part 2) of the semiconductor device of the first embodiment of the present invention.
Figure 13:
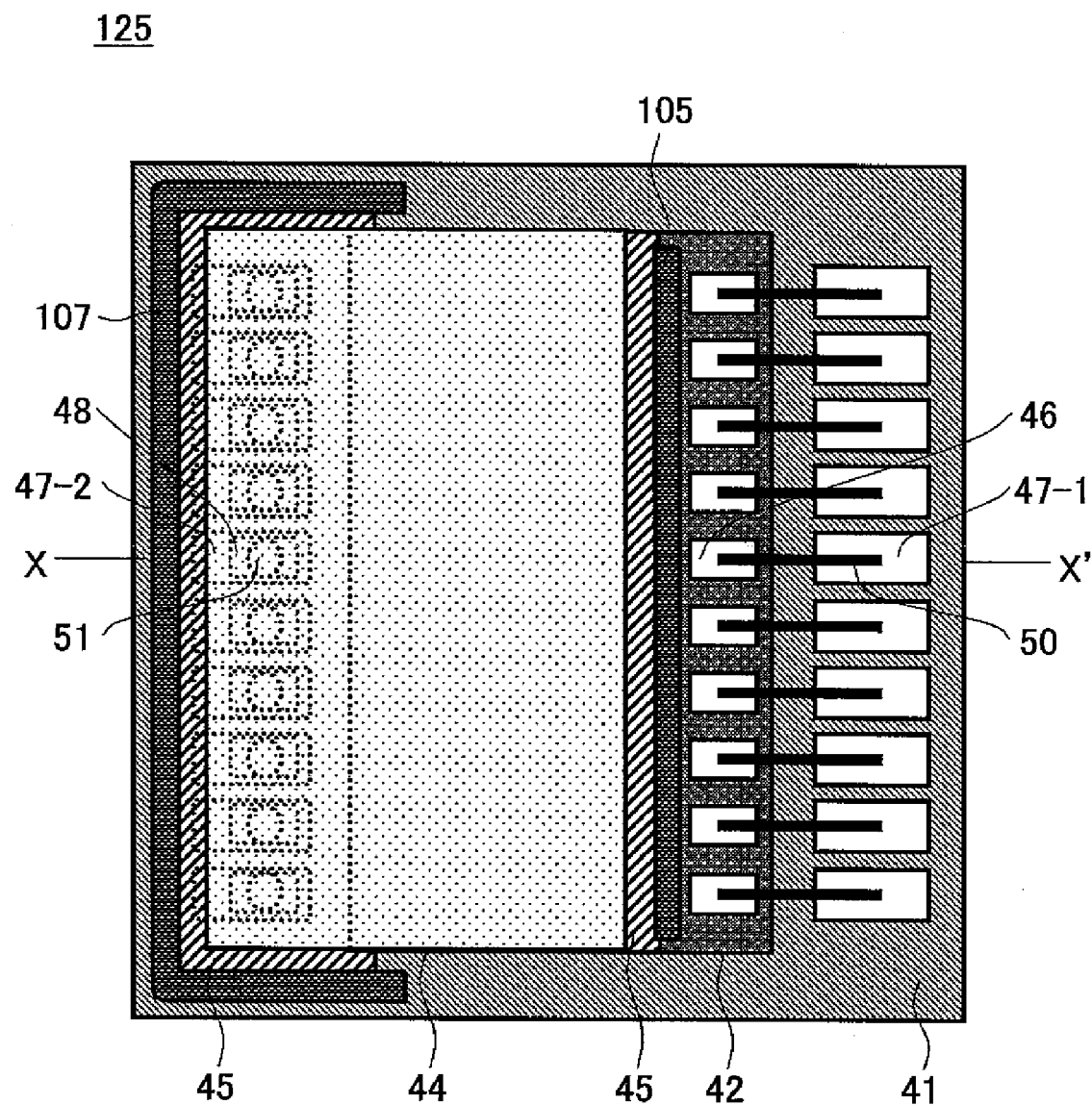
FIG. 13 is a plan view showing a sixth modified example (part 3) of the semiconductor device of the first embodiment of the present invention.

FIG. 11 through FIG. 13 shows examples of the dam structure. FIG. 11(a) is a cross-sectional view taken along line X-X' of FIG. 11(b) and FIG. 12(a) is a cross-sectional view taken along line X-X' of FIG. 12(b). In FIG. 11 through FIG. 13, parts that are the same as the parts shown in FIG. 5 are given the same reference numerals, and explanation thereof is omitted.

Sixth Modified Example

Part 1

In a semiconductor device 110 shown in FIG. 11, a linear dam 105 having a substantially convex shaped cross section is provided along an end part of the second semiconductor chip 44 between the electrode pad 46 and an end part of the second semiconductor chip 44 on the electronic circuit forming surface of the first semiconductor chip 42.

The dam 105 is formed by, for example, resin made of epoxy, polyimide, silicon, or the like, aluminum (Al), copper (Cu), tin (Sn), silver (Ag), or an alloy of these metals. The dam 105 can be formed by patterning by a photolithography, plating, or attaching as a part of a semiconductor wafer process of the first semiconductor chip 42.

By selectively providing the dam 105, when the second semiconductor chip 44 is stacked on the first semiconductor chip 42 via the second adhesive 45 in the manufacturing process of the semiconductor device 110, even if the second adhesive 45 flows, the flow of the second adhesive 45 is prevented from overflow the dam 105. Accordingly, it is possible to connect the bonding wire 50 to the bonding pad 46.

The height of the dam 105 is selected so that the overflow of the second adhesive 45 is prevented. For example, the height of the dam 105 may be approximately 5 μm through 10 μm.

Sixth Modified Example

Part 2

In a semiconductor device 120 shown in FIG. 12 of this example as well as the sixth modified example (part 1), a linear dam 105 having a substantially convex shaped cross section is provided along an end part of the second semiconductor chip 44 between the electrode pad 46 and an end part of the second semiconductor chip 44 on the electronic circuit forming surface of the first semiconductor chip 42.

On the other hand, a linear dam 106 having a substantially convex shaped cross section is provided along the line of the second bonding pads 47-2 between the second bonding pad 47-2 and an end part of the wiring board 41 on the main surface of the wiring board 41 where the first semiconductor chip 42 is fixed. This is based on the assumption of a case where the amount of flow of the second adhesive 45 is large.

The dam 106 as well as the dam 105 are formed by, for example, resin made of epoxy, polyimide, silicon, or the like, aluminum (Al), copper (Cu), tin (Sn), silver (Ag), or an alloy of these metals. The dam 106 can be formed by patterning by photolithography, plating, or attaching.

By providing the dam 106, when the second semiconductor chip 44 is stacked on the first semiconductor chip 42 via the second adhesive 45 in the manufacturing process of the semiconductor device 110, even if the second adhesive 45 flows in the end part direction of the wiring board 41, the flow of the second adhesive 45 is obstructed by the dam 106. Accordingly, in the semiconductor device 120, it is possible to make the wiring board 41 small. The height of the dam 106 is selected so that the overflow of the second adhesive 45 is prevented. For example, the height of the dam 106 may be approximately 15 µm through 70 µm.

Sixth Modified Example

Part 3

In a semiconductor device 125 shown in FIG. 13 of this example as well as the sixth modified example (part 2), a linear dam 105 having a substantially convex shaped cross section is provided along an end part of the second semiconductor chip 44 between the electrode pad 46 and an end part of the second semiconductor chip 44 on the electronic circuit forming surface of the first semiconductor chip 42.

In addition, a U-shaped dam 107 having a substantially convex shaped cross section is provided in parallel with the line of the second bonding pads 47-2 and at the end part between the second bonding pad 47-2 and an end part of the wiring board 41 on the main surface of the wiring board 41 where the first semiconductor chip 42 is fixed.

The dam 107 is provided between the second bonding pads 47-2 and the end part of the wiring board 41 so as to form a substantially rectangular shape without one side along three sides of the external periphery of the wiring board 41.

By providing the dam 107, even if the second adhesive 45 flows in the end part direction of the wiring board 41, the flow of the second adhesive 45 is effectively obstructed by the dam 107. Accordingly, in the semiconductor device 125, it is possible to make the wiring board 41 small. The height of the dam 107 is selected so that the overflow of the second adhesive 45 is prevented. For example, the height of the dam 107 may be approximately 15 µm through 70 µm.

The structures shown in FIG. 6 through FIG. 8 can be applied to the sealing resin in the modified examples shown in FIG. 11 through FIG. 13.

Furthermore, the structure shown in FIG. 9 can be the structure of the bump. In addition, as shown in the modified example shown in FIG. 10, the surface protection films 101-1 and 101-2 are provided on the electronic circuit forming surface of the first semiconductor chips 42 and the electronic circuit forming surface of the second semiconductor chips 44.

In the meantime, in the semiconductor devices shown in FIG. 5 through FIG. 13, the electrode pads 46 are provided on the electronic circuit forming surface of the first semiconductor chips 42 along one side of electronic circuit forming surface. The first bonding pads 47-1 are provided on the wiring board 41 so as to correspond to the electrode pads 46.

In addition, the electrode pads 48 are provided on the electronic circuit forming surface of the second semiconductor chips 44 along one side of electronic circuit forming surface. The second bonding pads 47-2 are provided on the wiring board 41 so as to correspond to the electrode pads 48.

In other words, in these semiconductor chips, the electrode pads for outside connection are provided along the selected side of the electronic circuit forming surfaces.

Setting or changing the arrangement of positions of the electrode pads can be realized by, for example, the following methods.

Figure 14:
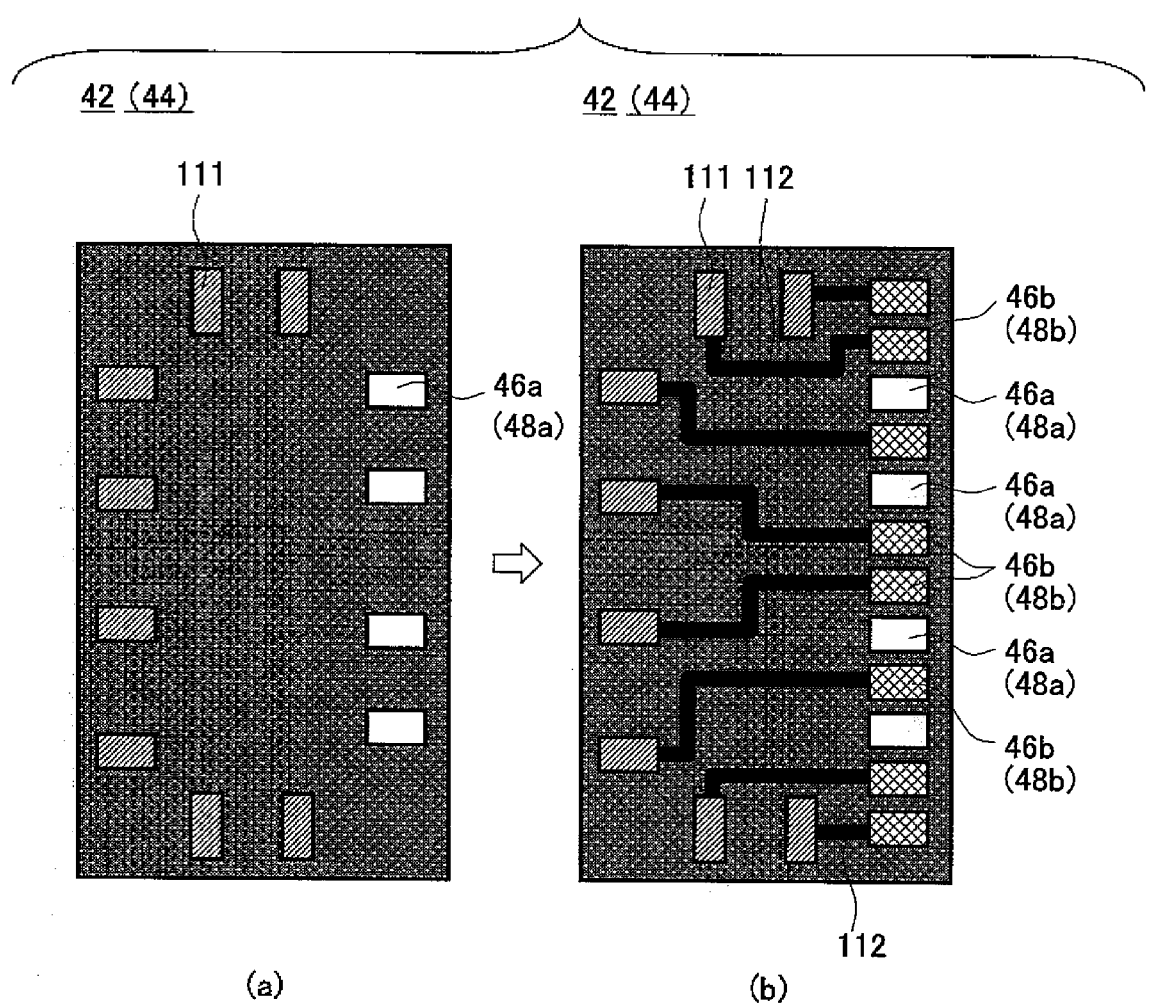
FIG. 14 is a plan view showing arrangement and a changed structure of electrode pads of the semiconductor device of the first embodiment of the present invention.

FIG. 14 is a plan view showing arrangement and a changed structure of the electrode pads of the semiconductor device shown in FIG. 5.

In other words, it is general practice that the electrode pads 46 (48) are arranged in a line along four sides of the electronic circuit forming surface of the first semiconductor chip 42 (second semiconductor chip 44).

In the embodiment of the present invention, the electrode pads along selected one side of the semiconductor chip are used as outside connection pads. The electrode pads 111 arranged along other three sides of the electronic circuit forming surface are subjects of positions change. See FIG. 14(a).

In other words, the electrode pads 111 arranged along other three sides of the electronic circuit forming surface and being subjects of redistribution are connected to electrode pads 46b (48b) provided between the electrode pads 46a (48a) arranged along the selected one side of the electronic circuit forming surface by an redistribution layer 112. As a result of this, outside connection can be realized. See FIG. 14(b).

In other words, the electrode pads 46 (48) and the electrode pads 46b (48b) where the redistribution layers 112 are connected are arranged substantially in a line along the selected one side (right side in the example shown in FIG. 14) of the semiconductor chip.

The redistribution layer 112 is made of copper (Cu), aluminum (Al), silver (Ag), or an alloy of these metals. The redistribution layer 112 can be formed on the electronic circuit forming surface of the first semiconductor chip 42 (the second semiconductor chip 44) as a part of the semiconductor wafer process, a plating method, or an ink jet method.

Thus, the electrode pads 111 are redistributed in a position proper for stacking the first semiconductor chip 42 (second semiconductor chip 44) via the redistribution layer 112, namely at the one side of the electronic circuit forming surface where the electrode pads 46 (48) are provided, so as to be connected to the bonding pads 47-1 (47-2) of the wiring board 41.

Accordingly, the design freedom degree of the arrangement of the electrode pads in the semiconductor chip 42 or 44 is high.

Figure 16:
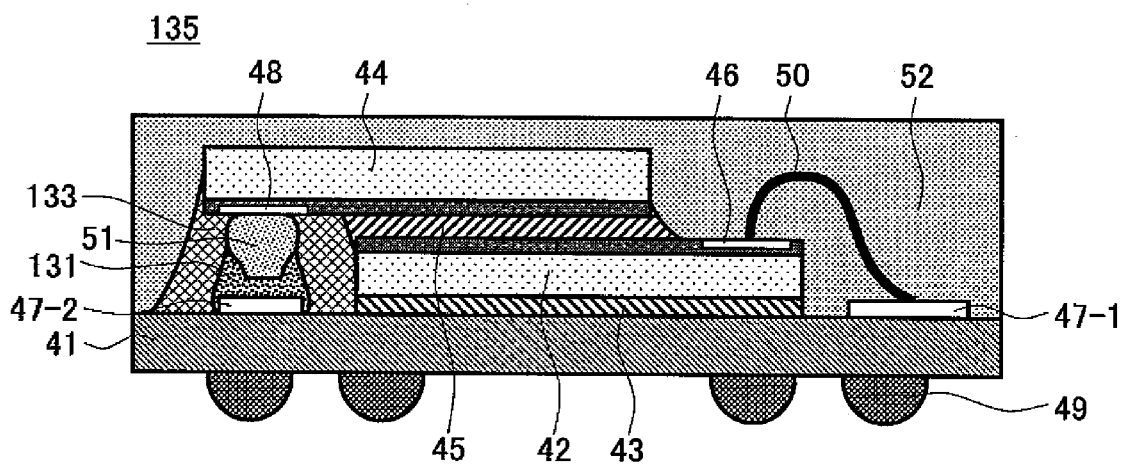
FIG. 16 is a cross-sectional view of a semiconductor device of a third embodiment of the present invention.
Figure 17:
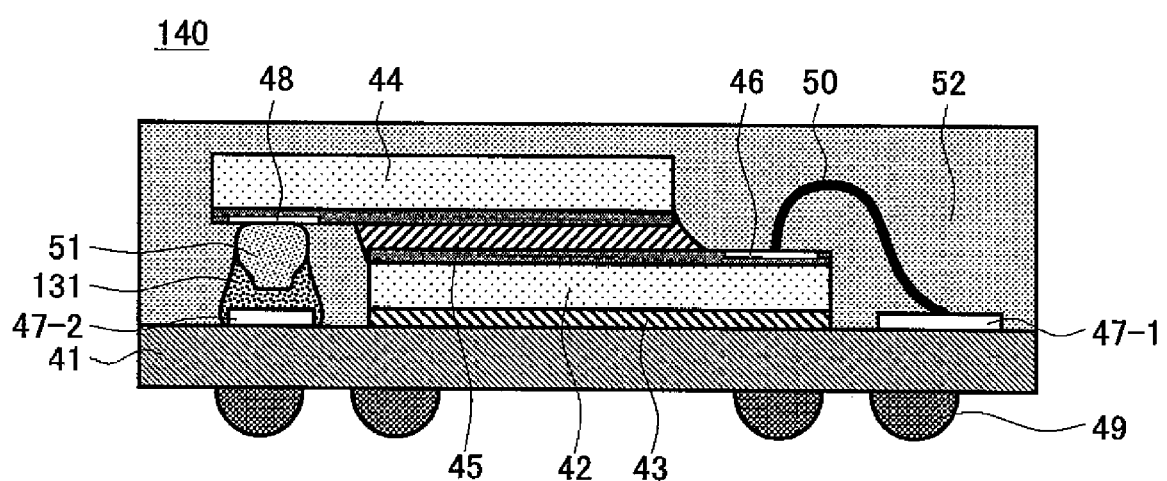
FIG. 17 is a cross-sectional view of a semiconductor device of a fourth embodiment of the present invention.

Next, other embodiments of arrangement of the adhesive and the underfill material of the semiconductor device are discussed with reference to FIG. 15 through FIG. 17. Here, FIG. 15 through FIG. 17 are cross-sectional views of a semiconductor device of second through fourth embodiments of the present invention.

Second Embodiment

Figure 15:
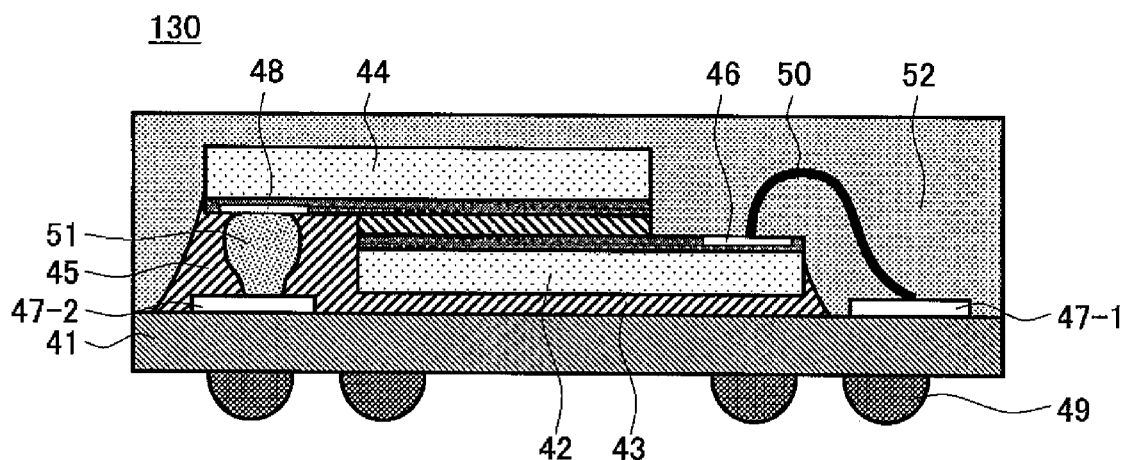
FIG. 15 is a cross-sectional view of a semiconductor device of a second embodiment of the present invention.

FIG. 15 shows a semiconductor device of a second embodiment of the present invention. In FIG. 15, parts that are the same as the parts shown in FIG. 5 are given the same reference numerals, and explanation thereof is omitted.

In a semiconductor device 130 of the second, the first adhesive 43 used for fixing the first semiconductor chip 42 to the wiring board 41 is provided so as to surround the bump 51 connecting the electrode pad 48 of the second semiconductor chip 44 and the second bonding pad 47-2.

Under this structure, the first adhesive 43 is used as not only the adhesive but also a so-called underfill material. In other words, the underfill material covering the periphery of the bump 51 and the first adhesive 43 fixing the second semiconductor chip 42 on the wiring board 41 are made of a common material. Accordingly, it is possible to reduce the number of elements forming the semiconductor device 30 so that manufacturing cost of the semiconductor device 30 can be reduced.

In this embodiment, the structures shown in FIG. 6 through FIG. 14 can be applied to the sealing resin 52.

Third Embodiment

FIG. 16 shows a semiconductor device of a third embodiment of the present invention. In FIG. 16, parts that are the same as the parts shown in FIG. 5 are given the same reference numerals, and explanation thereof is omitted.

In the semiconductor device 135 of the third embodiment of the present invention, the electrode pad 48 of the second semiconductor chip 44 and the second bonding pad 47-2 of the wiring board 41 are connected to each other by the bump 51 and a conductive member 131. A third adhesive 133 surrounding the periphery of a connection part formed by the bump 51 and the conductive member 131 is provided as an underfill material between the second semiconductor chip 44 and the wiring board 41.

As the third adhesive 133, a thermosetting or thermoplastic insulating resin adhesive may be used. More specifically, as the third adhesive 133, epoxy group resin, polyimide resin, acrylic group resin, or silicon group resin may be used.

Furthermore, while the third adhesive 133 may be made of the same material as that of the first adhesive 43 or the second adhesive 45, the third adhesive 43 may be made of a material different from that of the first adhesive 43 or the second adhesive 45 when considering easing of stress or resistance to moisture.

In this embodiment, the structures shown in FIG. 6 through FIG. 14 can be applied to the sealing resin 52.

Fourth Embodiment

FIG. 17 shows a semiconductor device of a fourth embodiment of the present invention. In FIG. 17, parts that are the same as the parts shown in FIG. 5 are given the same reference numerals, and explanation thereof is omitted.

In a semiconductor device 140 of the fourth embodiment of the present invention, the sealing resin 52 is provided between the electrode pad 48 of the second semiconductor chip 44 and the second bonding pad 47-2 of the wiring board 41. The sealing resin 52 also surrounds the connection part formed by the bump 51 and the conductive member 131 and is provided as the underfill material between the second semiconductor chip 44 and the wiring board 41.

In other words, the sealing resin 52 covers not only the side surface of the first semiconductor chip 42, the first bonding pad 47-1, the bonding wire 50, the electrode pad 48, the exposed surfaces of the second semiconductor chip 44 and the second adhesive, and the upper surface of the second semiconductor chip 44 on the main surface of the wiring board but also around the connection part formed by the bump 51 and the conductive member 131. In other words, the sealing resin 52 is provided as the underfill material between the second semiconductor chip 44 and the wiring board 41.

Accordingly, it is possible to reduce the number of elements forming the semiconductor device 140 so that manufacturing cost of the semiconductor device 140 can be reduced.

In this embodiment, the structures shown in FIG. 6 through FIG. 14 can be applied to the sealing resin 52.

Next, structures of first through sixth applied examples of the semiconductor device of the present invention are discussed with reference to drawings.

Figure 18:
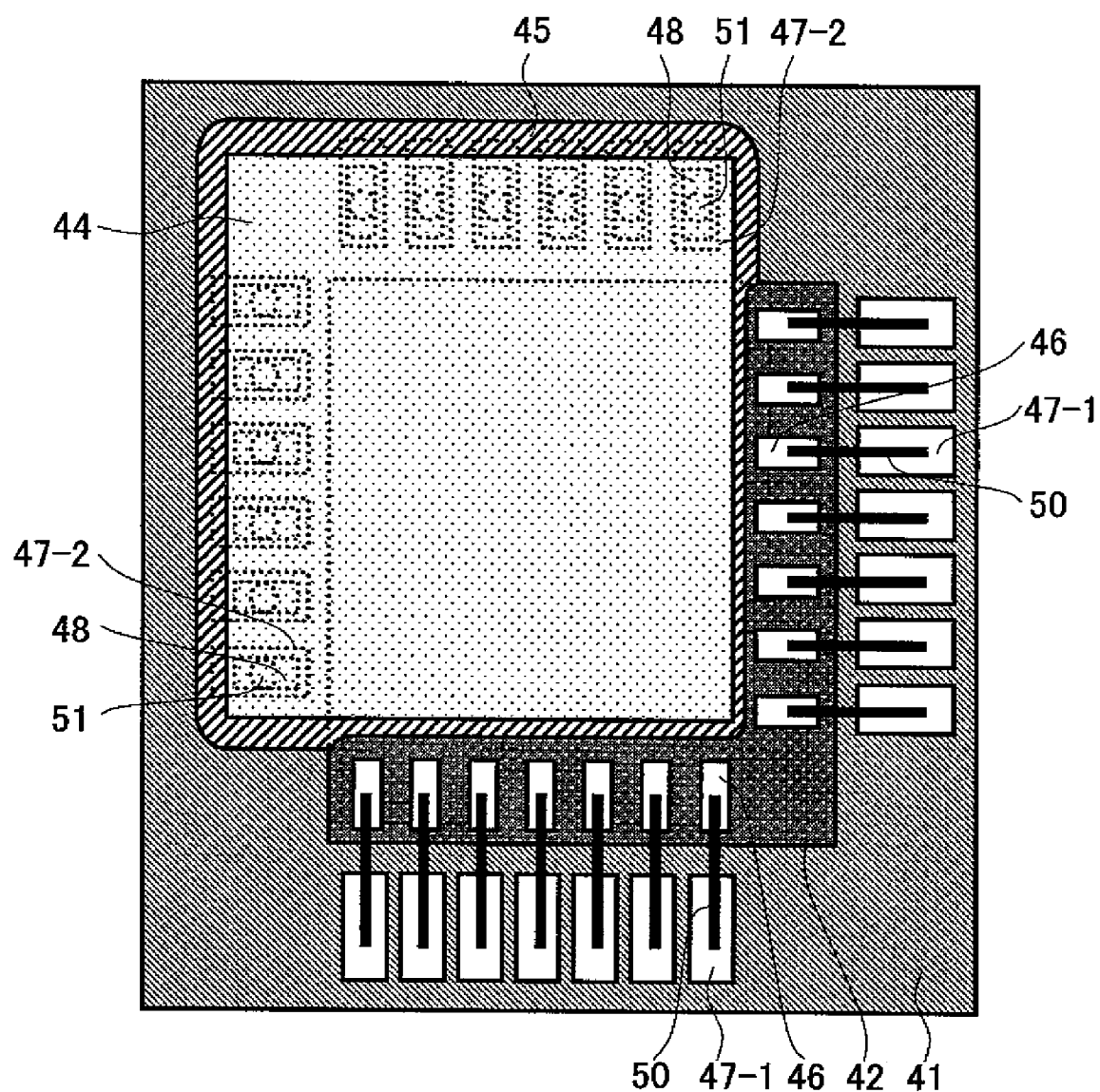
FIG. 18 is a plan view showing a structure of a first applied example of the semiconductor device of the present invention.
Figure 19:
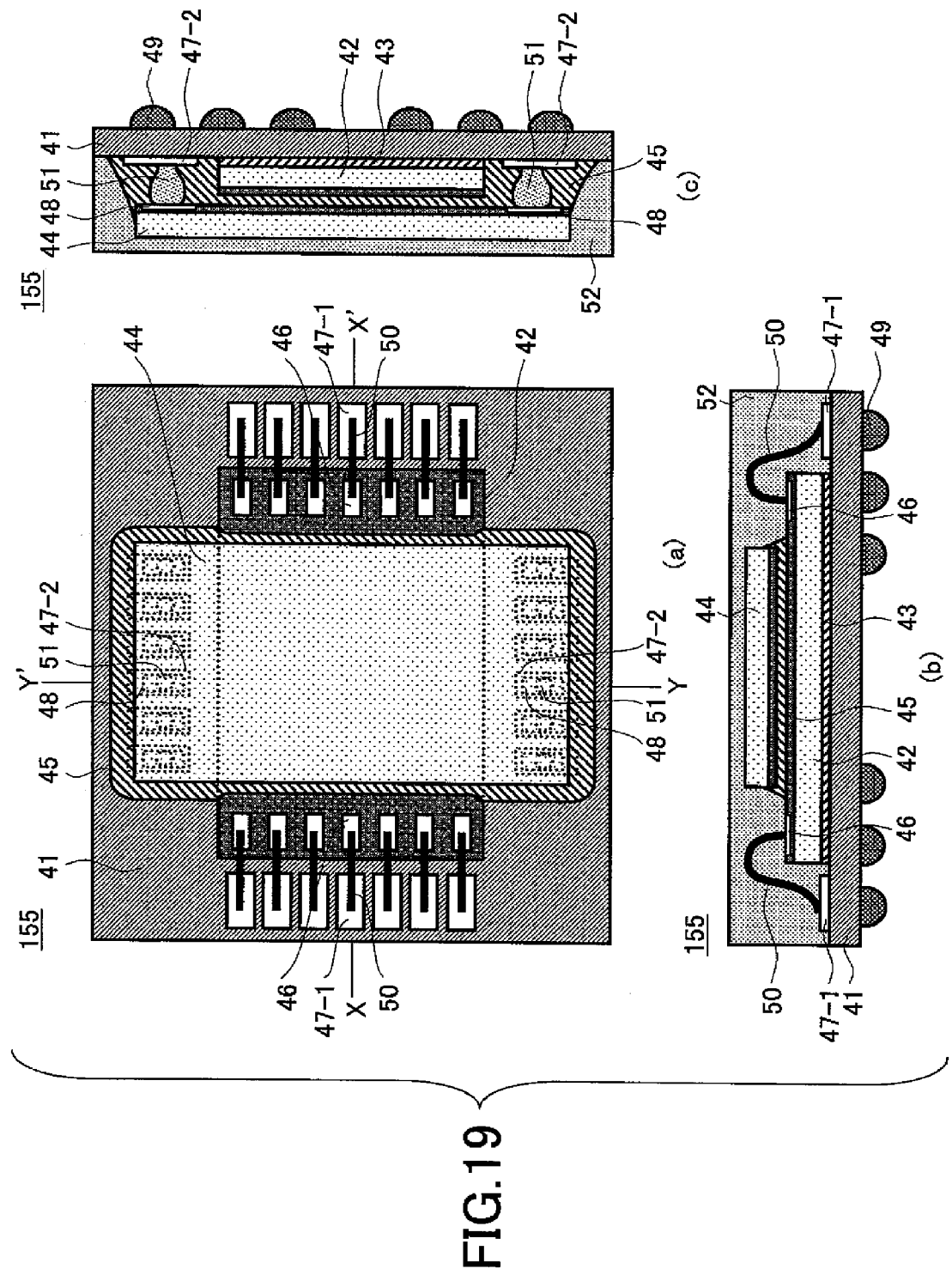
FIG. 19 is a plan view and cross-sectional views of a structure of a second applied example of the semiconductor device of the present invention.

FIG. 18 shows position mutual relationship in a horizontal direction, namely in a direction parallel with the main surface of the wiring board, of the first semiconductor chip mounted on the wiring board and the second semiconductor chip stacked on the first semiconductor chip in the applied example 1. FIG. 19 shows position mutual relationship in a horizontal direction, namely in a direction parallel with the main surface of the wiring board, of the first semiconductor chip mounted on the wiring board and the second semiconductor chip stacked on the first semiconductor chip in the applied example 2.

Applied Example 1

In the semiconductor devices shown in FIG. 5 through FIG. 13 and FIG. 15 through FIG. 17, the second semiconductor chip 44 is shifted against the first semiconductor chip 42 along two facing sides of the external periphery of the main surface of the first semiconductor chip 42.

However, the mounting way of the second semiconductor is not limited to this. An applied example 1, namely a semiconductor device 150 where the second semiconductor chip 44 is mounted so as to be shifted along a diagonal line direction on the main surface of the first semiconductor chip 42, namely an inclination direction, is shown in FIG. 18. In FIG. 18, parts that are the same as the parts shown in FIG. 5 are given the same reference numerals, and explanation thereof is omitted.

In the semiconductor device 150, the first semiconductor chip 42 is mounted on the main surface of the wiring board 41 having a rectangular shaped configuration so as to be shifted to and close to a corner part (a lower right corner part in the example shown in FIG. 18).

On the first semiconductor chip 42, the second semiconductor chip 44 is mounted by a flip chip method so as to be shifted along a diagonal line direction of the main surface of the first semiconductor chip 42 in a corner direction (upper left corner in the example shown in FIG. 18).

Thus, two semiconductor chips are stacked and shifted relative to each other in the diagonal direction and thereby plural electrode pads can be provided on the second semiconductor chips in an L-shape along two sides not facing to each other. Arrangement of the electrode pads in the L-shape along the selected two sides in the semiconductor chips can be realized by the redistribution way discussed with reference to FIG. 14.

On the other hand, the bonding pads 47-1 and 47-2 provided on the wiring board 41 are arranged in substantially an L-shape so as to correspond to the arrangement of the electrode pads of the first semiconductor chip 42 and the second semiconductor chip 44. As a result of this, these bonding pads 47-1 and 47-2 are provided along two sides of the wiring board 41.

The electrode pads 46 of the first semiconductor chip 42 and the first bonding pads 47-1 of the wiring board 41 are connected to each other by the bonding wires 50. The electrode pads 48 of the second semiconductor chip 44 and the second bonding pads 47-2 of the wiring board 41 are connected by the bumps 51.

Thus, two semiconductor chips are stacked and shifted relative to each other in the diagonal direction on the wiring board 41 and thereby plural electrode pads can be provided on the second semiconductor chips in an L-shape along two sides not facing each other. Therefore, compared to the structure shown in FIG. 5, design freedom degree of arrangement of the electrode pads is improved so that the freedom degree of design of the electronic circuit of the semiconductor chip is improved.

The L-shaped arrangement of the electrode pads may be required in a case where the size of the wiring board 41 or the number of the electrode pads cannot be decreased. In this case, arrangement of the bonding pads on the wiring board 41 is set and the arrangement of the electrode pads of the semiconductor chips is set so as to correspond to the arrangement of the bonding pads. In this case, the L-shaped arrangement of the electrode pads along the selected two sides of the semiconductor chips can be realized by the redistribution method shown in FIG. 14.

In this example, the structures shown in FIG. 6 through FIG. 17 can be applied.

In this applied example and following applied examples, the first semiconductor chip 42 and the second semiconductor chip 44 may be the same kind of semiconductor elements, for example, a storage element such as a flash memory or a DRAM (Dynamic Random Access Memory). Furthermore, the first semiconductor chip 42 and the second semiconductor chip 44 may be different kinds of semiconductor elements such that one is a storage element such as a flash memory and the other one is a logical circuit element such as a microprocessor. Selection or combination of such semiconductor elements is determined corresponding to an electronic device where these semiconductor elements are applied.

Applied Example 2

An applied example 2, namely a semiconductor device 155 where the second semiconductor chip 44 is mounted on the first semiconductor chip 42 so as to cross with the first semiconductor chip 42, is shown in FIG. 19. In FIG. 19(a) that is a plan view, illustration of sealing resin is omitted. FIG. 19(b) is a cross-sectional view taken along a line X-X' of FIG. 19(a). FIG. 19(c) is a cross-sectional view taken along a line Y-Y' of FIG. 19(a). In FIG. 19r parts that are the same as the parts shown in FIG. 5 are given the same reference numerals, and explanation thereof is omitted.

In the semiconductor device 155, the first semiconductor chip 42 is mounted on the substantially center part of the main surface of the wiring board 41 having a rectangular shaped configuration. Plural electrode pads 46 are provided in the vicinities of selected both end parts (both end parts in a longitudinal direction in most cases) of the first semiconductor chip 42.

The second semiconductor chip 44 is mounted on the first semiconductor chip 42 by a flip chip method so as to cross first semiconductor chip 42. Both end parts of the second semiconductor chip 44 are provided outside the first semiconductor chip 42 but do not face the first semiconductor chip 42. Plural electrode pads 48 are provided at both end parts.

Thus, by stacking two semiconductor chips 42 and 44 so that the semiconductor chips 42 and 44 cross, it is possible to provide plural electrode pads along two sides not facing each other in the semiconductor chips.

Accordingly, the bonding pads 47-1 and 47-2 arranged on the wiring board 41 are provided so as to correspond to the electrode pads of the semiconductor chips 42 and 44. As a result of this, these bonding pads are provided along two sides facing each other of the wiring board 41.

The electrode pads 46 of the first semiconductor chip 42 and the first bonding pads 47-1 of the wiring board 41 are connected to each other by the bonding wires 50. The electrode pads 48 of the second semiconductor chip 44 and the second bonding pads 47-2 of the wiring board 41 are connected by the bumps 51.

In this example, the structures shown in FIG. 6 through FIG. 17 can be applied.

In the meantime, in the above-discussed two applied examples, a single semiconductor chip is applied as each of the first semiconductor chip 42 and the second semiconductor chip 44. However, the present invention is not limited to these structures.

As discussed below, the present invention can be applied to a case where plural semiconductor chips are applied to either the first semiconductor chip mounted on the wiring board 41 or the second semiconductor chip mounted on the first semiconductor chip by the flip chip method or both the first semiconductor chip mounted on the wiring board 41 and the second semiconductor chip mounted on the first semiconductor chip by the flip chip method.

Applied Example 3

Figure 20:
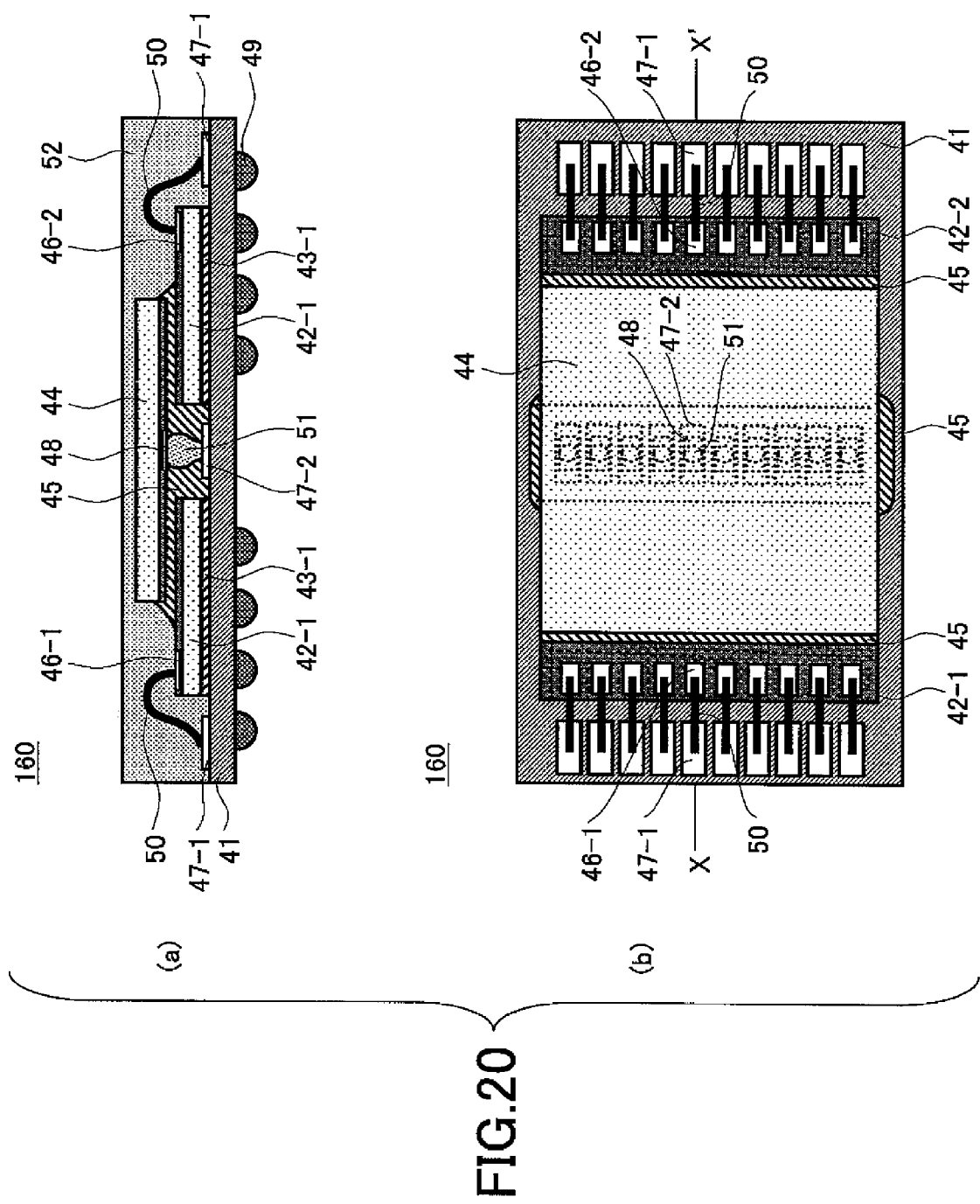
FIG. 20 is a cross-sectional view and a plan view of a structure of a third applied example of the semiconductor device of the present invention.

An applied example 3, namely a semiconductor device 155 where two first semiconductor chips 160 are provided on the wiring board 41, is shown in FIG. 20. In FIG. 20(b) that is a plan view, illustration of sealing resin is omitted. FIG. 20(a) is a cross-sectional view taken along a line X-X' of FIG. 20(b). In FIG. 20, parts that are the same as the parts shown in FIG. 5 are given the same reference numerals, and explanation thereof is omitted.

In the semiconductor device 160, first semiconductor chips 42-1 and 42-2 are provided on the main surface of the wiring board 41 having a rectangular shape so as to be close to each other on the wiring board 41. Plural electrode pads are provided in the vicinities of the selected end parts of the first semiconductor chips 42-1 and 42-2, namely end parts of a furthest side from the other semiconductor chip.

The first semiconductor chips 42-1 and 42-2 are separated from each other. A single second semiconductor chip 44 is mounted on parts of the first semiconductor chips 42-1 and 42-2 by a flip chip method.

Plural electrode pads 48 are provided in the center of the second semiconductor chip 44 in a line. The electrode pads 48 are positioned between the first semiconductor chips 42-1 and 42-2.

Therefore, the bonding pads 47-1 provided on the wiring board 41 are arranged so as to correspond to the arrangement of the electrode pads 46 of the first semiconductor chips 42-1 and 42-2. As a result of this, these bonding pads are provided along two sides facing each other of the wiring board 41.

On the other hand, the bonding pads 47-2 are provided between the semiconductor chip 42-1 and 42-2.

The electrode pads 46-1 of the first semiconductor chip 42-1 and the electrode pads 46-2 of the second semiconductor chip 42-2 and the bonding pads 47-1 of the wiring board 41 are connected to each other by the bonding wires 50. The electrode pads 48 of the second semiconductor chip 44 and the second bonding pads 47-2 of the wiring board 41 are connected by the bumps 51.

Plural electrode pads 48 are provided in the center of the second semiconductor chip 44 in a line state. Therefore, by using at least one of the electrode pads 48 as a power supply terminal, it is possible to achieve uniformity of power supply of the second semiconductor chip 44 and prevent voltage drop (IR drop). Because of this, it is possible to operate the semiconductor chip 44 stably.

In addition, in the manufacturing of the semiconductor device 160, since the first semiconductor chips 42-1 and 42-2 normally have the same thickness, it is possible to mount and arrange the second semiconductor chip 44 without making the second semiconductor chip 44 inclined and therefore degradation of the yield rate of the semiconductor device 160 is prevented.

In this example, the structures shown in FIG. 6 through FIG. 17 can be applied.

Thus, in a case where three or more semiconductor chips are mounted on the wiring board, the first semiconductor chip 42 and the second semiconductor chip 44 may be the same kind of semiconductor element, for example, a storage element such as a flash memory or a DRAM (Dynamic Random Access Memory), and thereby a semiconductor device having a large storage capacity can be formed.

Furthermore, the first semiconductor chip 42 and the second semiconductor chip 44 may be different kinds of semiconductor elements such that one is a storage element such as flash memory and the other one is a logical circuit element such as a microprocessor or an analog element. Combinations of these elements can be mounted so as to form a system. Selection or combination of such the semiconductor element is determined corresponding to an electronic device where these semiconductor elements are applied.

Applied Example 4

Figure 21:
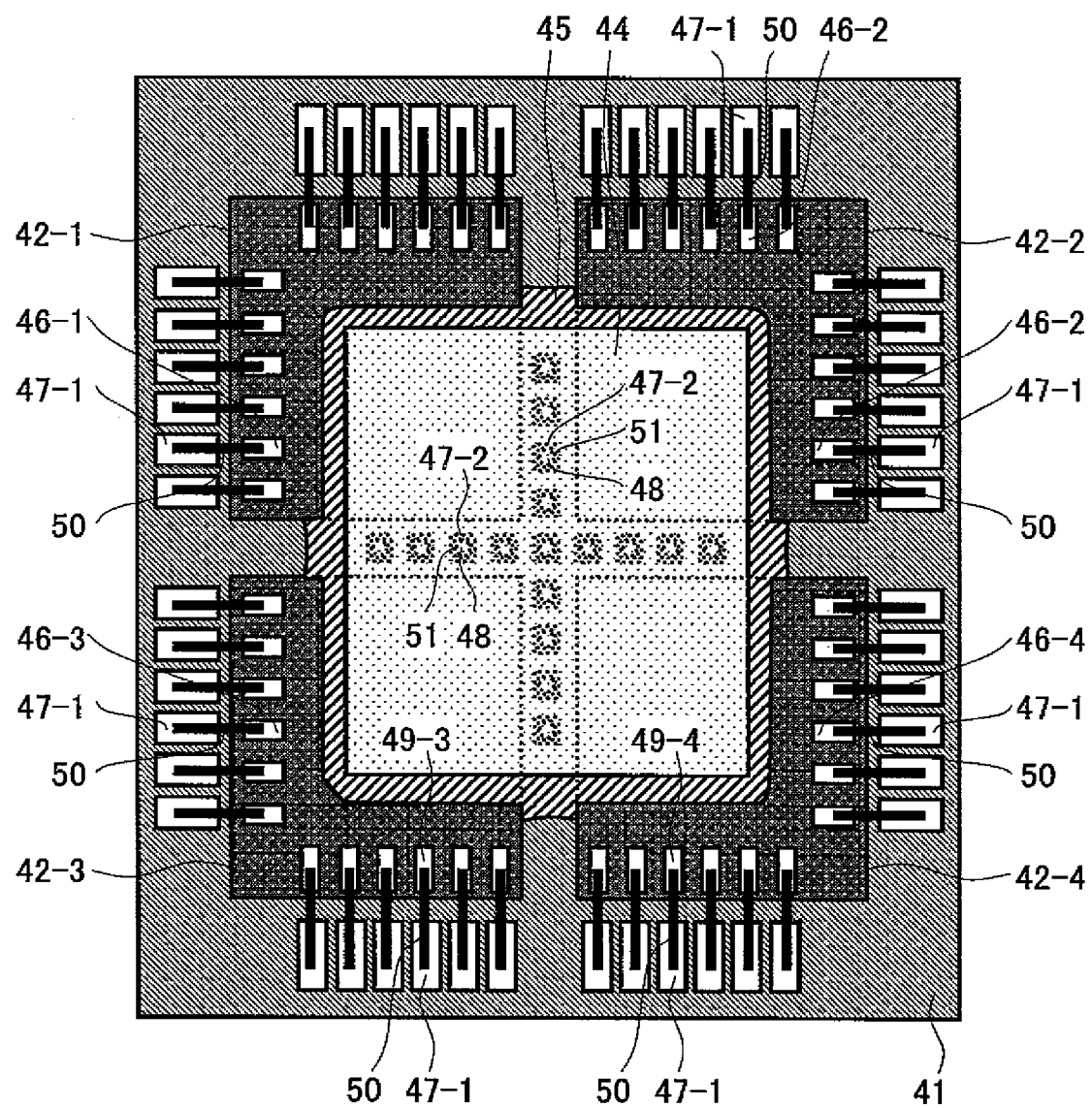
FIG. 21 is a plan view showing a structure of a fourth applied example of the semiconductor device of the present invention.

An applied example 4, namely a semiconductor device 165 where four first semiconductor chips 165 are provided on the wiring board 41, is shown in FIG. 21. In FIG. 21(*a*) is a plan view and illustration of sealing resin is omitted. In FIG. 21, parts that are the same as the parts shown in FIG. 5 are given the same reference numerals, and explanation thereof is omitted.

In the semiconductor device 165, first semiconductor chips 42-1, 42-2, 42-3, and 42-4 are provided on the main surface of the wiring board 41 each having a rectangular shaped configuration so as to be separated from each other and close to the corresponding one of four corners of the wiring board 41.

A single second semiconductor chip 44 is mounted on the first semiconductor chips 42 by a flip chip method so as to be positioned in the substantially center part of the arrangement of the first semiconductor chips 42.

Thus, by stacking and positioning the second semiconductor chip 44 in the center of arrangement of four first semiconductor chips 42, plural electrode pads 46 of the first semiconductor chips 42 can be arranged in an L-shape along two sides not facing the second semiconductor chip 44.

Arrangement of the electrode pads 46 in the L-shape along the selected two sides in the first semiconductor chips can be realized by the redistribution way discussed with reference to FIG. 14.

Plural electrode pads 48 are provided in crossing lines state in the center part of the second semiconductor chip 44 so as to correspond to gaps between four first semiconductor chips 42. The electrode pads 48 are positioned in the gap of the four first semiconductor chips 42.

On the other hand, the bonding pads 47-1 and 47-2 provided on the wiring board 41 are arranged in a substantially L-shape so as to correspond to the arrangement of the electrode pads 46 of the four first semiconductor chips 42. As a result of this, these bonding pads 47-1 are provided along four sides of the wiring board 41.

The bonding pads 47-2 provided on the wiring board 41 are arranged in the gaps formed by four first semiconductor chips 42 and the arrangement of the bonding pads 47-2 has crossing shaped configuration.

The electrode pads 46 of four first semiconductor chips 42 and the bonding pads 47-1 of the wiring board 41 are connected to each other by the bonding wires 50. The electrode pads 48 of the second semiconductor chip 44 and the second bonding pads 47-2 of the wiring board 41 are connected by the bumps 51.

Thus, in this example, plural first semiconductor chips 42 are provided so as to be separated from each other and the second semiconductor chip 44 is mounted on the first semiconductor chips 42, and thereby plural electrode pads can be provided on the first semiconductor chips 42 in an L-shape along two sides not facing each other.

Therefore, compared to the structure shown in FIG. 5, design freedom degree of arrangement of the electrode pads is improved so that the design of the electronic circuit of the semiconductor chips can be improved.

The L-shaped arrangement of the electrode pads may be required in a case where the size of the wiring board 41 or the number of the electrode pads cannot be decreased. In this case, the arrangement of the bonding pads on the wiring board 41 is set and the arrangement of the electrode pads of the semiconductor chips is set so as to correspond to the arrangement of the bonding pads. In this case, the L-shaped arrangement of the electrode pads along the selected two sides of the semiconductor chips can be realized by the redistribution method shown in FIG. 14.

Plural electrode pads 48 are provided in the center of the second semiconductor chip 44 in crossing lines. Therefore, by using at least one of the electrode pads 48 as a power supply terminal, it is possible to achieve uniformity of power supply of the second semiconductor chip 44 and prevent voltage drop (IR drop). Because of this, it is possible to operate the semiconductor chip 44 stably.

In addition, in the manufacturing of the semiconductor device 165, since the first semiconductor chips 42 normally have the same thickness, it is possible to mount and arrange the second semiconductor chip 44 without making the second semiconductor chip 44 be inclined and therefore degradation of the yield rate of the semiconductor device 165 is prevented.

Thus, in the semiconductor device 165, compared to the examples shown in FIG. 5 and FIG. 20, it is possible to increase the number of the semiconductor elements so that higher integration of the semiconductor device can be realized.

In this example, the structures shown in FIG. 6 through FIG. 17 can be applied.

Applied Example 5

Figure 22:
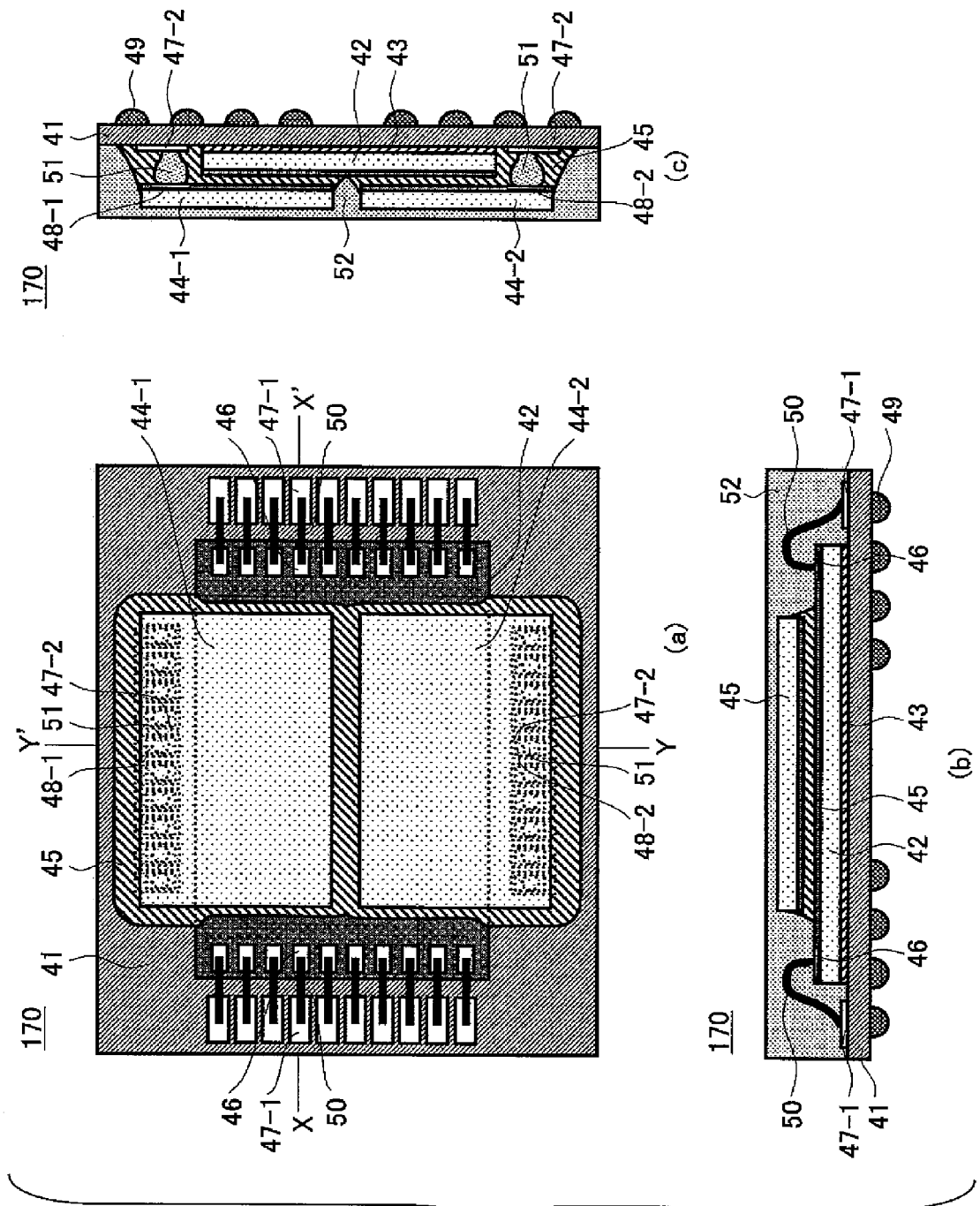
FIG. 22 is a plan view and cross-sectional views of a structure of a fifth applied example of the semiconductor device of the present invention.

An applied example 5, namely a semiconductor device 170 where two second semiconductor chips are mounted on a single first semiconductor chip mounted on the wiring board 41, is shown in FIG. 22. In FIG. 22(*a*) that is a plan view, illustration of sealing resin is omitted. FIG. 22(*b*) is a cross-sectional view taken along a line X-X' of FIG. 22(*a*). FIG. 22(*c*) is a cross-sectional view taken along a line Y-Y' of FIG. 22(*a*). In FIG. 22, parts that are the same as the parts shown in FIG. 5 are given the same reference numerals, and explanation thereof is omitted.

In the semiconductor device 170, the first semiconductor chip 42 is mounted on the substantially center part of the main surface of the wiring board 41 having a rectangular shaped configuration. On selected both end parts (both end parts in a longitudinal direction in most cases) of the first semiconductor chip 42, plural electrode pads 46 are provided.

Two second semiconductor chips 44-1 and 44-2 are mounted on the first semiconductor chip 42 by a flip chip method. The second semiconductor chips 44-1 and 44-2 are separated from each other and are arranged in a direction crossing the longitudinal direction of the first semiconductor chip 42. Parts of two second semiconductor chips 44-1 and 44-2 are stacked on the first semiconductor chip 42 and plural electrode pads 48 are provided in the vicinities of end parts not facing the electrode pads 46 of the first semiconductor chip 42.

Thus, in this example, the second semiconductor chips 44-1 and 44-2 are stacked on the first semiconductor chip 42 and second semiconductor chips 44-1 and 44-2 and the first semiconductor chip 42 cross. Therefore, in these three semiconductor chips, plural electrode pads can be provided along two sides not facing each other.

Accordingly, the bonding pads 47-1 and 47-2 provided on the wiring board 41 are arranged so as to correspond to the electrode pads of the semiconductor chips 42 and 44. As a result of this, these bonding pads are provided along two sides not facing each other of the wiring board 41.

The electrode pads 46 of four first semiconductor chips 42 and the bonding pads 47-1 of the wiring board 41 are connected to each other by the bonding wires 50. The electrode pads 48 of the second semiconductor chips 44-1 and 44-2 and the second bonding pads 47-2 of the wiring board 41 are connected by the bumps 51.

Thus, in the semiconductor device 170 of this applied example, it is possible to mount plural semiconductor elements and higher integration and higher functionalities can be achieved compared to the example shown in FIG. 5.

In this example, the structures shown in FIG. 6 through FIG. 17 can be applied.

Applied Example 6

Figure 23:
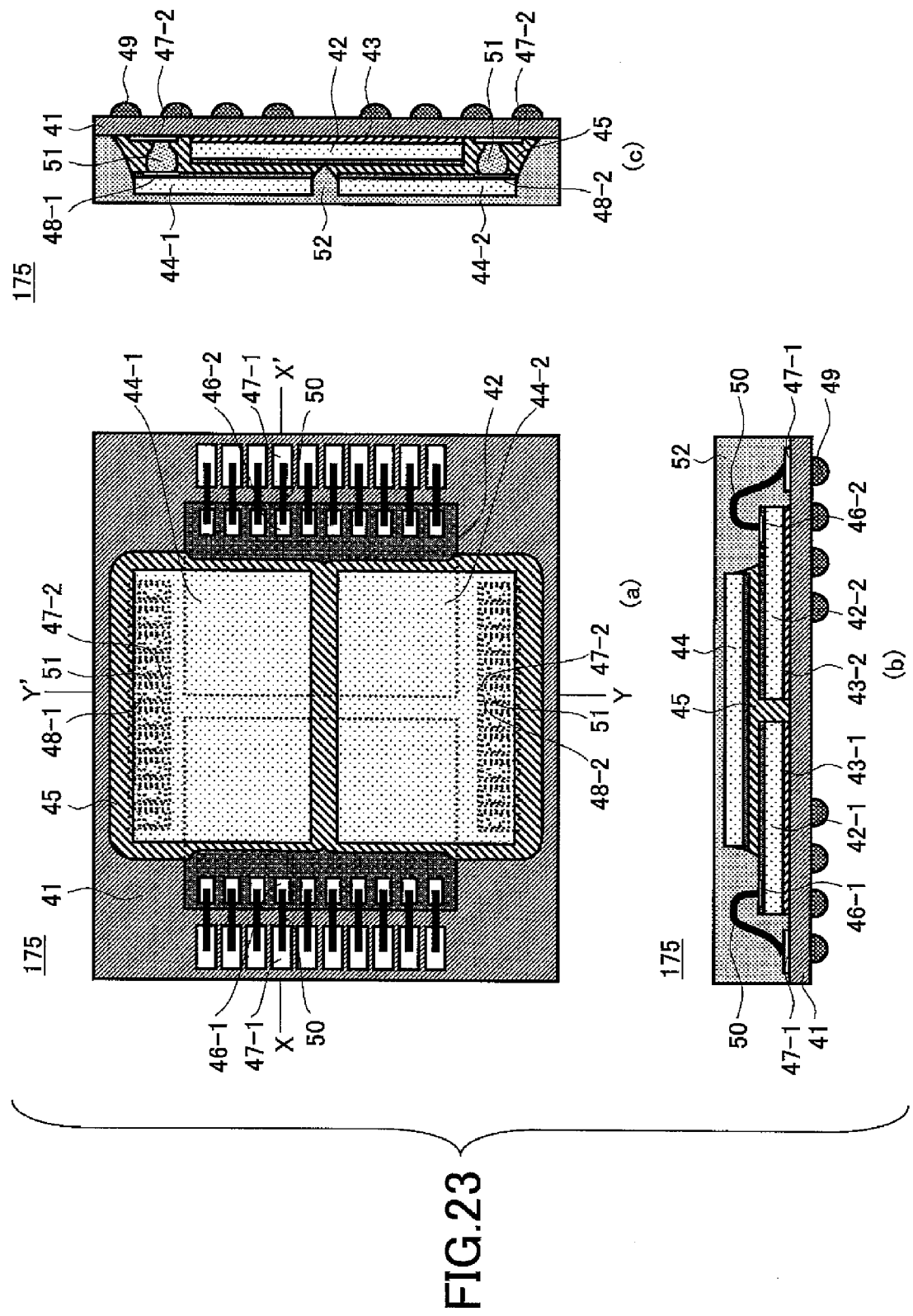
FIG. 23 is a plan view and cross-sectional views of a structure of a sixth applied example of the semiconductor device of the present invention.

An applied example 6, namely a semiconductor device 175 where two second semiconductor chips are mounted on two first semiconductor chips mounted on the wiring board 41, is shown in FIG. 23. In FIG. 23(*a*) that is a plan view, illustration of sealing resin is omitted. FIG. 23(*b*) is a cross-sectional view taken along a line X-X' of FIG. 23(*a*). FIG. 23(*c*) is a cross-sectional view taken along a line Y-Y' of FIG. 23(*a*). In FIG. 23, parts that are the same as the parts shown in FIG. 5 are given the same reference numerals, and explanation thereof is omitted.

In the semiconductor device 175, two first semiconductor chips 42-1 and 42-2 are mounted on the main surface of the wiring board 41 having a rectangular shaped configuration so as to close to sides of the wiring board 41 facing each other. Plural electrode pads are provided in the vicinities of the selected end parts of the first semiconductor chips 42-1 and 42-2, namely end parts of a furthest side from other semiconductor chips.

Two second semiconductor chips 44-1 and 44-2 are mounted on the first semiconductor chips 42-1 and 42-2 by a flip chip method. The second semiconductor chips 44-1 and 44-2 are separated from each other and are arranged in a direction crossing an arrangement direction of the first semiconductor chips 42. Parts of two second semiconductor chips 44-1 and 44-2 are stacked on the first semiconductor chips 42-1 and 42-2 and plural electrode pads 48 are provided in the vicinities of end parts not facing the electrode pads 46 of the first semiconductor chips 42.

Thus, in this example, the second semiconductor chips 44-1 and 44-2 are stacked on the first semiconductor chips 42-1 and 42-2 and second semiconductor chips 44-1 and 44-2 and the first semiconductor chips 42-1 and 42-2 cross. Therefore, in these four semiconductor chips, plural electrode pads can be provided along two sides not facing each other.

Accordingly, the bonding pads 47-1 and 47-2 provided on the wiring board 41 are arranged so as to correspond to the electrode pads of the semiconductor chips 42 and 44. As a result of this, these bonding pads are provided along two sides not facing each other of the wiring board 41.

The electrode pads 46 of four first semiconductor chips 42-1 and 42-2 and the bonding pads 47-1 of the wiring board 41 are connected to each other by the bonding wires 50. The electrode pads 48 of the second semiconductor chips 44-1 and 44-2 and the second bonding pads 47-2 of the wiring board 41 are connected by the bumps 51.

Thus, in the semiconductor device 175 of this applied example, the number of the semiconductor elements to be mounted is larger and higher integration and higher functionalities can be achieved compared to the examples shown in FIG. 5 and FIG. 22.

In addition, since the first semiconductor chips 42-1 and 42-2 have the same thickness (length in a vertical direction), it is possible to mount and arrange the second semiconductor chips 44-1 and 44-2 on the first semiconductor chips 42-1 and 42-2 without making the second semiconductor chips 44 be inclined and therefore degradation of the yield rate of the semiconductor device 175 is prevented.

In this example, the structures shown in FIG. 6 through FIG. 17 can be applied.

Next, other structures of semiconductor devices of the present invention where plural semiconductor chips are stacked are discussed as applied example 7 through applied example 11.

FIG. 24 through FIG. 28 are cross-sectional views of semiconductor devices of seventh through eleventh applied examples of the present invention and show cross sections of directions perpendicular to the main surfaces of the wiring boards, namely stacking directions of the first semiconductor chips mounted on the wiring board and the second semiconductor chips mounted on the first semiconductor chips.

Applied Example 7

Figure 24:
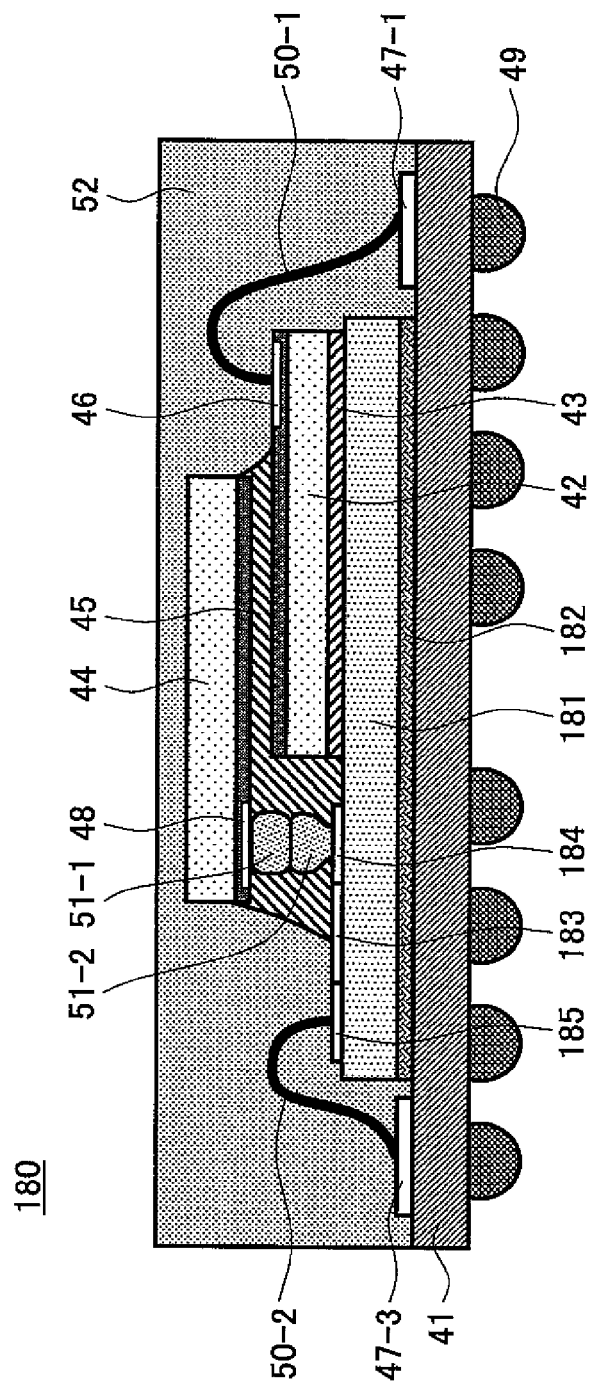
FIG. 24 is a cross-sectional view of a semiconductor device of a seventh applied example of the present invention.

An applied example 7, namely a semiconductor device 175 where the first semiconductor chip and the second semiconductor chip are mounted via a second wiring board, is shown in FIG. 24. In FIG. 24, parts that are the same as the parts shown in FIG. 5 are given the same reference numerals, and explanation thereof is omitted.

In the semiconductor device 180, a sub-wiring board 181 is mounted on and fixed to the main surface of the wiring board 41 having the rectangular shaped configuration via a fourth adhesive 182. A wiring layer 183 is provided inside or on the surface of the sub-wiring board 181.

The first semiconductor chip 42 is mounted on the main surface of the sub-wiring board 181 via the adhesive 43. In addition, the second semiconductor chip 44 is mounted on the first semiconductor chip 42 via the adhesive 45 by a flip chip method, namely in a facing down state.

The electrode pad 46 of the first semiconductor chip 42 and the bonding pad 47-1 of the wiring board 41 are connected to each other by the bonding wire 50-1.

On the other hand, the electrode pad 48 of the second semiconductor chip 44 is connected to the bonding pad 184 provided on the sub-wiring board 181 via two stacked bumps 51-1 and 51-2. The bonding pad 185 provided at the end part of the wiring layer 183 extending from the bonding pad 184 and the bonding pad 47-3 provided on the main surface of the wiring board 41 are connected to each other by the bonding wire 50-2.

Under this structure, the sub-wiring board 181 is made of, for example, glass-epoxy, glass-BT (bismaleimide-triazine), polyimide, ceramic, glass, or silicon (Si).

In addition, the wiring layer 183 provided on the surface of the sub-wiring board 181 and the bonding pads 184 and 185 are formed by, for example, copper (Cu) and nickel (Ni) and gold (Au) plating are applied on surfaces thereof.

These portions may be formed by aluminum (Al), copper (Cu), and an alloy including these metals in a case where the sub-wiring board 181 is made of silicon (Si).

Thus, the semiconductor chips 42 and 44, the bonding wires 50, the bumps 51, and the sub-wiring board 181, provided on the main surface of the wiring board 41 are sealed in a body by the sealing resin 52 so as to be protected from a mechanical external force, moisture, and the like.

Plural solder balls as outside connection terminals are provided on the rear surface of the wiring board 41.

Thus, in the semiconductor device 180 of this applied example, the sub-wiring board 181 functions as a redistribution board. Therefore, it is possible to improve the design freedom degree of arrangement of the bonding pads 47 provided on an upper surface of the wiring board 41.

In the case where the sub-wiring board 181 is made of silicon (Si), the wiring layer 183 or the bonding pad 184 can be formed by a so-called semiconductor wafer process. Therefore, it is possible to easily refine the bonding pad 184 so as to correspond to refine arrangement pitches of the electrode pads 48 of the second semiconductor chip 44. According to this example, it is possible to improve the design freedom degree of combination of the semiconductor chips having different sizes.

In this example, the structures shown in FIG. 6 through FIG. 8, FIG. 10 through FIG. 13, and FIG. 15 through FIG. 17, can be applied.

Applied Example 8

Figure 25:
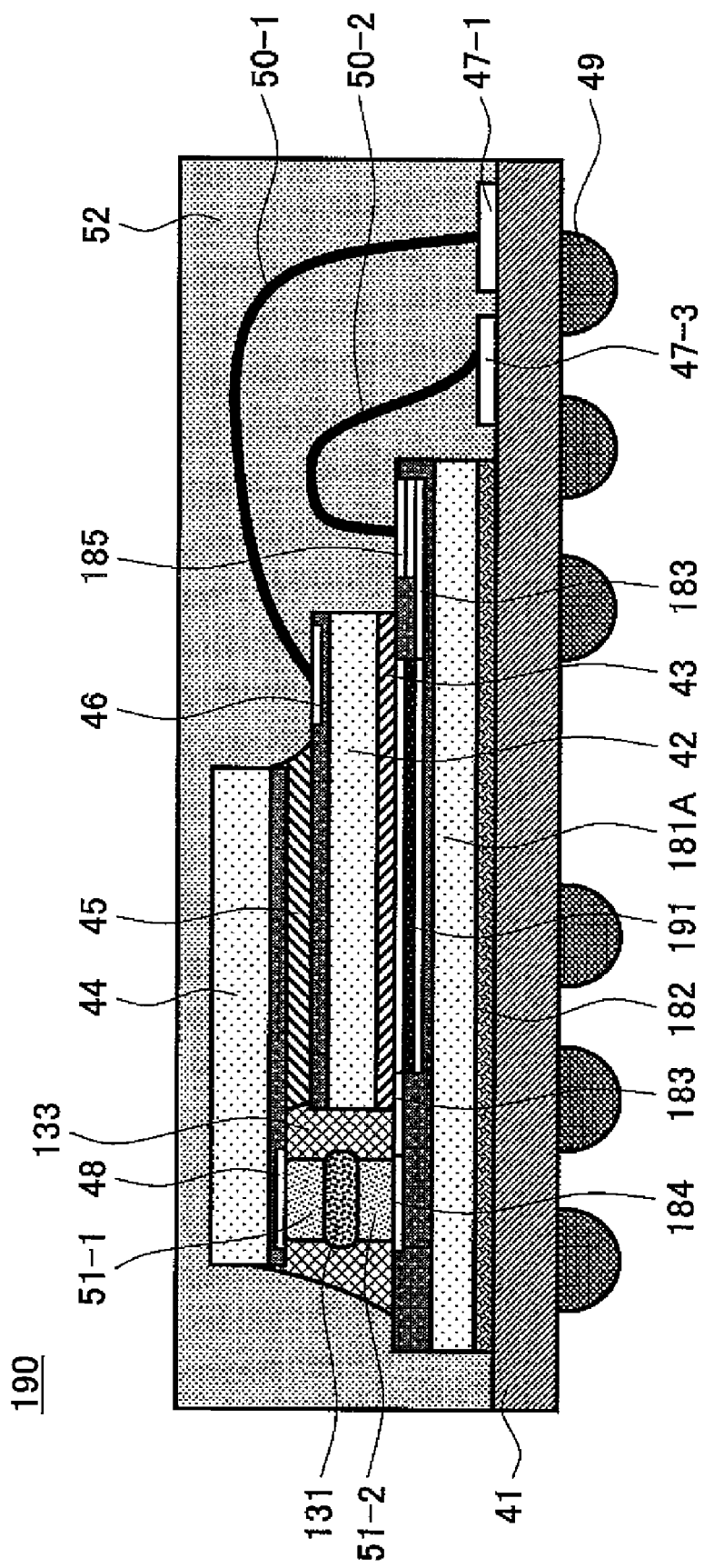
FIG. 25 is a cross-sectional view of a semiconductor device of an eighth applied example of the present invention.

An applied example 8, namely a semiconductor device 190 where the first semiconductor chip and the second semiconductor chip are mounted on the wiring board via a second wiring board, is shown in FIG. 25. In FIG. 25, parts that are the same as the parts shown in FIG. 5 are given the same reference numerals, and explanation thereof is omitted.

In the semiconductor device 190, a sub-wiring board 181A is mounted on and fixed to the main surface of the wiring board 41 having a rectangular shaped configuration via a fourth adhesive 182. A wiring layer 183 is provided on the surface of and/or inside the sub-wiring board 181A and, if necessary, a capacitance element or a passive element 191 such as an inductor is mounted on the sub-wiring board 181A.

Since the passive element 191 is situated close to the semiconductor chips 42 and 44, it is possible to improve the operations properties of the semiconductor chips and achieve stable operation. Bumps 51-1 and 51-2 for connecting the electrode pad 48 of the second semiconductor chip 44 and the bonding pad 184 on the sub-wiring board 181A are connected to each other by a conductive member 131. In addition, a third adhesive 133 is used as an underfill member so as to cover the peripheries of the bumps 51-1 and 51-2 and the conductive member 131.

In this example, the structures shown in FIG. 6 through FIG. 17 can be applied.

Applied Example 9

Figure 26:
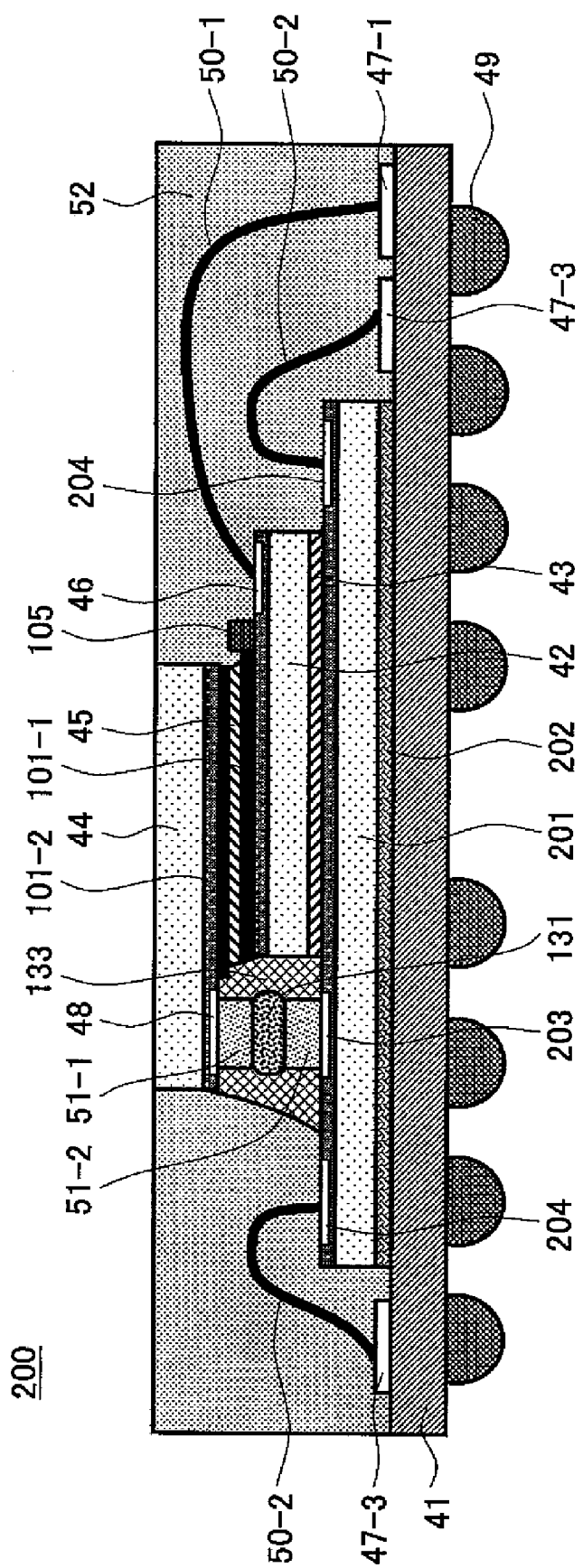
FIG. 26 is a cross-sectional view of a semiconductor device of a ninth applied example of the present invention.

An applied example 9, namely a semiconductor device 200 where the first semiconductor chip and the second semiconductor chip are mounted via a third semiconductor chip, is shown in FIG. 26. In FIG. 26, parts that are the same as the parts shown in FIG. 5 are given the same reference numerals, and explanation thereof is omitted.

In the semiconductor device 200, a semiconductor chip 201 instead of the sub-wiring board 181 or 181A is mounted on and fixed to the main surface of the wiring board 41 having a rectangular shaped configuration via a fourth adhesive 202. An electronic circuit is formed on the main surface of the semiconductor chip 201 as well as the semiconductor chips 42 and 44.

The first semiconductor chip 42 is mounted on the main surface of the semiconductor chip 201 via the adhesive 43. In addition, the second semiconductor chip 44 is mounted on the first semiconductor chip 42 via the adhesive 45 by a flip chip method (in a facing-down state).

The electrode pad 46 of the first semiconductor chip 42 and the bonding pad 47-1 of the wiring board 41 are connected to each other by the bonding wire 50-1. On the other hand, the electrode pad 48 of the second semiconductor chip 44 is connected to the bonding pad 203 provided on the semiconductor chip 201 by the stacked bumps 51-1 and 51-2 and the conductive member 131.

The bonding pad 204 connected to the wiring layer (not shown in FIG. 26) extending from the bonding pad 202 and the bonding pad 47-3 provided on the main surface of the wiring board 41 are connected to each other by the bonding wire 50-2.

Thus, in the semiconductor device 200 of this applied example, the semiconductor chip 201 functions as a redistribution board. Therefore, it is possible to improve the design freedom degree of arrangement of the bonding pads 47 provided on an upper surface of the wiring board 41. In addition, since functions of the semiconductor chip 201 are improved, higher functionalities and larger capacities of the semiconductor device 200 can be achieved.

In this example, the structures shown in FIG. 6 through FIG. 17 may be applied.

For example, the surface protection films 101-1 and 101-2 may be formed in the area where the electronic circuit forming surface of the first semiconductor chip 42 and the electronic circuit forming surface of the second semiconductor chip 44, on the electronic circuit forming surface of the first semiconductor chip 42 and the electronic circuit forming surface of the second semiconductor chip 44. In addition, the dam 105 may be provided on the electronic circuit forming surface of the first semiconductor chip 42.

The semiconductor chips 201, 42 and 44, the bonding wires 50, the bumps 51, and others, provided on the main surface of the wiring board 41 are sealed in a body by the sealing resin 52 so as to be protected from a mechanical external force, moisture, and the like. Plural solder balls 49 as outside connection terminals are provided on the rear surface of the wiring board 41.

Applied Example 10

Figure 27:
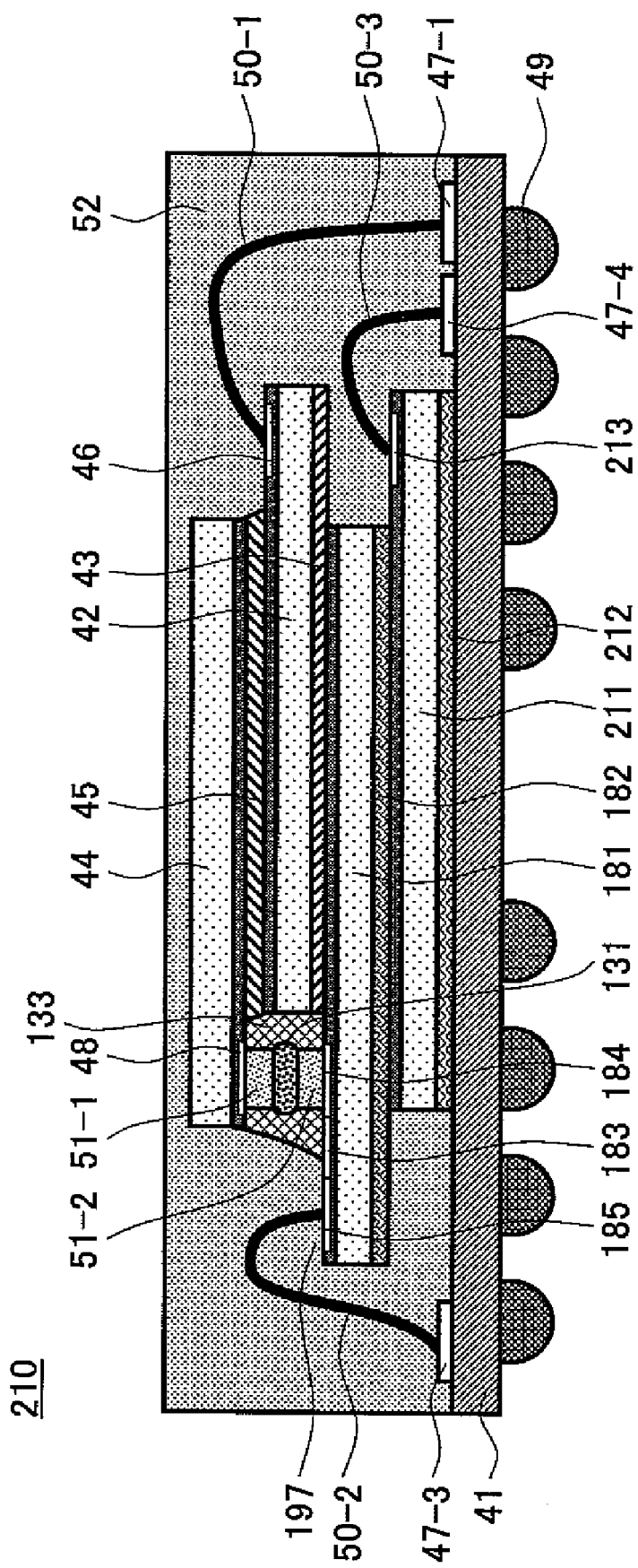
FIG. 27 is a cross-sectional view of a semiconductor device of a tenth applied example of the present invention.

An applied example 10, namely a semiconductor device 210 where the first semiconductor chip and the second semiconductor chip are mounted via a sub-wiring board and a third semiconductor chip, is shown in FIG. 27. In FIG. 27, parts that are the same as the parts shown in FIG. 5 are given the same reference numerals, and explanation thereof is omitted.

In the semiconductor device 210, a third semiconductor chip 211 is mounted on and fixed to the main surface of the wiring board 41 having a rectangular shaped configuration via a fourth adhesive 212. A sub-wiring board 181 is mounted on the semiconductor chip 211 via the third adhesive 182.

The electronic circuit is formed on the main surface of the semiconductor chip 211 as well as the semiconductor chips 42 and 44. The electrode pads 213 are provided on the surface part of the semiconductor chip 211.

Under this structure, the sub-wiring board 181 is stacked on the third semiconductor chip 211 so as to be shifted against the third semiconductor chip 211 along two sides facing to each other of the main surface of the third semiconductor chip 211 so that the entirety of the main surface of the third semiconductor chip 211 does not face the sub-wiring board 181.

Therefore, the electrode pads 213 of the third semiconductor chip 211 and the electrode pads 185 of the sub-wiring board 181 are positioned in a area where the electrode pads 213 and 185 do not face each other on the main surfaces of the third semiconductor chip 211 and the sub-wiring board 181.

The first semiconductor chip 42 is mounted on the main surface of the sub-wiring board 181 by the adhesive 43. The second semiconductor chip 44 is mounted on the first semiconductor chip 42 via the adhesive 45 by a flip chip method (in a facing down state).

Under this structure, the first semiconductor chip 42 is mounted on and fixed to the sub-wiring board 181, so as to overhang from a position of the sub-wiring board 181 in a horizontal direction, namely in a direction parallel with the main surface of the wiring board 42, and be provided over the third semiconductor chip 211. The electrode pads 46 are positioned in the vicinities of the overhanging area.

The electrode pad 46 of the first semiconductor chip 42 and the bonding pad 47-1 of the wiring board 41 are connected to each other by the bonding wire 50-1. On the other hand, the electrode pad 48 of the second semiconductor chip 44 is connected to the bonding pad 184 provided on the sub-wiring board 181 by the stacked bumps 51-1 and 51-2 and the conductive member 131.

The bonding pad 185 connected to the wiring layer 183 extending from the bonding pad 184 and the bonding pad 47-3 provided on the main surface of the wiring board 41 are connected to each other by the bonding wire 50-2. On the other hand, the electrode pad 213 of the third semiconductor chip 211 and the bonding pad 47-4 of the wiring board 41 are connected to each other by the bonding wire 50-3.

A part of the bonding wire 50-3 may be overlapped with a lower part of overhanging part of the first semiconductor chip 42.

The bumps 51-1 and 51-2 may be stacked between the electrode pad 48 of the second semiconductor chip 44 and the bonding pad 183 of the sub-wiring board 181 so as to connect the electrode pads 48 and 183.

The semiconductor chips 211, 42 and 44, the sub-wiring board 181, the bonding wires 50, the bumps 51, and others, provided on the main surface of the wiring board 41 are sealed in a body by the sealing resin 52 so as to be protected from a mechanical external force, moisture, and the like. Plural solder balls 49 as outside connection terminals are provided on the rear surface of the wiring board 41.

In this example, the sub-wiring board 181 forms a space between the first semiconductor chip 42 and the third semiconductor chip 215 so as to secure the arrangement area of the bonding wire 50-3. In other words, the sub-wiring board 181 provided between the first semiconductor chip 42 and the third semiconductor chip 211 is positioned so as not to overlap the electrode pads 213 of the semiconductor chip 211. In addition, the first semiconductor chip 42 is overlapped with the electrode pad 213 of the semiconductor chip 211 in a state where the first semiconductor chip 42 is separated from the semiconductor chip 211 with a designated length (height).

Therefore, the bonding wire 50-3 can connect the third semiconductor chip 211 and the sub-wiring board 181 without contacting the first semiconductor chip 42 positioned above the boding wire 50-3. Accordingly, it is possible to make the size of the semiconductor device 210 small.

In addition, the sub-wiring board 181 functions as a spacer. Therefore, even in a case where a position of the external configuration of the semiconductor element 211 is equivalent to the arrangement of the electrode pads of the first semiconductor elements, it is possible to stack the semiconductor element 211 and the first semiconductor element 42. Accordingly, it is possible to make the size of the semiconductor device 210 small.

In this example, the structures shown in FIG. 6 through FIG. 8, FIG. 10 through FIG. 13, and FIG. 15 through FIG. 17, can be applied.

Applied Example 11

Figure 28:
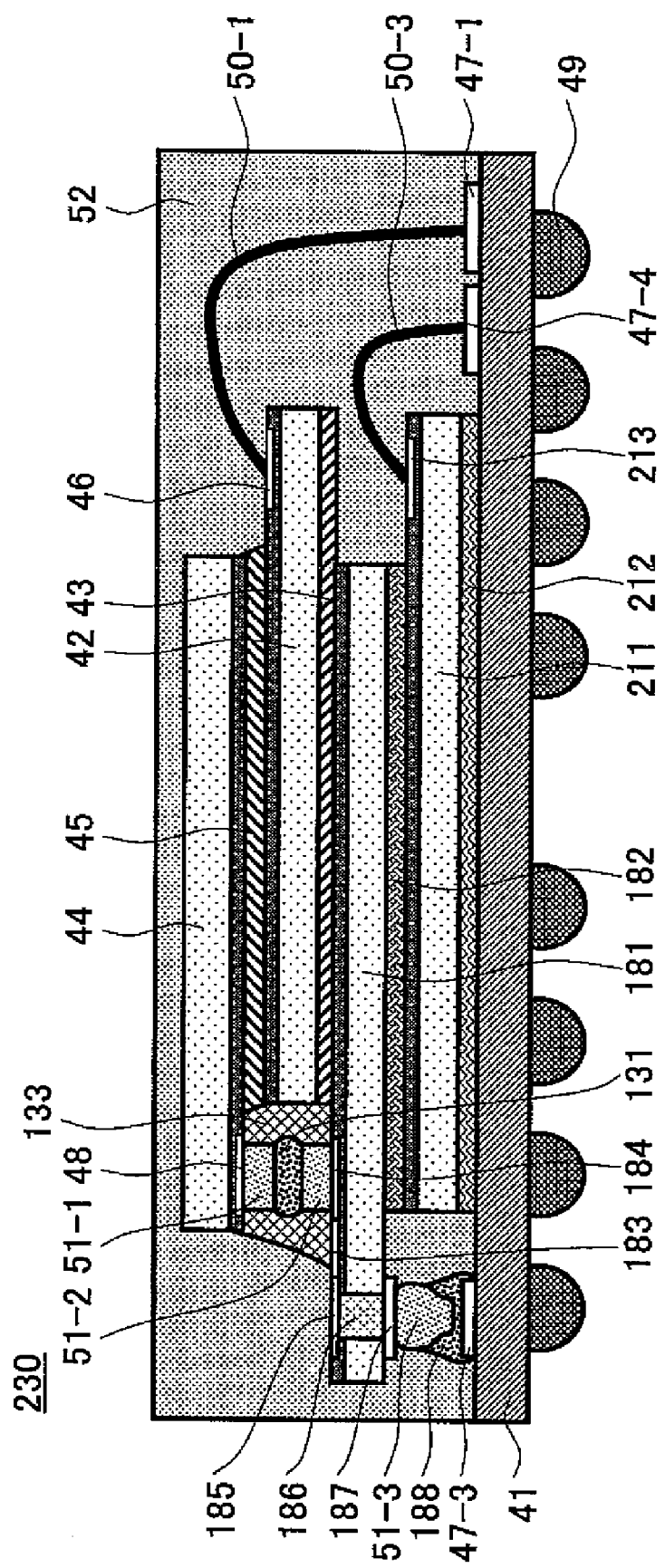
FIG. 28 is a cross-sectional view of a semiconductor device of an eleventh applied example of the present invention.
Figure 29:
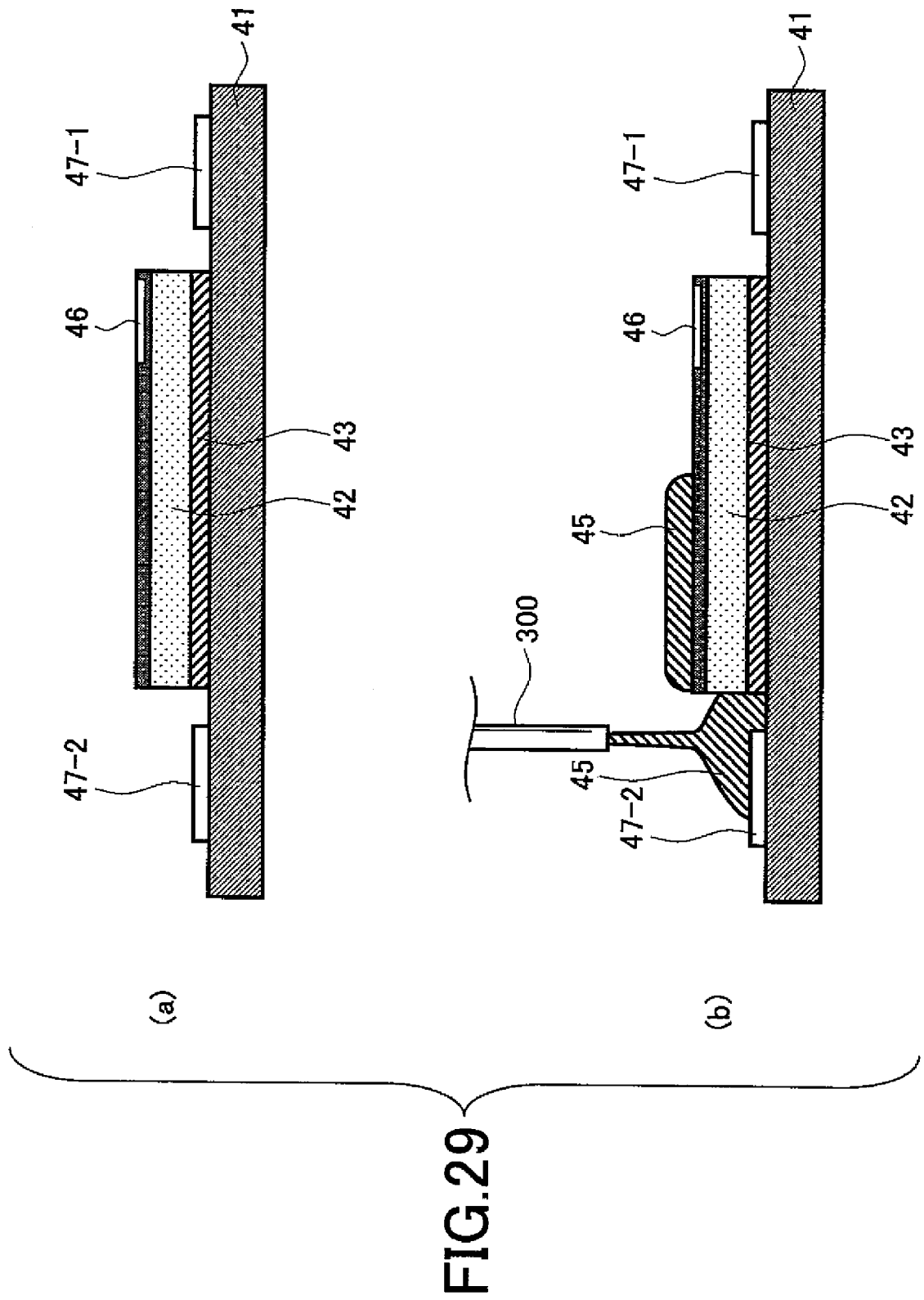
FIG. 29 is a first cross-sectional view showing a manufacturing method of the semiconductor device of the first embodiment of the present invention.
Figure 30:
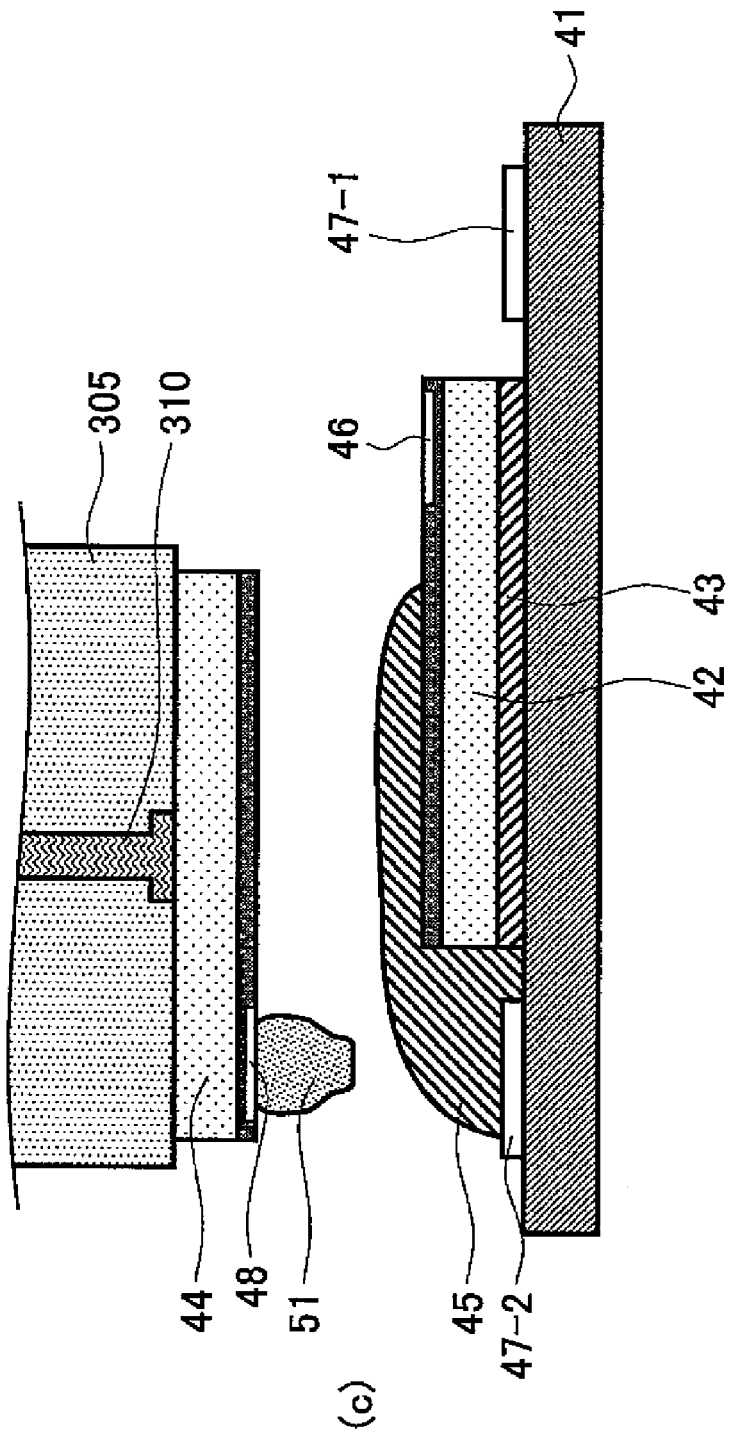
FIG. 30 is a second cross-sectional view showing the manufacturing method of the semiconductor device of the first embodiment of the present invention.
Figure 31:
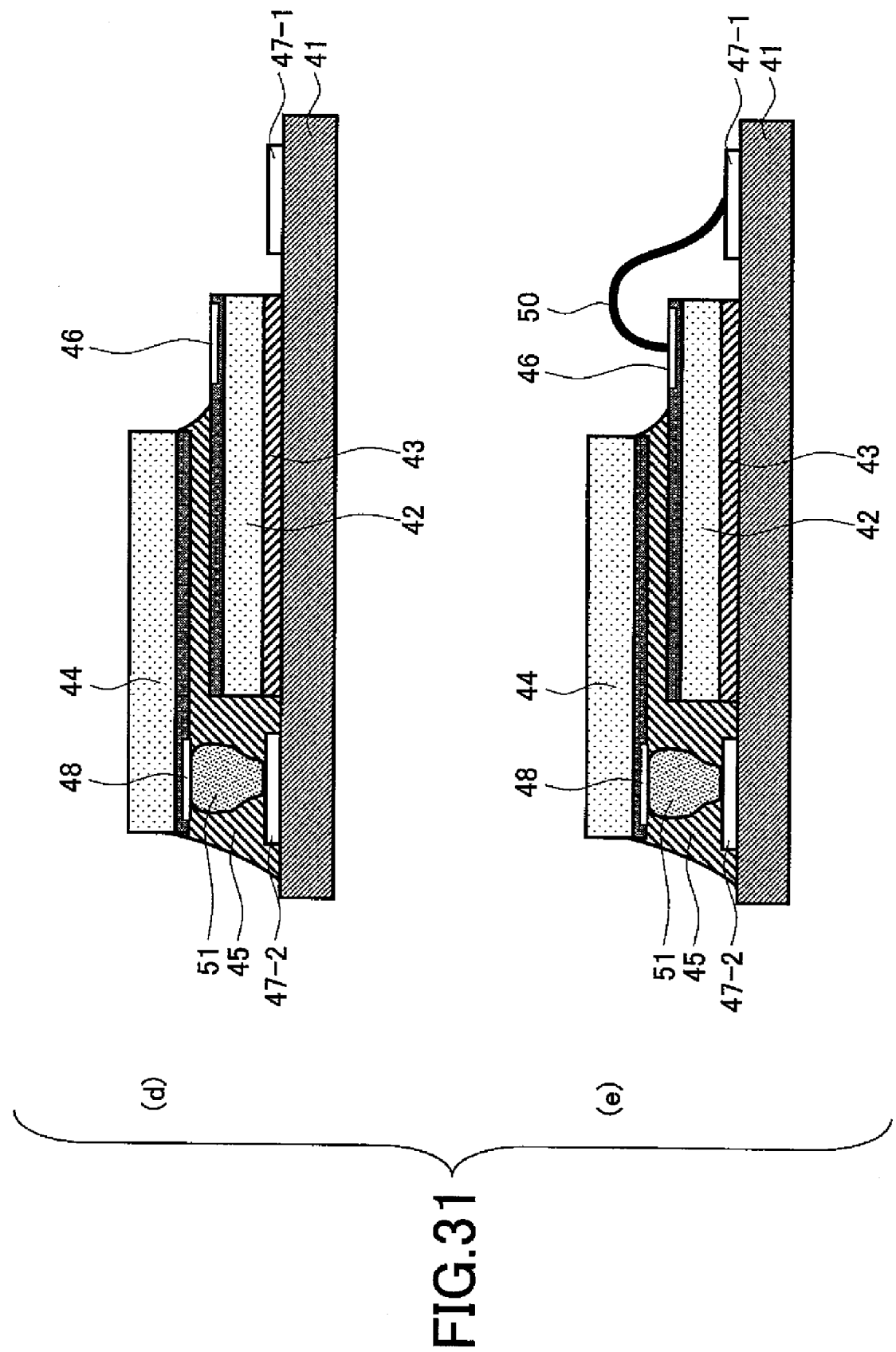
FIG. 31 is a third cross-sectional view showing a manufacturing method of the semiconductor device of the first embodiment of the present invention.
Figure 32:
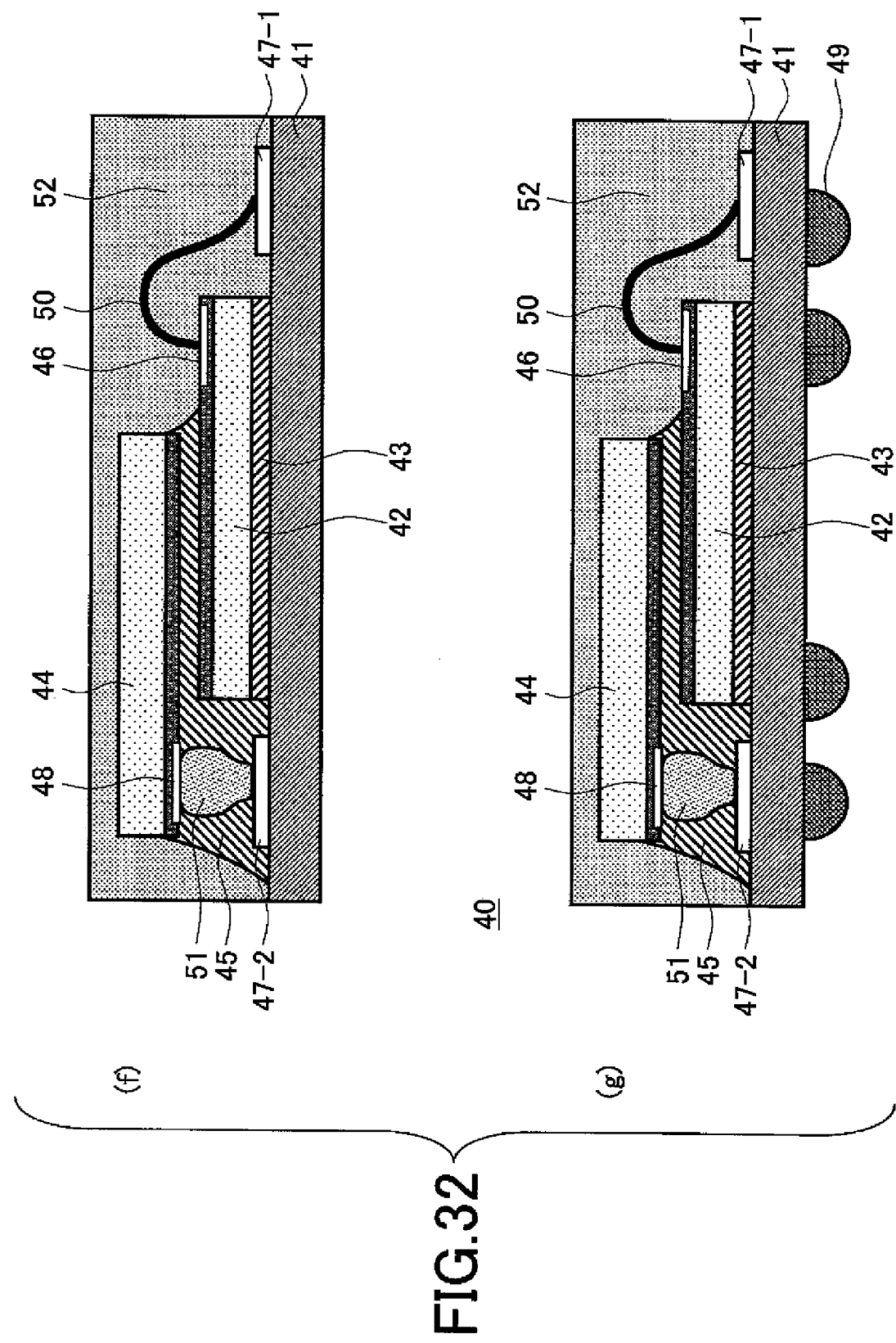
FIG. 32 is a fourth cross-sectional view showing a manufacturing method of the semiconductor device of the first embodiment of the present invention.
Figure 33:
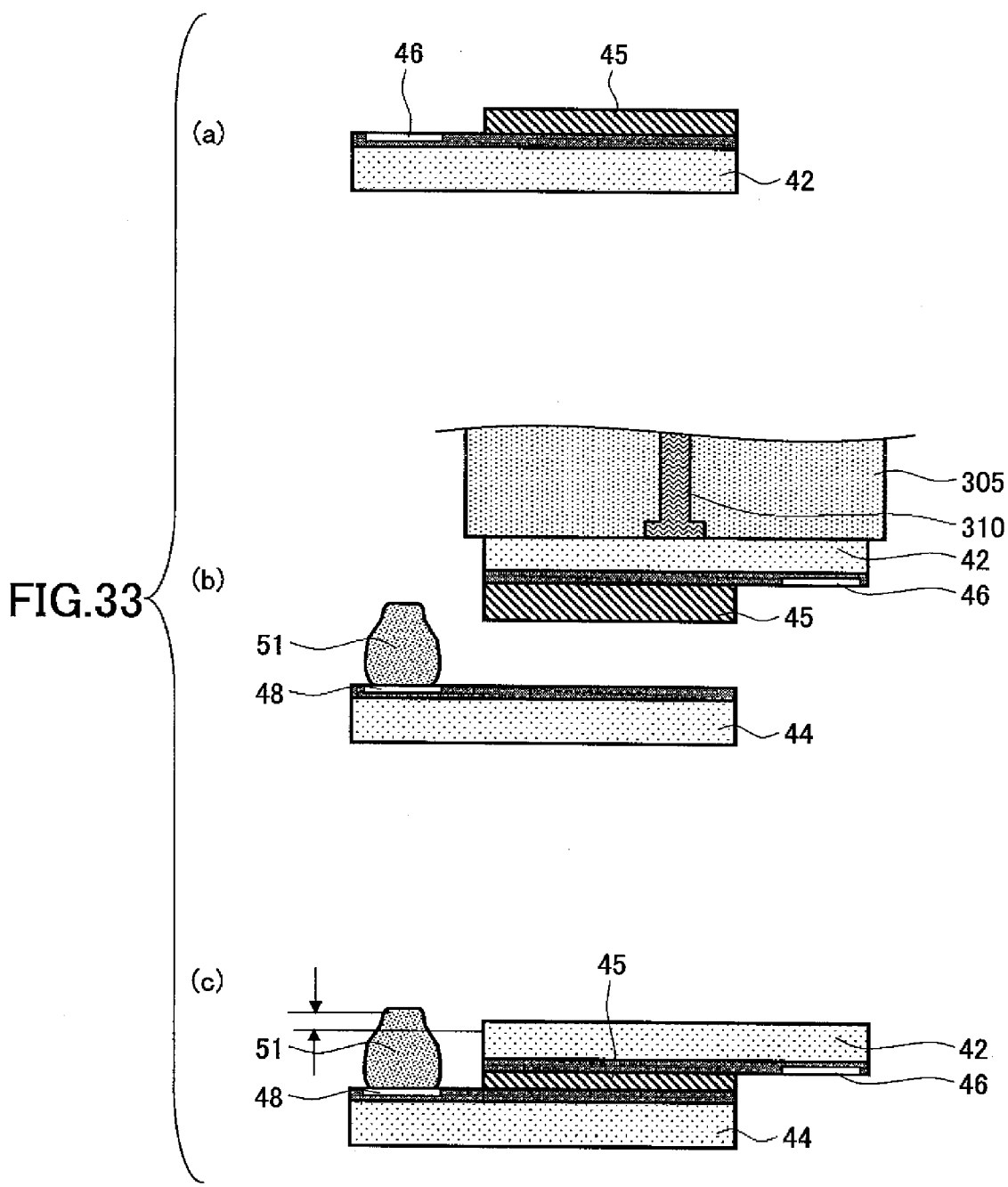
FIG. 33 is a first cross-sectional view showing a manufacturing method of the semiconductor device of the second embodiment of the present invention.
Figure 34:
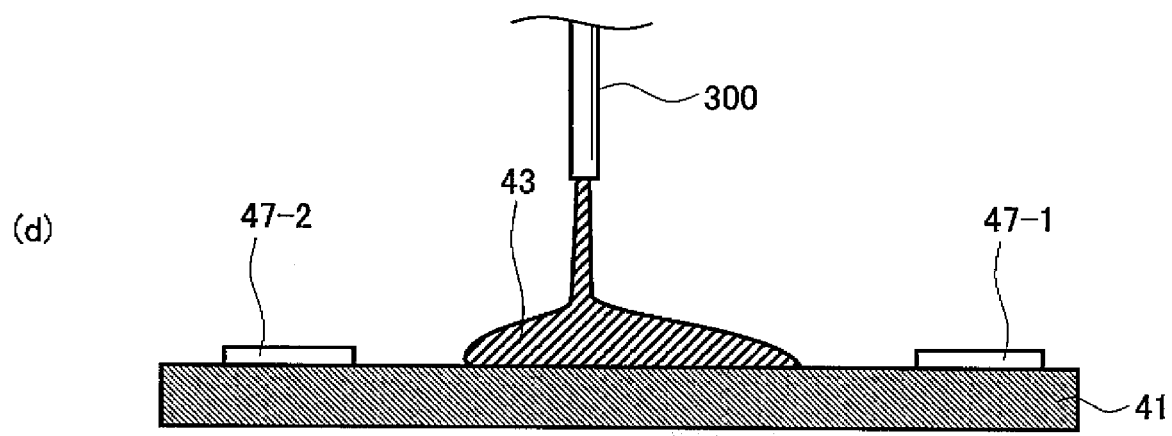
FIG. 34 is a second cross-sectional view showing the manufacturing method of the semiconductor device of the second embodiment of the present invention.

An applied example 11, namely a semiconductor device 230 where the first semiconductor chip and the second semiconductor chip are mounted on the wiring board via a second wiring board and a semiconductor chip, is shown in FIG. 28. This example is a modified example of the above-discussed applied example 10. In FIG. 28, parts that are the same as the parts shown in FIG. 5 are given the same reference numerals, and explanation thereof is omitted.

In the semiconductor device 230, a semiconductor chip 211 is mounted on and fixed to the main surface of the wiring board 41 having a rectangular shaped configuration via a fourth adhesive 212. A sub-wiring board 181 is mounted on the semiconductor chip 211 via the third adhesive 182. The electronic circuit is formed on the main surface of the semiconductor chip 211 as well as the semiconductor chips 42 and 44. The electrode pads 212 are provided on the surface part of the semiconductor chip 211.

Under this structure, the sub-wiring board 181 is stacked on the semiconductor chip 211 so as to be shifted against the third semiconductor chip 211 along two sides facing to each other of the main surface of the semiconductor chip 211 so that entirety of the main surface of the third semiconductor chip 211 does not face to the sub-wiring board 181. Therefore, the electrode pads 212 of the semiconductor chip 211 and the electrode pads 184 of the sub-wiring board 181 are positioned in a area where the electrode pads 212 and 184 do not face each other on the main surfaces of the semiconductor chip 211 and the sub-wiring board 181.

The first semiconductor chip 42 is mounted on the main surface of the sub-wiring board 181 by the adhesive 43. The second semiconductor chip 44 is mounted on the first semiconductor chip 42 via the adhesive 45 by a flip chip method (in a facing down state).

In this example, the first semiconductor chip 42 is mounted on and fixed to the sub-wiring board 181, so as to overhang from a position of the sub-wiring board 181 in a horizontal direction, namely in a direction parallel with the main surface of the wiring board 42, and be provided over the semiconductor chip 211. The electrode pads 46 are positioned in the vicinities of the overhanging area.

The electrode pad 46 of the first semiconductor chip 42 and the bonding pad 47-1 of the wiring board 41 are connected to each other by the bonding wire 50-1.

On the other hand, the electrode pad 48 of the second semiconductor chip 44 is connected to the bonding pad 184 provided on the sub-wiring board 181 by the stacked bumps 51-1 and 51-2 and the conductive member 131.

The bonding pad 185 connected to the wiring layer 183 extending from the bonding pad 184 and the bonding pad 187 provided on the another main surface of the sub-wiring board 181 are connected to each other, by a conductive layer 186 provided in a piercing hole formed by piercing a part of the sub-wiring board 181 under the electrode pad 185.

The bonding pad 187 is connected to the boding pad 47-3 provided on the wiring board 41 via the conductive member 188 and the bump 51-3 provided on the electrode pad 187. On the other hand, the electrode pad 48 of the semiconductor chip 211 and the bonding pad 47-3 of the wiring board 41 are connected to each other by the bonding wire 50-3.

In this example, the third bonding pad 47-3 of the wiring board 41 can be arranged under the overhanging part of the sub-wiring board 181 and thereby the size of the semiconductor device 230 can be made small.

[Manufacturing Method of the Semiconductor Device]

Next, manufacturing methods of the above-discussed semiconductor devices are discussed. Here, manufacturing methods of the semiconductor devices 40, 130, 135, and 140 are mainly discussed.

[Manufacturing Method of the Semiconductor Device 40 and Others]

A manufacturing method of the semiconductor device of the first embodiment of the present invention is discussed with reference to FIG. 29 through FIG. 32.

First, the first semiconductor chip 42 is fixed (die bonded) to the main surface of the wiring board 41 via the first adhesive 43 in a so-called face up state where the electronic circuit forming surface of the first semiconductor chip 42 is exposed (See FIG. 29(a)). On this main surface of the wiring board 41 having the rectangular shaped configuration, the first bonding pads 47-1 and the second bonding pads 47-2 are provided along sides facing each other.

As the first adhesive 43 for fixing the first semiconductor chip 42 on the wiring board 41, for example, thermosetting or thermoplastic insulation resin adhesive can be used. More specifically, epoxy group resin, polyimide group resin, acrylic group resin, or silicon group resin can be used as the first adhesive 43. A film adhesive as the first adhesive 43 may be formed on the rear surface of the first semiconductor chip 42 in advance or may be applied on the wiring board 41 in advance.

Next, the paste second adhesive 45 is applied, by using a nozzle 300, to a part of an upper surface of the first semiconductor chip 42, a part of the second bonding pads 47-2 of the wiring board 41, and between the second bonding pads 47-2 and the first semiconductor chip 42 (See FIG. 29(b)).

On the other hand, the second semiconductor chip 44 where the bump 51 is formed on the electrode pad 48 in advance is held to a heated bonding tool 305 by suction via a suction hole 310.

After the second semiconductor chip 44 is positioned so that the bump 51 and the second bonding pad 47-2 of the wiring board 41 absorbed and held by a bonding state (not shown) face each other, the bonding tool 305 is lowered so that the bump 51 pushes to and comes in contact with the second bonding pad 47-2 and the second adhesive 45 is cured (See FIG. 30(c)).

As heating temperatures, the temperature of the bonding tool 305 may be approximately 250° C. through 300° C. and the temperature of the wiring board may be approximately 50° C. through 100° C. On the other hand, as the applied forcer for example, approximately 5 gf/bump through 30 gf/bump may be selected.

A so-called a ball bonding method can be used for arranging the bump 51 on the electrode pad 48 of the second semiconductor chip 44. In other words, in a state where a ball is formed at a head end of a gold (Au) wire, a capillary is lowered so that the ball comes in contact with the electrode pad 48. While the ball is held by a chamfer, heat, a force or ultrasonic vibration is applied to the ball so that the bump 51 is formed.

After that, while the ball and the wire remain, the capillary is raised and a wire clamp is closed so that the wire is cut.

In a step shown in FIG. 30(c), the second semiconductor chip 44 having plural electrode pads 48 where the bumps 51 are provided is mounted on the first semiconductor chip 42 and the wiring board 41 via the second adhesive 45 in a face down state. In addition, the periphery of the bump 51 is covered with the second adhesive 45.

Next, a heating process is applied with a constant temperature oven (not shown) so that the second adhesive 45 is cured. As a result of this, the second semiconductor chip 44 is fixed to the first semiconductor chip 42 and flip chip connected to the wiring board 41 (See FIG. 31(d)).

At this time, heating temperature may be approximately 120° C. through 180° C. and heating time may be approximately 30 minutes through 90 minutes.

In a case where the second adhesive 45 is cured with a curing rate of 80% or more in the step shown in FIG. 30(c), such a heating step may be omitted. Depending on the composition of the adhesive, the curing rate with which the heating step is omitted varies.

Next, the electrode pad 46 of the first semiconductor chip 42 and the first bonding pad 47-1 of the wiring board 41 are connected to each other by a wiring bonding method (See FIG. 31(e)). In other words, the electrode pad 46 of the first semiconductor chip 42 and the first bonding pad 47-1 of the wiring board 41 are connected to each other by the bonding wire 50.

Next, by using a transfer resin mold method or the like, the semiconductor chips 42 and 44 and others mounted on the main surface of the wiring board 41 are covered with and sealed by the sealing resin 52 (See FIG. 32(f)).

After that, plural solder balls 49 forming the outside connection terminals are formed on another main surface (rear surface) of the wiring board 41, so that the semiconductor device 40 is formed (See FIG. 32(g)).

Thus, according to the above-discussed manufacturing method, the electrode pad 48 of the second semiconductor chip 44 and the bonding pad 47-2 can be connected by the bump 51 simultaneously with fixing the second semiconductor chip 44 to the first semiconductor chip 42. In addition, the periphery of the bump 51 can be covered with the second adhesive 45. Therefore, it is possible to form the semiconductor device 40 by a simple method.

In manufacturing of the semiconductor devices of other embodiments, methods wherein parts of the steps are different from the above-discussed method are applied.

With respect to mounting and fixing the first semiconductor chip on wiring board shown in FIG. 29(a), in manufacturing of the semiconductor device 100 (See FIG. 10), the surface protection film 101-1 is formed on the surface of the first semiconductor chip 42 in advance by the covering method in a semiconductor wafer process of the first semiconductor chip 42.

In addition, in manufacturing of the semiconductor device 110 (See FIG. 11), the dam 105 is formed on the first semiconductor chip 42 in advance by patterning with a photolithography method, a plating method or an attaching method, in the semiconductor wafer process of the first semiconductor chip 42.

Furthermore, in manufacturing of the semiconductor device 120 (See FIG. 12 and FIG. 13), the dams 105 through 107 are formed on the first semiconductor chip 42 and the wiring board 41 in advance by patterning with a photolithography method, a plating method or an attaching method.

In manufacturing of the semiconductor device 160 (See FIG. 20), two semiconductor chips 42-1 and 42-2 are mounted on and fixed to (die bonded) the main surface of the wiring board 41 in the face up state where the electronic circuit forming surfaces are exposed. In manufacturing of the semiconductor devices 165 and 175 (See FIG. 21 and FIG.

23), four semiconductor chips 42-1 through 42-4 are mounted on and fixed to (die bonded) the main surface of the wiring board 41 in the face up state where the electronic circuit forming surfaces are exposed.

In manufacturing of the semiconductor devices 180, 190 and 200 (See FIG. 24 through FIG. 26), the boards 181, 181A, or 201 is fixed to the main surface of the wiring board 41 via the fourth adhesive 183, and then the first semiconductor chip 42 is mounted on and fixed to (die bonded) the main surface of the wiring board 41 in the face up state where the electronic circuit forming surfaces are exposed.

In manufacturing of the semiconductor device 210 (See FIG. 27), the third semiconductor chip 211 is fixed on the wiring board 41 via the adhesive 212 and the fourth bonding pad 47-4 of the wiring board 41 and the fourth electrode pad 213 of the third semiconductor chip 211 are connected to each other by the bonding wire 50-3.

Next, the board 181 is fixed to the third semiconductor chip 211 via the adhesive 182 and then the first semiconductor chip 42 is mounted on the board 181 in the face up state where the electronic circuit forming surfaces are exposed.

In manufacturing of the semiconductor device 230 (See FIG. 28), the third semiconductor chip 211 is fixed on the wiring board 41 via the adhesive 212 and the fourth bonding pad 47-4 of the wiring board 41 and the fourth electrode pad 213 of the third semiconductor chip 211 are connected to each other by the bonding wire 50-3.

Next, the board 181 is fixed to the third semiconductor chip 211 via the adhesive 182 and the electrode pad 187 of the board 181 and the second bonding pad 47-2 of the wiring board 41 are connected to each other by the bump 51-3.

In addition, the first semiconductor chip 42 is mounted on the board 181 in the face up state where the electronic circuit forming surfaces are exposed.

With respect to mounting and fixing the second semiconductor chip in FIG. 30(c), in manufacturing of the semiconductor device 90 (See FIG. 9), the bump 51-1 is provided on the electrode pad 48 of the second semiconductor chip 44 in advance and the second bump 51-2 is formed and stacked on the bump 51-1, so that the bump 51 configured to connect the electrode pad 48 of the second semiconductor chip 44 and the second bonding pad 47-2 of the wiring board 41 is formed.

In manufacturing of the semiconductor device 100 (See FIG. 10), the surface protection film 101-2 is formed on the surface of the second semiconductor chip 44 in advance by the covering method in a semiconductor wafer process of the second semiconductor chip 44. After that, the bump 51 is provided on the second electrode pad 48.

In manufacturing of the semiconductor device 150 (See FIG. 18), the second semiconductor chip 44 is mounted on the main surface of the first semiconductor chip 42 so as to be shifted along the diagonal line of the main surface of the first semiconductor chip 42.

In manufacturing of the semiconductor device 155 (See FIG. 19), the second semiconductor chip 44 is mounted on the first semiconductor chip 42 so that the semiconductor chips 42 and 44 cross each other. In manufacturing of the semiconductor device 170 (See FIG. 22), two second semiconductor chips 44-1 and 44-2 are mounted on the first semiconductor chip 42 so as to be separated from each other.

In manufacturing of the semiconductor device 175 (See FIG. 23), two first semiconductor chips 42-1 and 42-2 are provided so as to be separated from each other. In addition, two second semiconductor chips 44-1 and 44-2 are mounted on the first semiconductor chips 42 so as to be separated from each other.

In manufacturing of the semiconductor devices 190, 200, 210 and 230 (See FIG. 25 through FIG. 28), the bump 51-1 is provided on the electrode pad 48 of the second semiconductor chip 44 and the bump 51-2 is provided on the second bonding pad 47-2 of the board 185.

In manufacturing of the semiconductor devices 180, 190, 200 and 210 (See FIG. 24 through FIG. 27), after the step of mounting the second semiconductor chip 44 shown in FIG. 31(d), the electrode pad 187 of the board 185 and the third bonding pad 47-3 of the wiring board 41 are connected to each other by the bonding wire 50-2.

In addition, with respect to the resin sealing step or resin covering step shown in FIG. 32(f), in manufacturing the semiconductor device 60 (See FIG. 6), a necessary minimum part such as the first bonding pad 47-1, the bonding wire 50, the electrode pad 46, and others is covered with the paste resin by using a potting method.

In manufacturing the semiconductor device 70 (See FIG. 7), the first bonding pad 47-1, the bonding wire 50, the electrode pad 46, the first semiconductor chip 42, the exposed part of the second adhesive 45, and a side surface of the second semiconductor chip 44 are covered with sealing resin 72. On the other hand, the rear surface of the second semiconductor chip 44 is not covered with the sealing resin 72 so as to be exposed outside of the semiconductor device 70.

[Manufacturing Method of the Semiconductor Device 130 and Others]

A manufacturing method of the semiconductor device 130 (see FIG. 15) of the second embodiment of the present invention is discussed with reference to FIG. 33, FIG. 34, FIG. 38 through FIG. 40.

First, the second adhesive 45 is provided to a part other than a part where the first electrode pad 46 is provided of the electronic circuit forming surface of the first semiconductor chip 42. More specifically, the sheet-like second adhesive 45 is provided to a part other than a part where the first electrode pad 46 is provided of the electronic circuit forming surface of the first semiconductor chip 42. At this time, the second adhesive 45 is in a B stage where the second adhesive 45 is semi-cured and dried to the touch (See FIG. 33(a)).

On the other hand, the bump 51 is provided on the electrode pad 48 provided on the electronic circuit forming surface of the second semiconductor chip 44. The bump 51 can be formed by the above-mentioned ball bonding method (See FIG. 33(b)).

After that, the first semiconductor chip 42 is positioned so that the electronic circuit forming surface of the first semiconductor chip 42 held by the bonding tool 305 faces the electronic circuit forming surface of the second semiconductor chip 44 held by bonding (not shown) and the electrode pad 48 of the second semiconductor chip 44 and the electrode pad 46 of the first semiconductor chip 42 are exposed.

The first semiconductor chip 42 is lowered so that the first semiconductor chip 42 and the second semiconductor chip 44 are fixed to each other by the second adhesive 45. The first semiconductor chip 42 is held by suction via a vacuum suction hole 110 of the bonding tool 305.

In this case, the temperature of the bonding tool 305 is room temperature and the second semiconductor chip 44 is heated at approximately 50° C. through 200° C.

After the first semiconductor chip 42 is fixed to the second semiconductor chip 44, the second adhesive 45 becomes semi-cured or completely cured.

The height of the bump 51 is greater than the sum of film thickness of the second adhesive 45 and the thickness of the first semiconductor chip 42. In other words, the upper surface of the bump 51 projects from a position of the rear surface of the first semiconductor chip 42.

Accordingly, in steps discussed below, when the second semiconductor chip 44 is flip chip connected to the wiring board 41, the bump 51 can be securely connected to the second bonding pad 47-2 of the wiring board 41 (See FIG. 33(c)).

Under this structure, there is no need to make the bonding pad 47-2 thick for connecting the bump 51 and the second boding pad 47-2. Therefore, the freedom degree of design of the bonding pad 47-2 is improved.

In the case where the electrode pad 48 of the second semiconductor chip 44 and the second bonding pad 47-2 of the wiring board 41 are connected to each other by even the conductive member 131 like the semiconductor device 135 shown in FIG. 16, the height of the bump 51 may be low.

After that, a heating process is applied to an entire structure with a constant temperature oven (not shown) so that the second adhesive 45 is cured. At this time, heating temperature may be approximately 120° C. through 180° C. and heating time may be approximately 30 minutes through 90 minutes. Since the second adhesive 45 is finally cured in the following steps, the heating process of this step may be omitted.

Next, the paste state first adhesive 43 is applied, via the nozzle 300, to parts on the wiring part 41, namely a part of a fixing expected position of the first semiconductor chip 42 and a part of a fixing expected position of the second semiconductor chip 44 including a forming part of the second bonding pad 47-2 (See FIG. 34(d)). The first adhesive 34 is not limited to the paste adhesive but may be a sheet-like adhesive.

Figure 35:
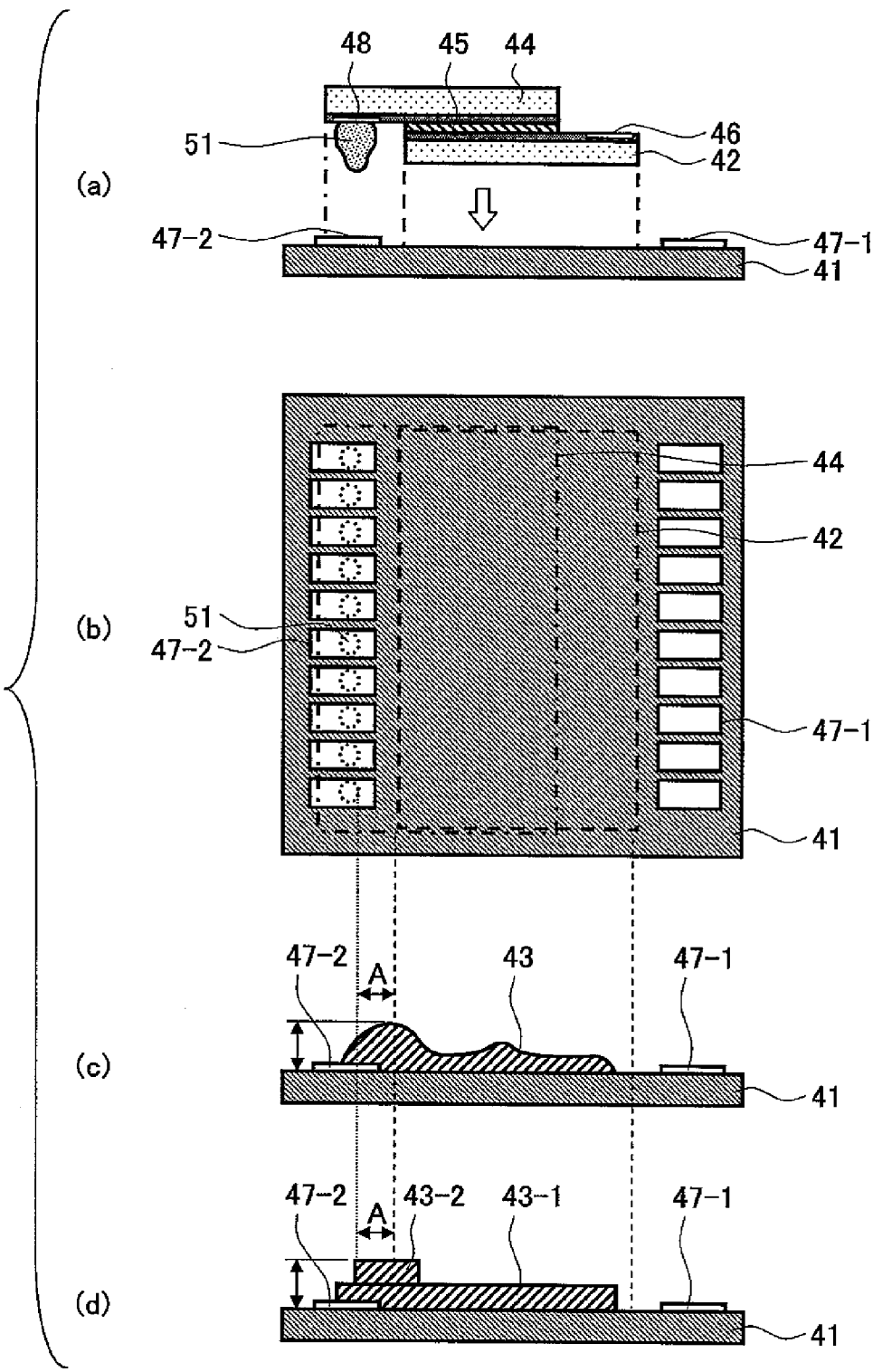
FIG. 35 is a view showing a first example of arrangement of an adhesive on a wiring board in manufacturing of the semiconductor device of the second embodiment of the present invention.

Here, examples of arrangement of the first adhesive 43 on the wiring board 41 are discussed with reference to FIG. 35 through FIG. 37.

FIG. 35(a) shows a state where the first semiconductor chip 42 on which the second semiconductor chip 44 is mounted and fixed is mounted on the wiring board 41. In FIG. 35(b), dotted rectangular shaped lines indicate the mounting expected position of the first semiconductor chip 42 on the wiring board 41; one dotted lines indicate the mounting expected position of the second semiconductor chip 44 on the wiring board 41; and dotted circular shaped lines indicate the connecting expected position of the bump 51. FIG. 35(c) shows a state where the paste first adhesive 43 is provided on the wiring board 41. FIG. 35(d) shows a state where the sheet (film) first adhesive 43-1 and 43-2 are stacked on the wiring board 41.

In other words, the first adhesive 43 is selectively provided on the wiring board 41, so that the height of the first adhesive 43 in an area having a width A is highest, the area being between an and part at a side of the second bonding pad 47-2 of the fixing expected position of the first semiconductor chip 42 and a connecting expected position of the bump 51 on the second bonding pad 47-2.

The reason why the distribution (height) of the first adhesive 43 varies is the necessity that the first adhesive 43 be adequately provided in the periphery of the bump 51.

Figure 36:
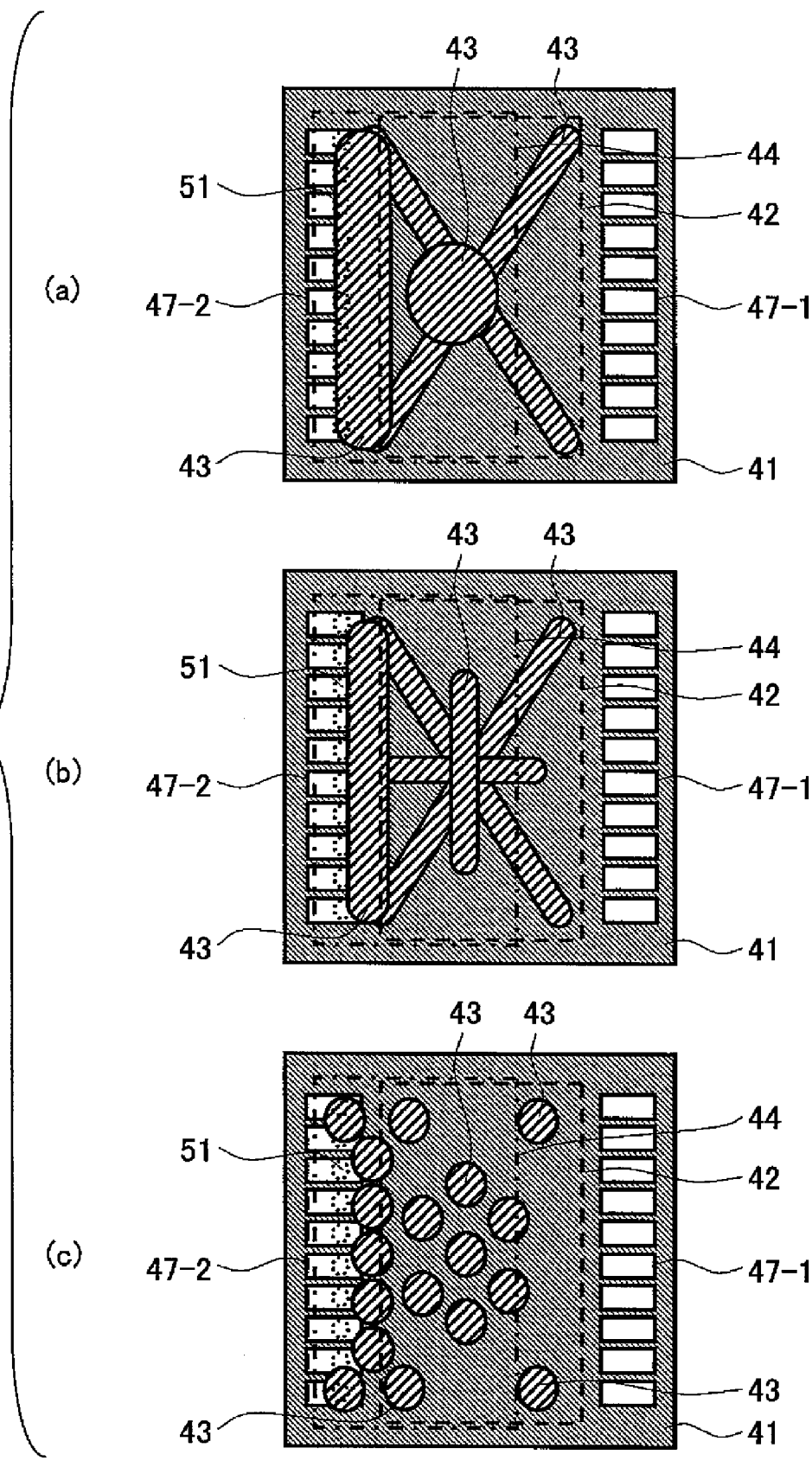
FIG. 36 is a view showing a second example of arrangement of an adhesive on a wiring board in manufacturing of the semiconductor device of the second embodiment of the present invention.

The structure where the distribution (height) of the first adhesive 43 varies can be achieved by an arrangement example shown in FIG. 36.

In the example shown in FIG. 36(a), the first adhesive 43 is provided in the area between the end part at a side of the second bonding pad 47-2 of the fixing expected position of the first semiconductor chip 42 and a connecting expected position of the bump 51 on the second bonding pad 47-2 so as to be continuously arranged along a direction of arrangement of the second bonding pads 47-2.

The first adhesive 43 is also selectively provided substantially diagonally in the arrangement expected position of the first semiconductor chip 42 and in the center of the arrangement expected position of the first semiconductor chip 42.

Therefore, when the first semiconductor chip 42 is mounted on and fixed to the wiring board 41, a sufficient amount of the first adhesive 43 is provided between the wiring board 41 and the first semiconductor chip 42.

In the example shown in FIG. 36(b), the first adhesive 43 is provided in the area between the end part at a side of the second bonding pad 47-2 of the fixing expected position of the first semiconductor chip 42 and a connecting expected position of the bump 51 on the second bonding pad 47-2 so as to be continuously arranged along a direction of arrangement of the second bonding pads 47-2.

The first adhesive 43 is also selectively provided substantially diagonally in the arrangement expected position of the first semiconductor chip 42 and in the center of the arrangement expected position of the first semiconductor chip 42 in a crossing pattern. Therefore, when the first semiconductor chip 42 is mounted on and fixed to the wiring board 41, a sufficient amount of the first adhesive 43 is provided between the wiring board 41 and the first semiconductor chip 42.

In the example shown in FIG. 36(b), the first adhesive 43 is provided in the area between the end part at a side of the second bonding pad 47-2 of the fixing expected position of the first semiconductor chip 42 and a connecting expected position of the bump 51 on the second bonding pad 47-2 so as to be arranged between the second bonding pads 47-2.

The first adhesive 43 is also provided at the four corners of the arrangement expected position of the first semiconductor chip 42 and plural first adhesives 43 are also provided in the center of the arrangement expected position of the first semiconductor chip 42. Therefore, when the first semiconductor chip 42 is mounted on and fixed to the wiring board 41, a sufficient amount of the first adhesive 43 is provided between the wiring board 41 and the first semiconductor chip 42.

Figure 37:
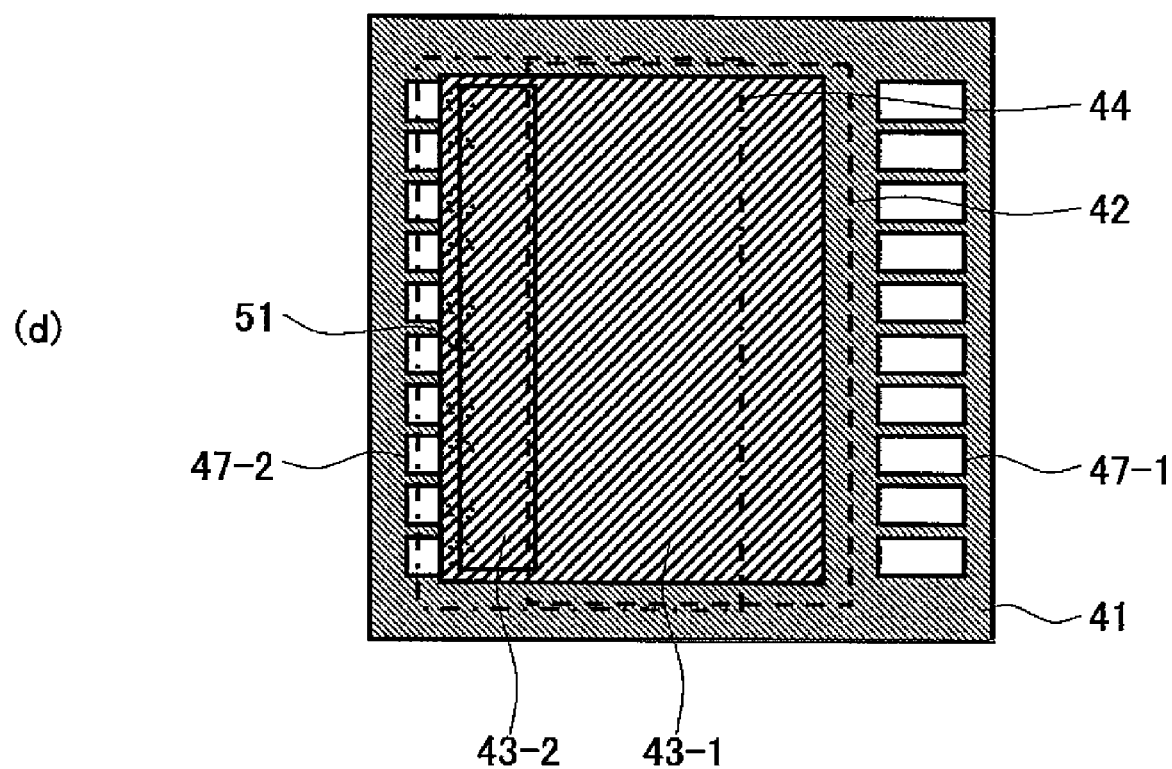
FIG. 37 is a view showing a third example of arrangement of an adhesive on a wiring board in manufacturing of the semiconductor device of the second embodiment of the present invention.

The structure shown in FIG. 35(d) can be achieved by an arrangement example shown in FIG. 37.

In the example shown in FIG. 37, the sheet (film) first adhesive 43 is provided in the area on the main surface of the wiring board 41 between the end part at a side of the first bonding pad 47-1 of the first semiconductor chip 42 and the end part at a side of the second bonding pad 47-2 of the second semiconductor chip 44.

In addition, the sheet (film) first adhesive 43-2 is stacked on the first adhesive 43-1 positioned between the end part at a side of the first bonding pad 47-1 of the first semiconductor chip 42 and the connection expected position of the bump 51 on the second bonding pad 47-2.

Thus, the height of the first adhesive 43 situated in the area between the end part at a side of the second bonding pad 47-2 of the fixing expected position of the first semiconductor chip 42 and a connecting expected position of the bump 51 on the second bonding pad 47-2 is highest.

By this step, it is possible to securely fix the second semiconductor chip 44 and the wiring board 41 to each other by the first adhesive 43 and prevent overflow of the first adhesive 43 to the external periphery part of the first semiconductor chip 42.

Next, the rear surface of the second semiconductor chip 44 fixed on the first semiconductor chip 42 is suctioned by a heated bonding tool so that the second semiconductor chip 44 is held.

The second semiconductor chip 44 is positioned so that the bump 51 of the second semiconductor chip 44 faces the second bonding pad 47-2 of the wiring board 41 held by the bonding stage (not shown).

The bonding tool 30 is lowered so that the bump 51 of the second semiconductor chip 44 pushes the second bonding pad 47-2 of the wiring board 41 and the first semiconductor chip 42 is fixed on the wiring board 42 by the first adhesive 45.

Figure 38:
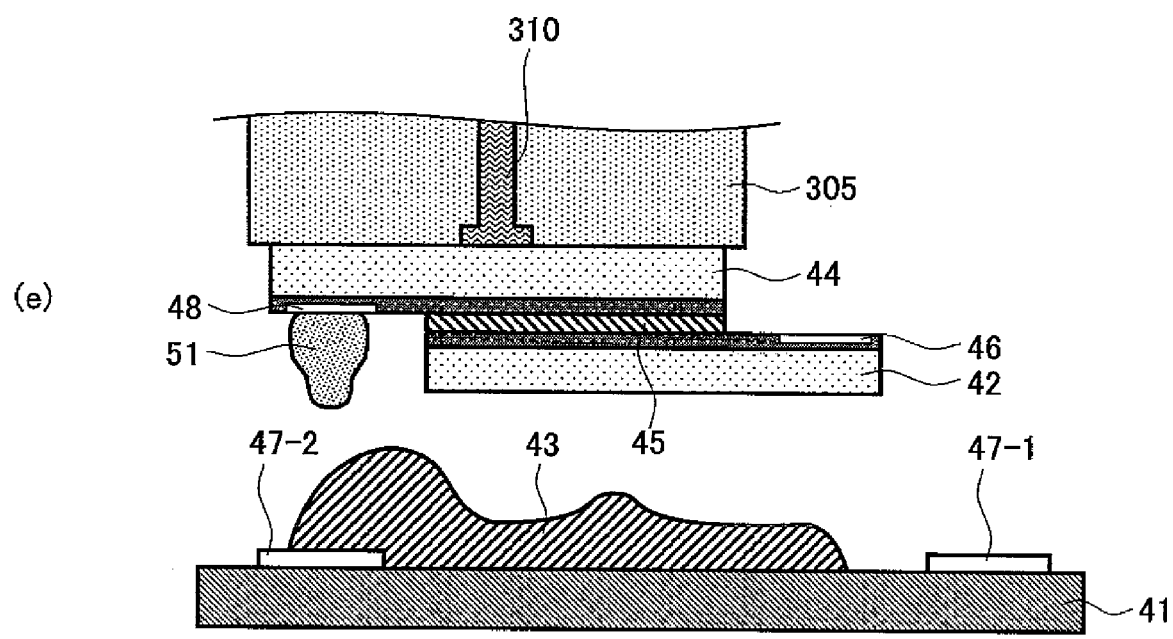
FIG. 38 is a third cross-sectional view showing the manufacturing method of the semiconductor device of the first embodiment of the present invention.

At the same time, the electrode pad 48 of the second semiconductor chip 44 and the second bonding pad 47-2 of the wiring board 41 are connected to each other by the bump 51 and the periphery of the bump 51 is covered with the first adhesive 43 (See FIG. 38(*e*)).

After that, the first adhesive 43 is heated and cured. In this case, a temperature of the bonding tool 305 may be approximately 250° C. through 300° C. and a temperature of the wiring board may be approximately 50° C. through 100° C. On the other hand, an applied force, for example, approximately 5 gf/bump through 30 gf/bump may be selected.

As a result of this, the second semiconductor chip 44 having plural electrode pads 48 is fixed to the first semiconductor chip 42 via the second adhesive 45 in a face down state, In addition, the first semiconductor chip 42 is fixed to the wiring board 41 via the first adhesive 43.

In addition, the electrode pad 48 of the second semiconductor chip and the second bonding pad 47-2 of the wiring board are connected to each other by the bump 51 formed on the second electrode pad 48. Furthermore, the periphery of the bump 51 is covered with the first adhesive 43.

Figure 39:
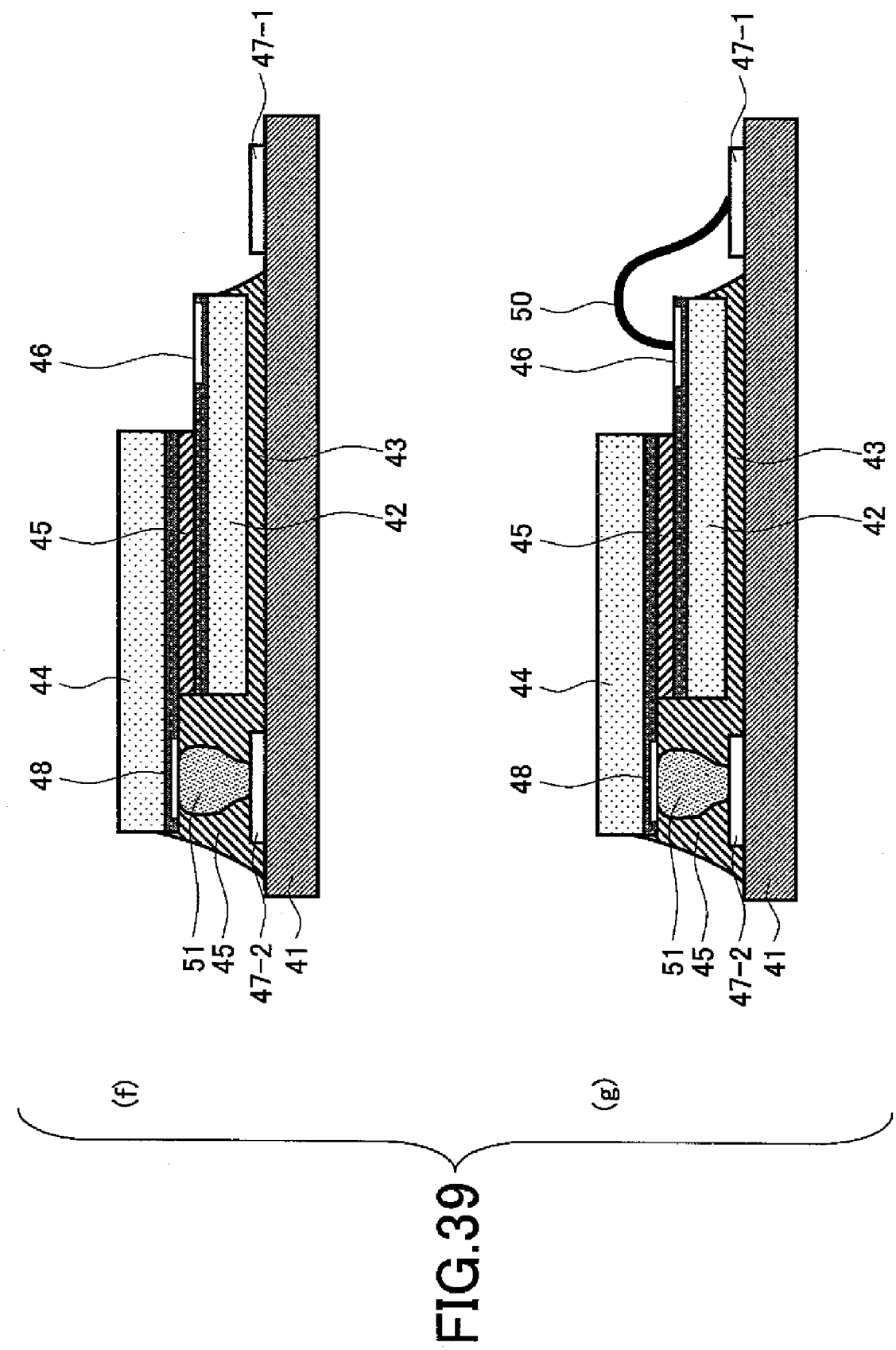
FIG. 39 is a fourth cross-sectional view showing the manufacturing method of the semiconductor device of the first embodiment of the present invention.

After that, a heating process is applied with a constant temperature oven (not shown) so that the first adhesive 43 is cured so that the first semiconductor chip 42 is flip chip connected to the wiring board 41 (see FIG. 39(*f*)). In this step, heating temperature may be approximately 120° C. through 180° C. and heating time may be approximately 30 minutes through 90 minutes.

In a case where the first adhesive 43 is cured with a curing rate of approximately 80% or more in the step shown in FIG. 38(*e*), the step shown in FIG. 39(*f*) may be omitted.

Next, the first electrode pad 46 of the first semiconductor chip 42 and the first bonding pad 47-1 of the wiring board 41 are connected to each other by the bonding wire 50 (see FIG. 39(*g*)).

Figure 40:
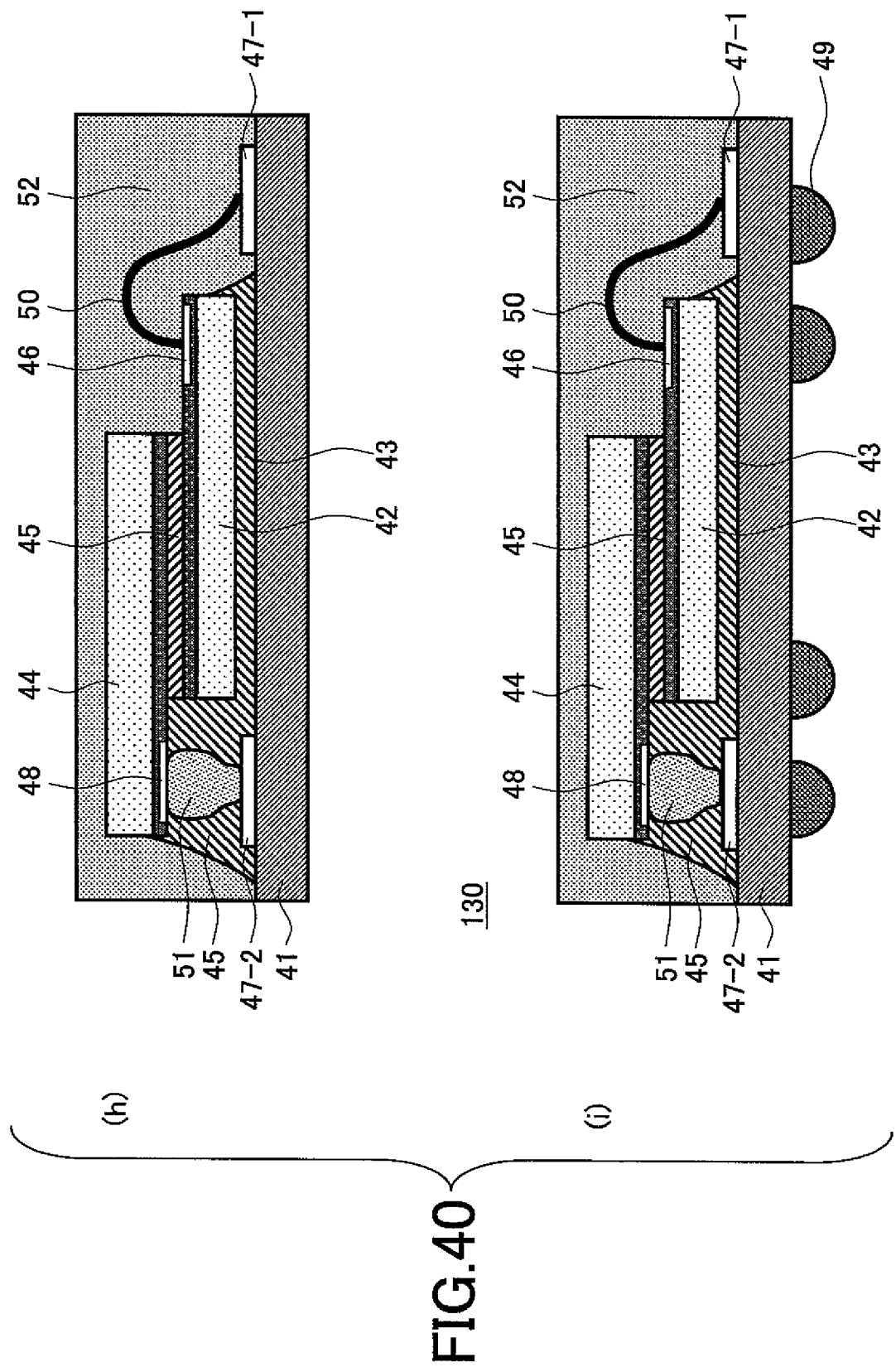
FIG. 40 is a fifth cross-sectional view showing the manufacturing method of the semiconductor device of the first embodiment of the present invention.

Then, by using a transfer resin mold method or the like, the semiconductor chips provided on the main surface of the wiring board 41 are covered with and sealed by the sealing resin 52 (See FIG. 40(*h*)).

After that, plural solder balls 49 forming the outside connection terminals are formed on another main surface (rear surface) of the wiring board 41, so that the semiconductor device 130 is formed (See FIG. 40(*i*)).

Thus, according to the above-discussed manufacturing method, by the first adhesive 43 applied for fixing the first semiconductor chip 42 to the wiring board 41, it is possible to cover the periphery of the connection part of the bump 51 of the second semiconductor chip 44 and the bonding pad 47-2 of the wiring board 41. Therefore, it is possible to form the semiconductor device 130 by a simple method.

[Manufacturing Method of the Semiconductor Device 135 and Others]

A manufacturing method of the semiconductor device 135 (see FIG. 16) of the second embodiment of the present invention is discussed with reference to FIG. 41 through FIG. 44.

Figure 41:
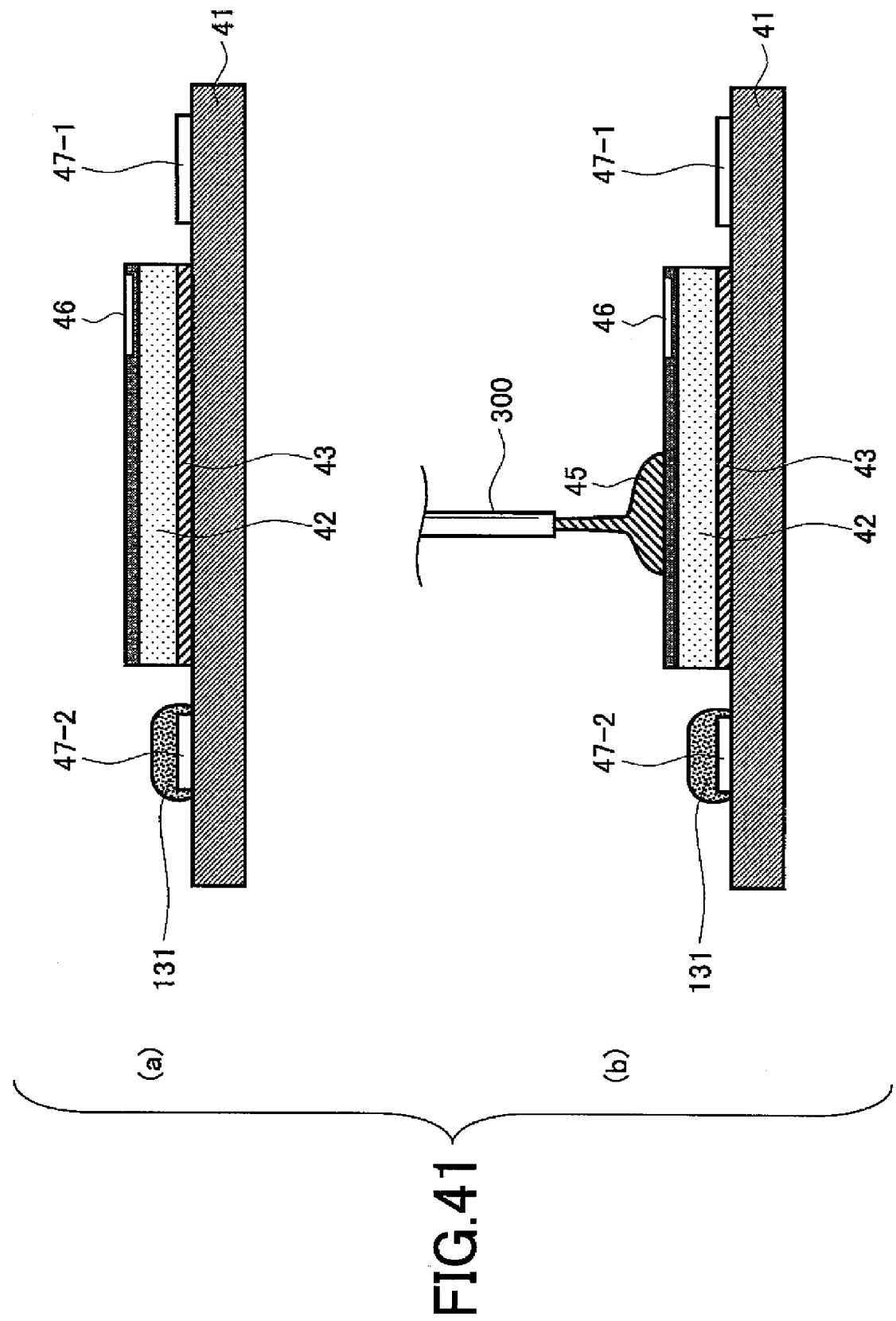
FIG. 41 is a first cross-sectional view showing a manufacturing method of the semiconductor device of the third embodiment of the present invention.

The first semiconductor chip 42 is fixed (die bonded) to, by the first adhesive 43, the main surface of the wiring board 41, the main surface where the first bonding pads 47-1 and the second bonding pads 47-2 are provided along side facing each other, in the face up state where the electronic circuit forming surface is exposed (see FIG. 41(*a*)).

As the first adhesive 43, for example, thermosetting or thermoplastic insulation resin adhesive can be used. More specifically, epoxy group resin, polyimide group resin, acrylic group resin, or silicon group resin can be used as the first adhesive 43. A film adhesive as the first adhesive 43 may be formed on the rear surface of the first semiconductor chip 42 in advance or may be applied on the wiring board 41 in advance.

The second bonding pad 47-2 of the wiring board 41 is covered with conductive member 131 made of solder or the like in advance.

Next, the paste second adhesive 45 is applied, by using a nozzle 300, to the electronic circuit forming surface of the first semiconductor chip 42 (See FIG. 41(*b*)).

Next, the second semiconductor chip 44 where the bump 51 is formed in advance on the second electrode pad 48 is suctioned and held by the heated bonding tool 305 via the suction hole 310, and thereby the second semiconductor chip 44 is positioned so that the bump 51 and the second bonding pad 47-2 of the wiring board 41 suctioned and held by a bonding stage (not shown) face each other.

Figure 42:
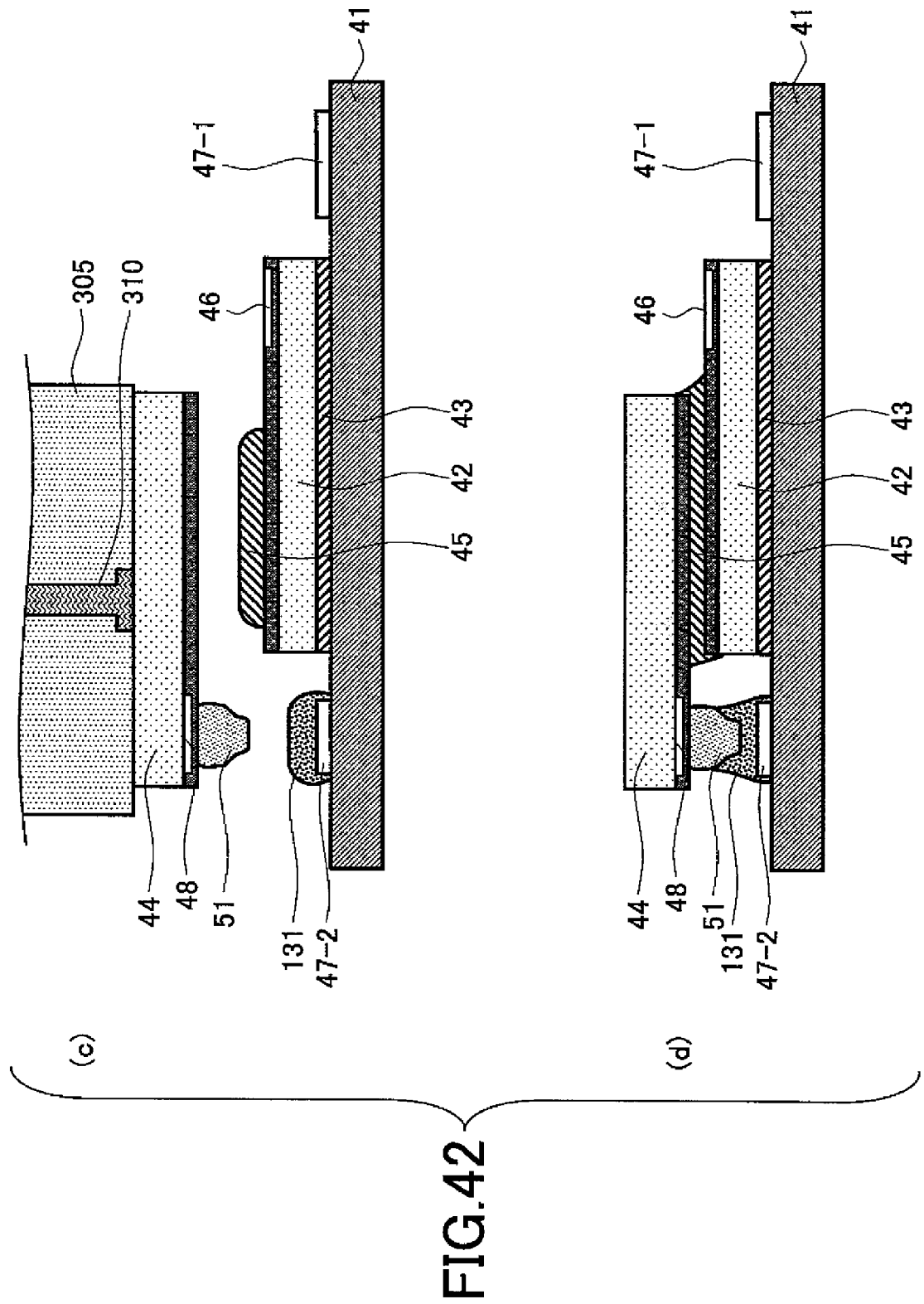
FIG. 42 is a second cross-sectional view showing the manufacturing method of the semiconductor device of the third embodiment of the present invention.

The bonding tool 305 is lowered so that the bump 51 comes in contact with the conductive member 131 covered on the second bonding pad 47-2, the conductive member 131 becomes molten, and the bump 51 and the boding pad 47-2 are connected to each other (see FIG. 42(*c*)).

In this case, the temperature of the bonding tool 305 may be approximately 250° C. through 300° C. and the temperature of the wiring board may be approximately 50° C. through 100° C. On the other hand, as applied force, for example, approximately 1 gf/bump through 8 gf/bump may be selected.

As a result of this, the second semiconductor chip 44 having plural electrode pads 48 is fixed to the first semiconductor chip 42 via the second adhesive 45. In addition, the electrode pad 48 of the second semiconductor chip and the second bonding pad 47-2 of the wiring board are connected to each other by the bump 51 and the conductive member 131.

As discussed above, the ball bonding method can be used for forming the bump 51 on the electrode pad 48 of the second semiconductor chip 44.

After that, a heating process is applied with a constant temperature oven (not shown) so that the second adhesive 45 is cured so that the second semiconductor chip 44 is flip chip connected to the wiring board 41 (see FIG. 42(*d*)). In this step, the heating temperature may be approximately 120° C. through 180° C. and heating time may be approximately 30 minutes through 90 minutes.

In a case where the first adhesive 43 is cured with a curing rate of approximately 80% or more in the step shown in FIG. 42(*c*), the step shown in FIG. 42(*d*) may be omitted.

Next, via a nozzle 400, the paste third adhesive 133 is applied to the peripheries of the bump 51 and the conductive member 131. The third adhesive 133 fills not only the peripheries of the bump 51 and the conductive member 131 but also a gap part between the second semiconductor chip 44 and the wiring board 41 due to capillarity action, so that the second semiconductor chip 44 is fixed to the wiring board 41 (see FIG. 43(*e*)).

Figure 43:
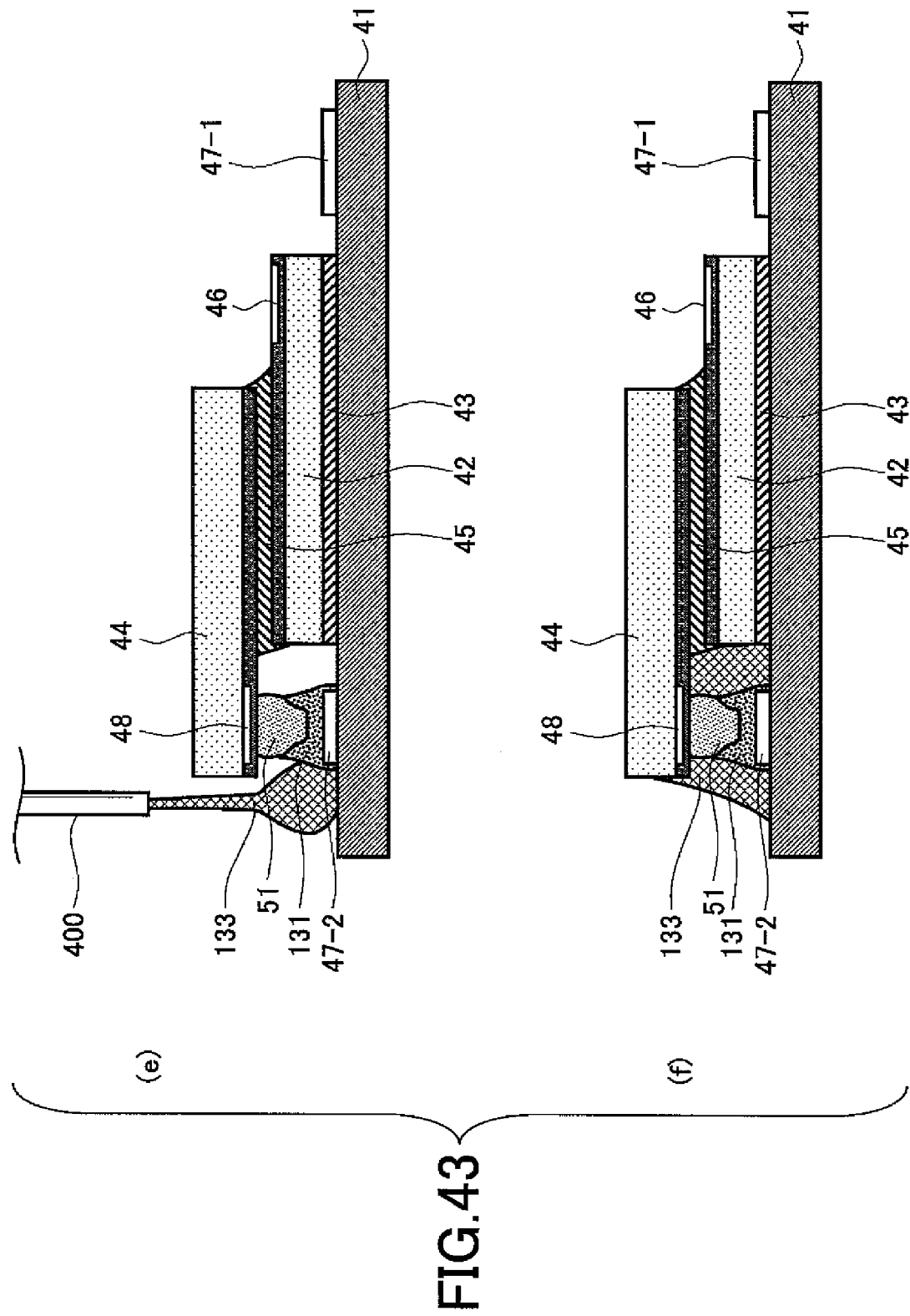
FIG. 43 is a third cross-sectional view showing a manufacturing method of the semiconductor device of the third embodiment of the present invention.

After that, a heating process is applied with a constant temperature oven (not shown) so that the third adhesive 133 is cured so that the second semiconductor chip 44 is flip chip connected to the wiring board 41 (see FIG. 43(*f*)). In this step, the heating temperature may be approximately 120° C. through 180° C. and heating time may be approximately 30 minutes through 90 minutes.

Figure 44:
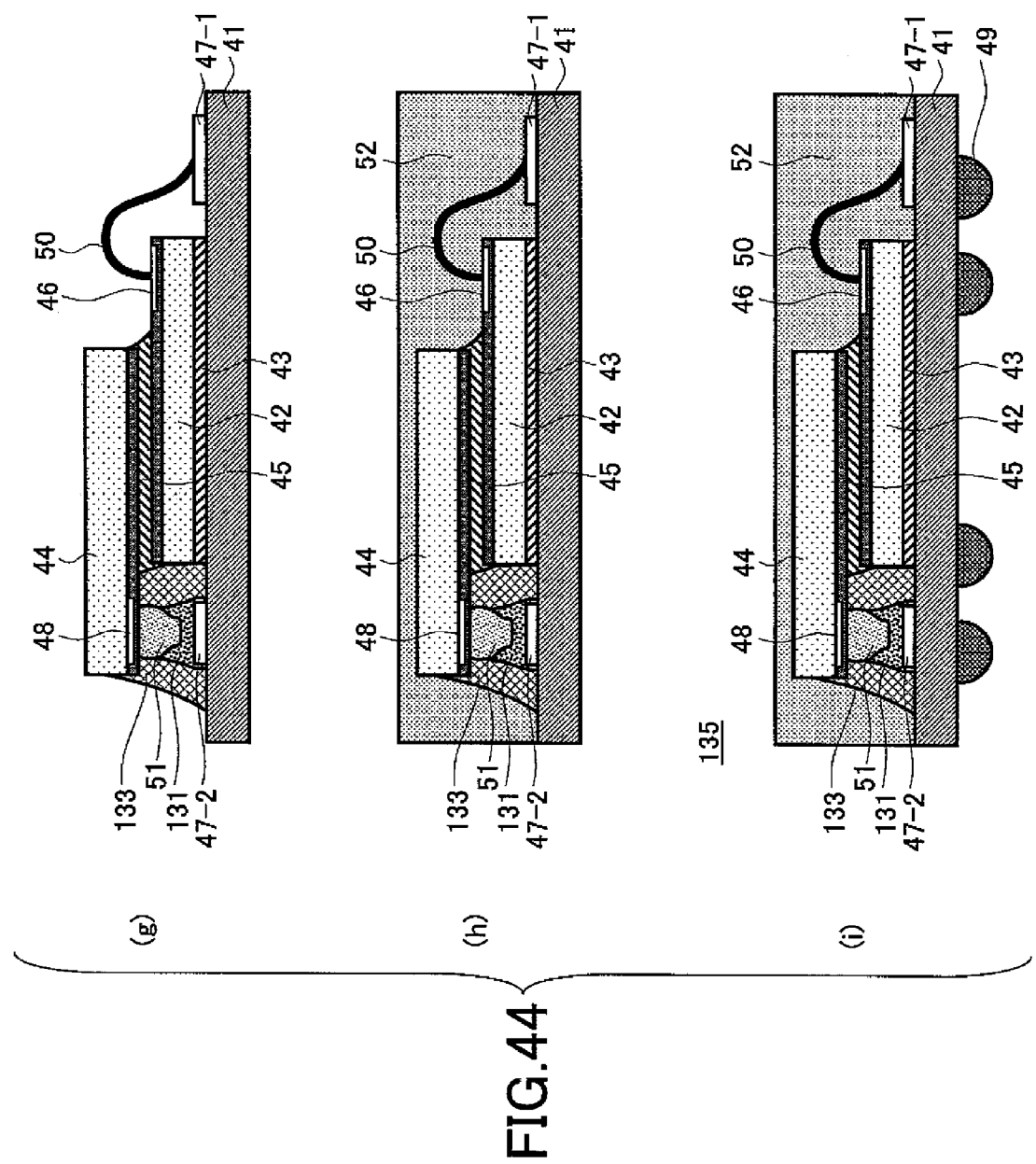
FIG. 44 is a fourth cross-sectional view showing a manufacturing method of the semiconductor device of the third embodiment of the present invention.

Next, the first electrode pad 46 of the first semiconductor chip 42 and the first bonding pad 47-1 of the wiring board 41 are connected to each other by the bonding wire 50 (see FIG. 44(*g*)).

Then, by using a transfer resin molding method or the like, the upper part of the wiring board 41 is covered with and sealed by the sealing resin 52 (See FIG. 44(*h*)).

After that, plural solder balls 49 forming the outside connection terminals are formed on another main surface (rear surface) of the wiring board 41, so that the semiconductor device 135 is formed (See FIG. 44(i)).

Thus, according to the above-discussed manufacturing method, by the third adhesive 133, it is possible to connect the wiring board 41 to the second semiconductor chip 44 and cover the peripheries of the bump 51 and the conductive member 131. Therefore, in this method compared to the manufacturing method of the semiconductor device 130 or 135, it is possible to select a material proper for reinforcing the peripheries of the bump 51 and the conductive member 131.

In this case, the third adhesive 133 covers the peripheries of the bump 51 and the conductive member 131 and is provided only in a area where the second semiconductor chip 42 and the wiring board 41 face each other. Therefore, the amount of use of the third adhesive 133 is limited.

Furthermore, in order to supply the third adhesive 131 after the flip chip connection, it is possible to improve the design freedom degree of a material or configuration of the bump 51, structure of the bump 51 and the conductive member 131, the combination of a material and configuration of the second bonding pad 47-2 of the wiring board 41, a flip chip connection method via the bump 51 and the conductive member 131, and others.

[Manufacturing Method of the Semiconductor Device 140 and Others]

Figure 45:
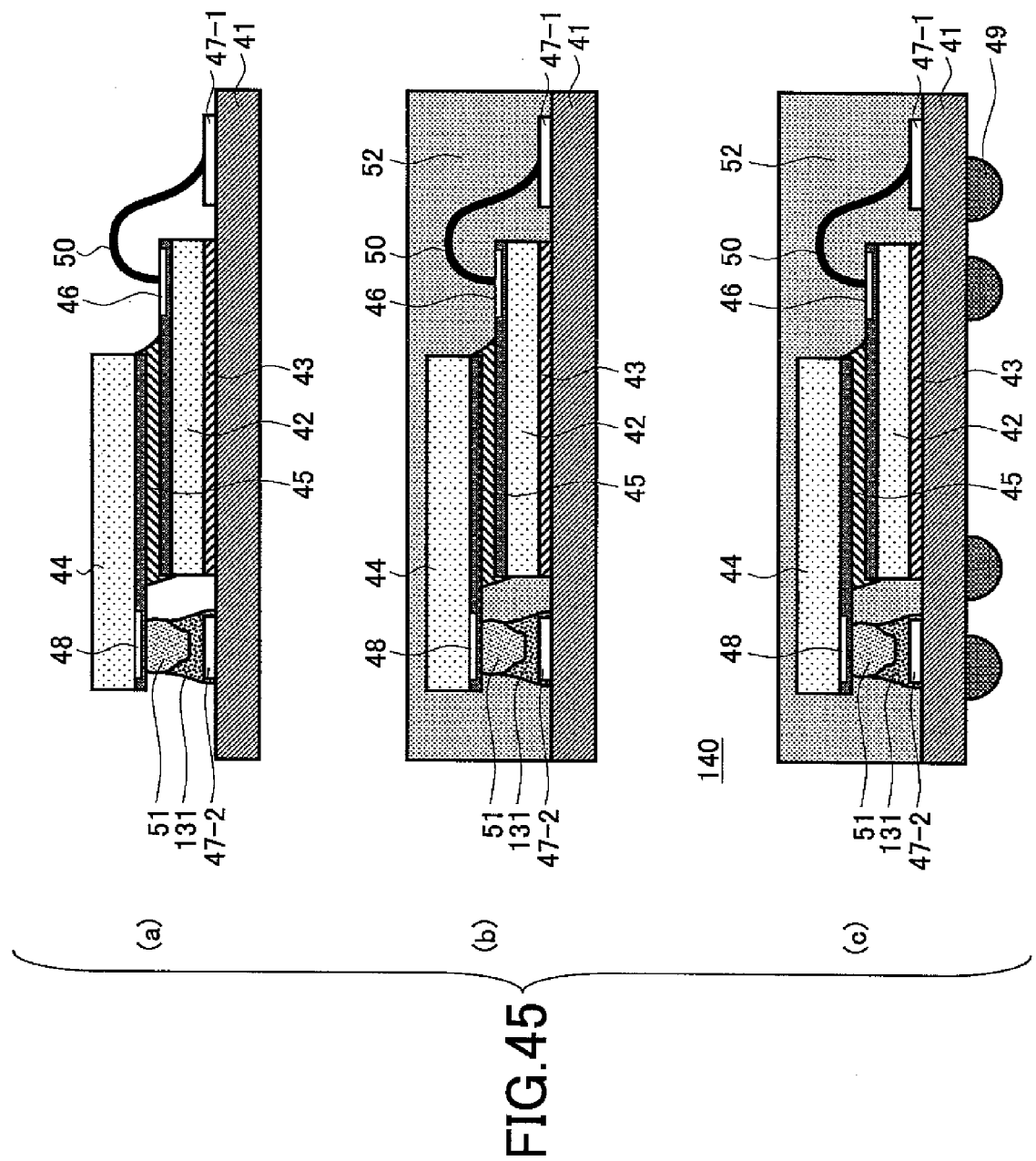
FIG. 45 is a cross-sectional view showing a manufacturing method of the semiconductor device of the fourth embodiment of the present invention.

A manufacturing method of the semiconductor device 140 (see FIG. 17) of the second embodiment of the present invention is discussed with reference to FIG. 41, FIG. 42 and FIG. 45.

First, manufacturing steps shown in FIG. 41 and FIG. 42 are implemented. With the step shown in FIG. 42(d), nothing covers the peripheries of the bump 51 and the conductive member 131.

Next, the electrode pad 46 of the first semiconductor chip 42 and the first bonding pad 47-1 of the wiring board 41 are connected to each other by the bonding wire 50 (see FIG. 45(a)).

Then, by using a transfer resin molding method or the like, the semiconductor chips mounted on the main surface of the wiring board 41 and others are covered with and sealed by the sealing resin 52. At this time, the peripheries of the bump 51 and the conductive member 131 between the second semiconductor chip 44 and the wiring board 41 are sealed by the sealing resin 52 (see FIG. 45(d)).

After that, plural solder balls 49 forming the outside connection terminals are formed on another main surface (rear surface) of the wiring board 41, so that the semiconductor device 140 is formed (See FIG. 45(c)).

In this manufacturing method, by using the sealing resin 52 as the adhesive, there is no need to provide the adhesive between the second semiconductor chip 44 and the wiring board 41. Therefore, it is possible to manufacture the semiconductor device 140 by a simple process.

The present invention is not limited to these embodiments, but variations and modifications may be made without departing from the scope of the present invention.

This patent application is based on Japanese Priority Patent Application No. 2006-343093 filed on Dec. 20, 2006, the entire contents of which are hereby incorporated by reference.

What is claimed is:
1. A semiconductor device, comprising:
a wiring board;
a first semiconductor element mounted over the wiring board; and
a second semiconductor element mounted over the first semiconductor element so that a position of the second semiconductor element is shifted relative to a position of the first semiconductor element,
wherein a part of a main surface of the second semiconductor element faces an electronic circuit forming surface of the first semiconductor element,
an electrode pad provided on the main surface of the second semiconductor element is connected to a second semiconductor element connection pad of the wiring board by an integral connection part,
the wiring board and the first semiconductor element are directly fixed to each other by a first adhesive, and
a substantial portion of the periphery of the connection part is covered with the first adhesive.

2. The semiconductor device as claimed in claim 1, further comprising:
a second adhesive configured to fix the second semiconductor element to the first semiconductor element.

3. The semiconductor device as claimed in claim 2, wherein the wiring board includes a first semiconductor element connection pad,
the first semiconductor element includes an electrode pad, and
the first semiconductor element connection pad and the electrode pad of the first semiconductor element are connected to each other by a bonding wire.

4. The semiconductor device as claimed in claim 3, wherein a dam configured to prevent overflow of the second adhesive is provided in the vicinity of the electrode pad of the first semiconductor element.

5. The semiconductor device as claimed in claim 1, wherein the wiring board and the first semiconductor element are fixed to each other by a first adhesive;
the first semiconductor element and the second semiconductor element are fixed to each other by a second adhesive; and
the connection part is covered with a third adhesive.

6. The semiconductor device as claimed in claim 1, wherein side surfaces of the first semiconductor element and the second semiconductor element are sealed by a sealing resin over the wiring board with a rear surface of the second semiconductor element being exposed to an outside.

7. The semiconductor device as claimed in claim 1, wherein a side surface of the first semiconductor element and another main surface and a side surface of the second semiconductor element are resin-sealed.

8. The semiconductor device as claimed in claim 1, wherein the connection part is formed by one or more bumps.

9. The semiconductor device as claimed in claim 8, wherein the one or more bumps are connected to the second semiconductor element connection pad of the wiring board by a conductive member.

10. The semiconductor device as claimed in claim 1, wherein a plurality of the first semiconductor elements having a substantially same thickness is mounted over the wiring board; and
the second semiconductor element bridges the plural first semiconductor elements.

11. The semiconductor device as claimed in claim 1, wherein a plurality of the second semiconductor element is mounted over the first semiconductor element.

* * * * *